United States Patent
Nagel et al.

(10) Patent No.: US 9,514,767 B2
(45) Date of Patent: Dec. 6, 2016

(54) DEVICE, METHOD AND COMPUTER PROGRAM FOR FREELY SELECTABLE FREQUENCY SHIFTS IN THE SUBBAND DOMAIN

(71) Applicants: Fraunhofer-Gesellschaft zur Foerderung der angewandten Forschung e.V., Munich (DE); Technische Universitaet Ilmenau, Ilmenau (DE)

(72) Inventors: Frederik Nagel, Nuremberg (DE); Michael Schnabel, Geroldsgruen (DE); Christian Neukam, Kalchreuth (DE); Gerald Schuller, Erfurt (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 115 days.

(21) Appl. No.: 14/588,269

(22) Filed: Dec. 31, 2014

(65) Prior Publication Data

US 2015/0110292 A1 Apr. 23, 2015

Related U.S. Application Data

(63) Continuation of application No. PCT/EP2013/063827, filed on Jul. 1, 2013.

(60) Provisional application No. 61/667,119, filed on Jul. 2, 2012.

(30) Foreign Application Priority Data

Jul. 10, 2012 (EP) .................................. 12175808

(51) Int. Cl.
*G10L 25/18* (2013.01)
*G10L 21/0388* (2013.01)
(Continued)

(52) U.S. Cl.
CPC ........... *G10L 25/18* (2013.01); *G10L 21/0388* (2013.01); *H03G 3/00* (2013.01); *G10L 19/0204* (2013.01)

(58) Field of Classification Search
CPC ................................................ G10H 2210/311
See application file for complete search history.

(56) References Cited

U.S. PATENT DOCUMENTS 6,708,145 B1 * 3/2004 Liljeryd ................ G10L 21/038
704/200.1
6,978,236 B1 * 12/2005 Liljeryd .............. G10L 19/0208
704/200
(Continued)

FOREIGN PATENT DOCUMENTS

EP 2269189 B1 11/2011
RU 2262748 C2 10/2005
(Continued)

OTHER PUBLICATIONS

Ahmed, N. et al., "Discrete Cosine Transform", IEEE Transactions on Computers (C-23), Jan. 1974, pp. 90-93.
(Continued)

*Primary Examiner* — Brenda Bernardi
(74) *Attorney, Agent, or Firm* — Michael A. Glenn; Perkins Coie LLP

(57) ABSTRACT

A device for producing a frequency-shifted audio signal based on an audio input signal is provided. The device has an interface and a frequency-shifting unit. The interface is configured for receiving the audio input signal. The frequency-shifting unit is configured for producing the frequency-shifted audio signal. The frequency-shifting unit is additionally configured to produce one of the second subband values based on one of the first subband values such that the second phase angle of this second subband value differs from the first phase angle of this first subband value by a phase angle difference, the phase angle difference being dependent on frequency information indicating by which frequency difference the audio input signal is to be shifted in order to obtain the frequency-shifted audio signal, and the phase angle difference being dependent on a frequency bandwidth of one of the first subbands.

24 Claims, 37 Drawing Sheets

(51) Int. Cl.
*H03G 3/00* (2006.01)
*G10L 19/02* (2013.01)

(56) References Cited

U.S. PATENT DOCUMENTS

| | | | | |
|---|---|---|---|---|
| 7,003,451 | B2* | 2/2006 | Kjorling | G10L 21/038 375/240 |
| 7,050,972 | B2* | 5/2006 | Henn | G10L 21/038 704/228 |
| 7,283,955 | B2* | 10/2007 | Liljeryd | H04B 1/667 704/219 |
| 7,318,035 | B2* | 1/2008 | Andersen | G10L 21/038 704/206 |
| 7,382,886 | B2* | 6/2008 | Henn | G10L 19/008 369/4 |
| 7,469,206 | B2* | 12/2008 | Kjorling | G10L 19/0017 704/205 |
| 7,483,758 | B2* | 1/2009 | Liljeryd | G10L 21/038 700/94 |
| 2008/0260048 | A1* | 10/2008 | Oomen | G10L 19/008 375/241 |
| 2009/0063140 | A1* | 3/2009 | Villemoes | G10L 19/0204 704/211 |
| 2011/0282675 | A1* | 11/2011 | Nagel | G10L 21/038 704/500 |
| 2012/0065983 | A1 | 3/2012 | Ekstrand et al. | |
| 2012/0136670 | A1 | 5/2012 | Ishikawa et al. | |
| 2013/0058498 | A1* | 3/2013 | Disch | G10L 21/038 381/97 |

FOREIGN PATENT DOCUMENTS

| | | |
|---|---|---|
| RU | 2452044 C1 | 5/2012 |
| WO | WO-01/91112 A1 | 11/2001 |
| WO | WO-2010/112587 A1 | 10/2010 |
| WO | WO-2010/136459 A1 | 12/2010 |
| WO | WO-2011089029 | 7/2011 |
| WO | WO-2012/034890 A1 | 3/2012 |

OTHER PUBLICATIONS

Cheng, C., "Method for estimating magnitude and phase in the MDCT domain", AES Convention Paper 6091, Berlin, Germany, May 2004, pp. 1-30.

Dolson, M., "The Phase Vocoder: A Tutorial", Computer Music Journal, vol. 10, No. 4, The MIT Press, Winter 1986, pp. 14-27.

Ekstrand, P., "Bandwidth Extension of Audio Signals", Proc. 1st IEEE Benelux Workshop on Model based Processing and Coding of Audio, Leuven, Belgium, Nov. 2002, pp. 53-58.

Malvar, H. et al., "The LOT: Transform Coding Without Blocking Effects", IEEE Transactions on Acoustics, Speech, and Signal Processing, vol. 37, No. 4, Apr. 1989, pp. 553-559.

Nagel, F. et al., "A Continuous Modulated Single Sideband Bandwidth Extension", IEEE Int'l Conf. on Acoustics, Speech and Signal Processing, Mar. 2010, 4 pages.

Nagel, F. et al., "A Harmonic Bandwidth Extension Method for Audio Codecs", IEEE Int'l Conf. on Acoustics, Speech and Signal Processing, Apr. 2009, 4 pages.

Princen, J. et al., "Analysis/Synthesis Filter Bank Design Based on Time Domain Aliasing Cancellation", IEEE Transactions on Acoustics, Speech, and Signal Processing, vol. ASSP-34, No. 5, Oct. 1986, pp. 1153-1161.

Princen, J. et al., "Subband/Transform Coding Using Filter Bank Designs Based on Time Domain Aliasing Cancellation", IEEE Int'l Conf. on Acoustics, Speech, and Signal Processing, vol. 12, Apr. 1987, pp. 2161-2164.

Schuller, G. et al., "New Framework for Modulated Perfect Reconstruction Filter Banks", IEEE Transactions on Signal Processing, vol. 44, No. 8, Aug. 1996, pp. 1941-1954.

* cited by examiner precisely calculated transform matrix $H_0$

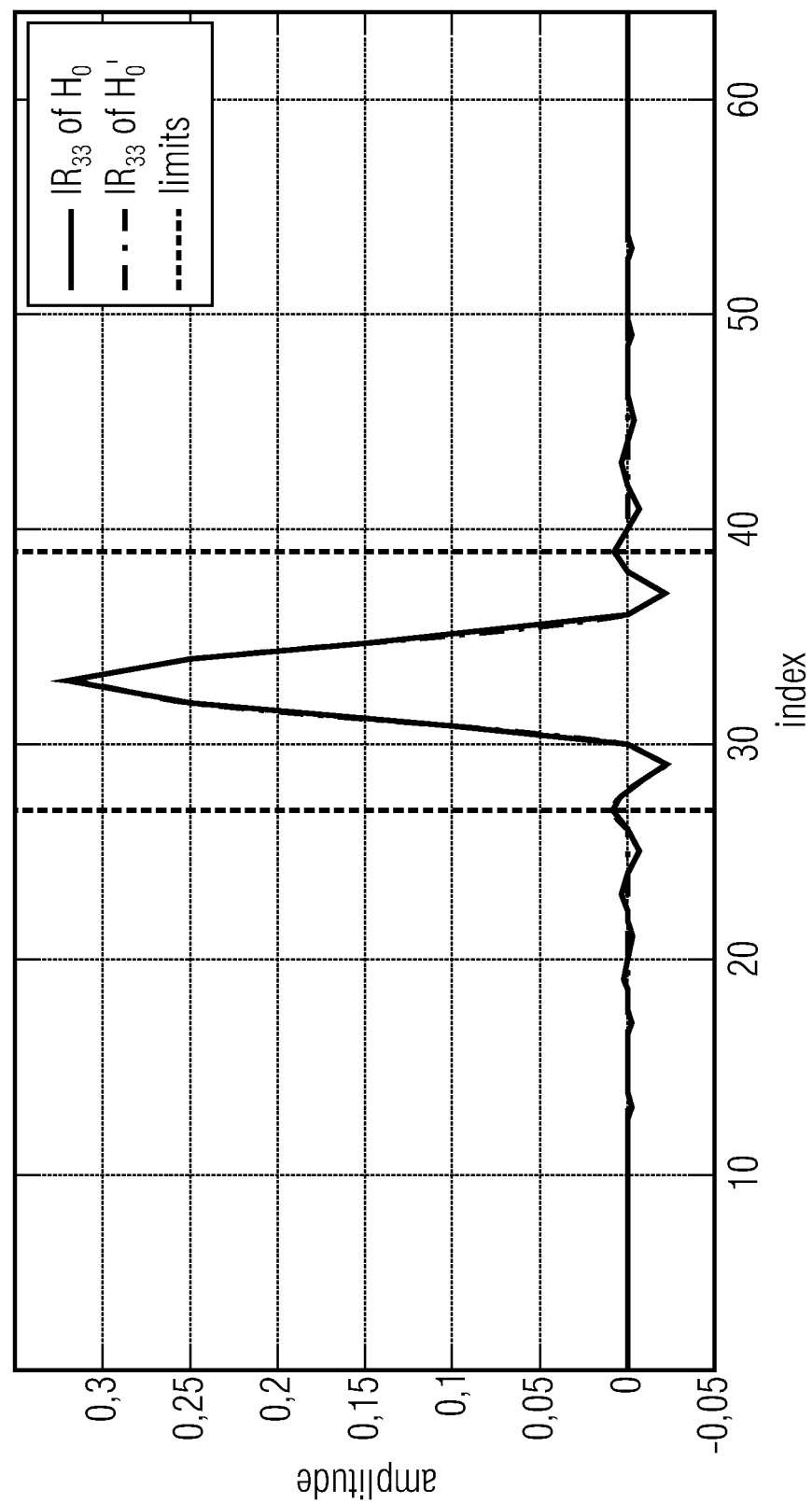

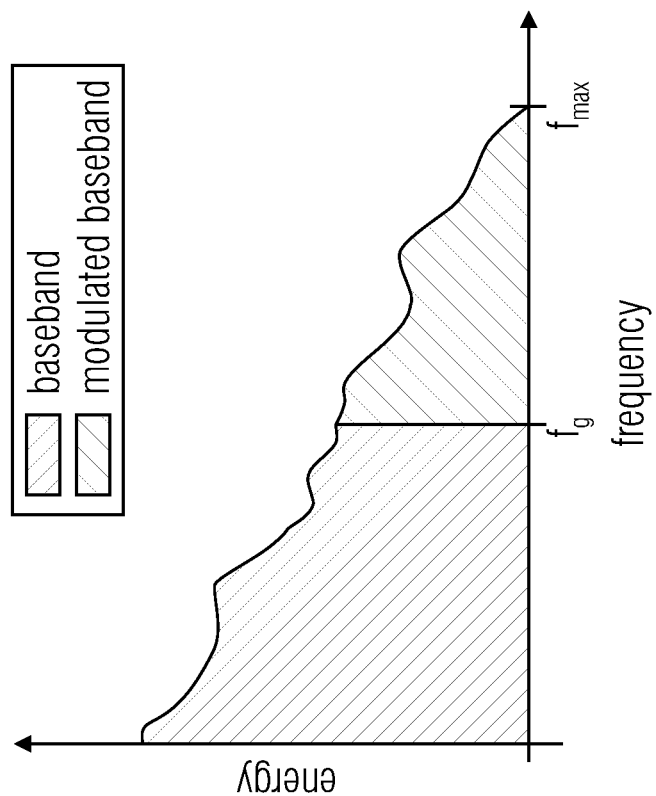
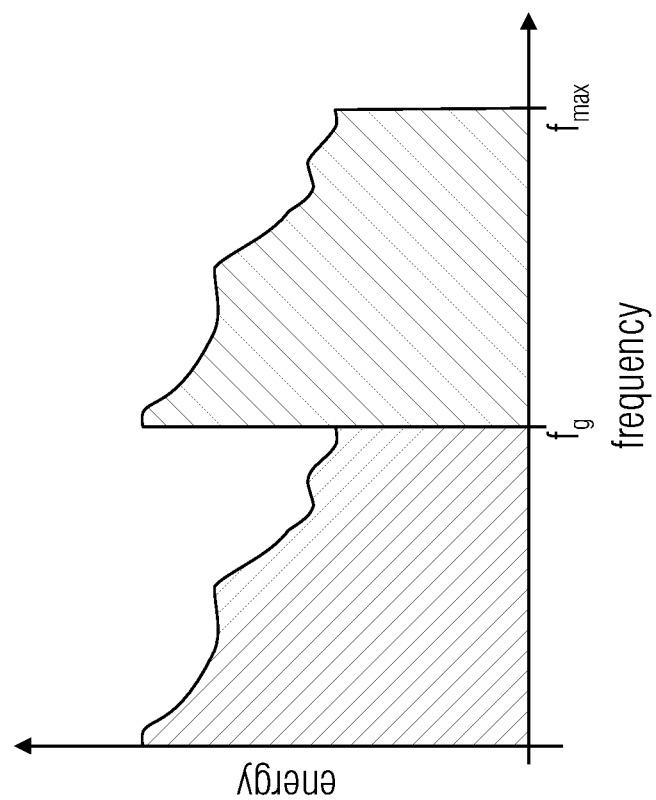
FIGURE 30

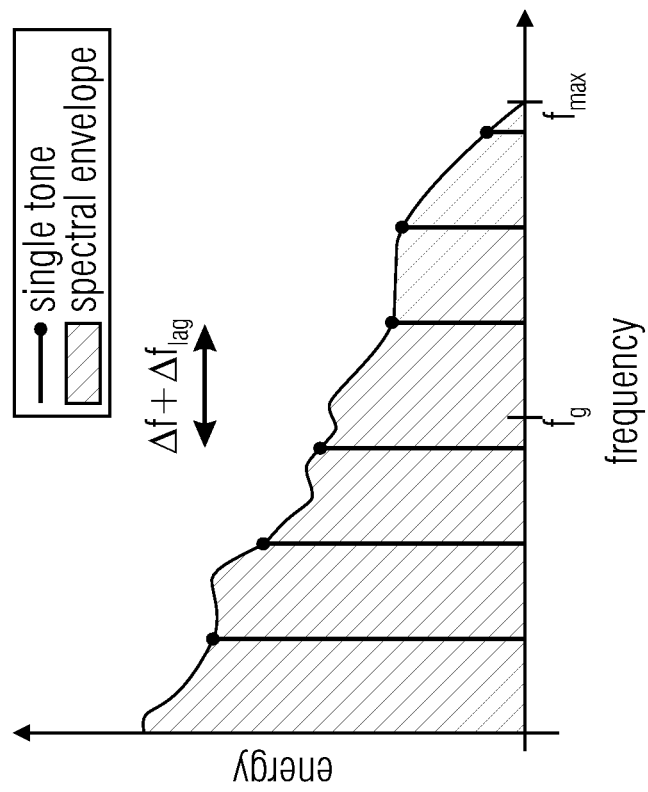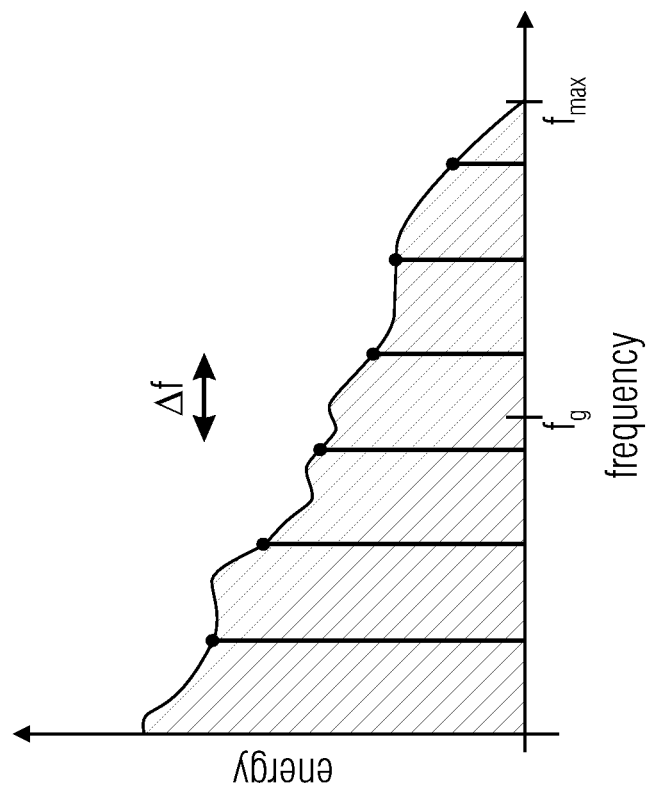
FIGURE 31

DEVICE, METHOD AND COMPUTER PROGRAM FOR FREELY SELECTABLE FREQUENCY SHIFTS IN THE SUBBAND DOMAIN

CROSS-REFERENCE TO RELATED APPLICATIONS

This application is a continuation of copending International Application No. PCT/EP2013/063827, filed Jul. 1, 2013, which claims priority from U.S. Provisional Application No. 61/667,119, filed Jul. 2, 2012, and from European Application No. 12175808.0, filed Jul. 10, 2012, each of which are incorporated herein in its entirety by this reference thereto.

BACKGROUND OF THE INVENTION

The present invention relates to audio signal processing and, in particular, to a device, a method and a computer program for arbitrary frequency shifts in the subband domain.

Computer-aided data processing systems are an integral part of everyday life in today's society which is characterized by new media. Systems for consuming new media have been present in nearly every household for quite some time. Examples of such systems which transmit and reproduce data in digital form are players for video and audio data, like, for example, for DVD and BluRay, CD and the mp3 file format. These reproduction systems are characterized by a nearly lossless reproduction of media contents. Apart from classical telecommunications, the Internet is an important portal for communications, exemplarily by means of VoIP. The underlying digital signal processing is common to all the technologies mentioned. It is of decisive importance for the quality of reproduction and efficiency of the digital technologies.

Audio signal processing is of increasing importance here. At present, a plurality of audio encoders are available on the market, which are realized, for example, by algorithms for digitally rendering audio material for storage or transmission. The goal of every encoding method is compressing the information contents of a signal such that it necessitates minimal storage space while at the same time maintaining the best reproduction quality possible. The efficiency of modern audio encoders is mainly dependent on the storage needed and, among other things, the calculating complexity needed for the algorithm.

Basically, a digital audio encoder is an instrument for transferring audio signals to a format suitable for storage or transmission. This takes place on the transmitter side of the audio encoder (encoder). The data produced in this way are then returned to the original form in the receiver (decoder) and, in the ideal case, correspond to the original data, except for a constant delay. The general goal of audio encoders is minimizing the amount of data necessitated for representing the audio signal while at the same time maximizing the reproduction quality perceived. When developing audio encoders, a numbers of factors must be kept in mind, like, for example, fidelity of reproduction, data rate and complexity. Apart from that, the delay added by processing the signal (the added delay) also has an important role (Bosi and Goldberg, 2003).

In particular in the beginning of audio encoding, the efficiency of the methods was of high importance since storage and computing performance were available only to a very limited extent. Nowadays, this demand seems to be of less importance. Even home PCs or laptops are able to calculate complicated algorithms easily in real time, and broad-band Internet links provide sufficient bandwidth for transmitting encoded audio material. Nevertheless, refining audio encoding methods is of particular importance. In the field of mobile communications and satellite transmission, the bandwidth is limited strongly. Reducing the amount of data to be transmitted is important. Additionally, in this field importance is attached to the efficiency of the encoding technology used. The underlying algorithms have to exhibit a simple structure in order to minimize the computing performance and current consumption.

Another aspect is the quality of the reproduced encoded audio signals. Many audio encoders reduce the amount of data using a reduction of irrelevance. Signal portions are lost here, depending on the data rate. With low data rates, the quality of the audio signals reproduced decreases.

Generally, two types of audio encoding can be differentiated between, namely lossless and lossy audio encoding. Lossless audio encoding allows precise reconstruction of the original signal on the receiver side. The lossy method in contrast causes irreversible deviations from the original signal via a model of subjective perception (Zölzer, 2005).

Lossless audio encoding is based on reducing the redundancy contained in the signal to be encoded. A common method here is, for example, linear predictive coding (LPC) in connections with subsequent entropy encoding. Such audio encoding methods allow the input signal to be reconstructed precisely bit by bit from the encoded bit stream.

Linear prediction uses statistical dependencies between successive samples of the signal in order to be able to predict future values. This is based on the fact that successive samples are more similar to one another than samples of a greater distance to one another. The prediction is realized by a linear prediction filter which estimates the current sample using a number of previous samples. However, it is not this estimation itself that is processed further, but the difference between this value and the actual sample at this place. The goal of linear prediction is minimizing the energy of this error signal by optimized filters and transmitting said error signal which necessitates only a small bandwidth (Weinzierl, 2008).

Subsequently, the error signal is entropy-encoded. Entropy is a measure of the mean information contents of a signal and indicates the theoretical minimum of the bits needed for encoding. A typical method here is Huffman encoding. Certain code words are associated here to individual samples, depending on their statistical probability of occurrence. Short symbols are associated to frequently occurring samples and rarely occurring signal values are represented by long code words. On average, the encoded signal is thus represented by the smallest number of bits possible (Bosi and Goldberg, 2003).

Both linear prediction and entropy encoding are reversible and thus do not remove any information from the signal. When combining the two methods, only redundancies are removed from the signal to be encoded. Since such lossless approaches are strongly dependent on the signal characteristic, the gain of encoding is comparably small. The compression rate achieved, i.e. the ratio of the input bit rate and the bit rate of the coded signal, is in a region between 1.5:1 and 3:1 (Weinzierl, 2008).

Lossy audio encoding is based on the principle of the reduction of irrelevance. This method necessitates a model of human perception which describes psycho-acoustic phenomena of the sense of hearing with regard to time and frequency resolution. Thus, lossy audio encoding is also referred to as encoding adapted to perception or psycho-acoustic encoding. In the field of audio encoding, all signal portions which cannot be perceived by humans and are thus inaudible are referred to as irrelevant (Zölzer, 2005). In order to understand the mode of functioning of an audio encoder adapted to perception more precisely, profound knowledge of psycho-acoustics is of great importance.

Human hearing analyzes a sound event by decomposing it into frequency groups. These frequency groups are represented in the Bark scale and in the English literature referred to as critical bands. Each of these frequency groups summarizes a frequency domain which is evaluated by the human hearing together. Thus, a frequency domain corresponds to a local area on the basilar membrane. All in all, 24 critical bands are associated to the basilar membrane, the bandwidth of which increases with an increasing frequency (Fastl and Zwicker, 2007). Lossy audio encoders also use this model of frequency groups in order to decompose broad-band signals into subbands and encode each band individually (Zölzer, 2005). This model is frequently adapted and frequently a linear frequency division of more than 24 bands is used instead of the Bark scale.

Another important characteristic of auditive perception is the frequency-dependent feeling of loudness of sounds of equal sound pressure levels. Two features of hearing result from this. On the one hand, sounds of different frequencies but an equal sound pressure level are perceived as being of different loudness, on the other hand there is a frequency-dependent threshold starting from which sounds can just still be perceived (Fastl and Zwicker, 2007). This threshold is also referred to as the absolute hearing threshold or hearing threshold in quiet and is illustrated in FIG. 22. Two conclusions may be drawn from this for audio encoding. Signals the levels of which are below the absolute hearing threshold need not be processed since they cannot be perceived anyway. Apart from that, the number of quantization steps necessitated per frequency band may also be determined from the distance between the hearing threshold in quiet and the signal level (Zölzer, 2005).

Covering or masking effects have the largest influence on audio encoding. Temporal and frequency-dependent masking may be differentiated between. In both cases, a masker here refers to a sound event by which another sound event is covered. Thus, the masked event is inaudible. With temporal masking, an event before or after the masker is covered. Pre-masking is independent of the durations of the masker and covers sound events up to 50 ms before perceiving the masker itself (Yost, 1994). Post-masking, in contrast, is dependent on the duration of the masker. The sound events here are covered after the masker has stopped. Depending on the duration of the masker, up to 200 ms may pass until the hearing is again responsive to signals in the range of the hearing threshold in quiet (Fastl and Zwicker, 2007).

FIG. 21 shows a schematic illustration of temporal masking. In particular, FIG. 21 schematically shows the regions of pre- and post-masking and the respective level below which signals are covered. Temporal masking may be used in audio encoding in order to conceal spurious noise caused by the encoding process, such as, for example, quantization noise, relative to high-level signal sequences (transients).

Masking effects in the frequency domain play a much more important role than temporal covering effects. Frequency-dependent masking describes the change in the hearing threshold in quiet for individual sounds and narrow-band noise. These signals distort the hearing threshold in quiet considerably due to their specific masked threshold of hearing. Signals the level of which is smaller than the masked threshold of hearing of the masker and which are located in the effective range of said threshold, cannot be perceived (Fastl and Zwicker, 2007). This context is illustrated in FIG. 22.

FIG. 22 shows a schematic illustration of the frequency-dependent masking in human hearing. As can be seen, the masked sound is below the masked threshold of hearing of the masker and is, thus, inaudible. This effect is made use of in lossy audio encoding methods. Signal portions below the frequency-dependent masked threshold of hearing are removed from the signal and are not processed further (Zölzer, 2005).

The general setup of a typical encoder adapted to perception is illustrated in FIG. 23. FIG. 23 shows a block circuit diagram of a psycho-acoustic audio encoder. At first, the PCM signal to be encoded is decomposed into frequency bands by the analysis filter bank and fed to the psycho-acoustic model. Here, a time-dependent masked threshold of hearing which regulates the precision of quantization for the different frequency bands is determined by the psycho-acoustic features of hearing described. Thus, important frequency bands, i.e. frequency bands easy to perceive, are quantized with a very high resolution and unimportant ones are represented at a resolution of a small number of bits. Subsequently, entropy encoding is performed for data reduction, as is also done in lossless audio encoding. Since additional control parameters have to be transmitted by the analysis filter bank and the psycho-acoustic model, the actual bit stream is set up by the bit stream multiplexer. The gain in encoding in lossy audio encoders here is obtained by combining quantization and entropy encoding (Zölzer, 2005). Depending on the quality to be achieved, the compression rate is between 4:1 and 50:1 (Weinzierl, 2008).

The decoder is of a comparably simple setup. At first, the bit stream received is divided again into signal data and control parameters by a demultiplexer. After that, entropy decoding and inverse quantization are performed. The control parameters here control the inverse quantization of the useful data. The subband signals obtained in this way are then fed to the synthesis filter bank for reconstructing the broad-band PCM signal (Zölzer, 2005). The respective block circuit diagram of a psycho-acoustic audio decoder is illustrated in FIG. 24.

A number of known signal transformations will be discussed below. Since quantization in many audio encoders is based on a perception model which describes the perception of humans in the frequency domain, the signal to be encoded has to be transferred to the frequency domain as well. There are a large number of transforms with different characteristics and fields of application for this. Transformations relevant for audio encoding will be presented below and the setup of a filter bank discussed.

Fourier transformation is the most important method for analyzing the harmonic structure of a signal. It is part of Fourier analysis and named after the French mathematician and physicist Jean-Baptiste-Joseph Fourier (1768 to 1830) who was the first to introduce it. The Fourier transform is a function for transferring a time signal to its representation in the frequency domain. It is used, among other things, to describe the performance of linear temporally invariant (LTI) systems and to be able to predict same (Burrus and Parks, 1985). Thus, it is, for example, of great importance in acoustics and in the characterization of human hearing. The basic procedure of the Fourier transform is decomposing a time signal into a weighted sum of sine and cosine oscillations. For aperiodic continuous signals, it is calculated as follows (Bosi and Goldberg, 2003):

$$X(f) = \int_{-\infty}^{\infty} x(t)e^{-j2\pi ft} dt \quad (2.1)$$

Here, x(t) is the signal to be analyzed in the time domain and X(f) the respective Fourier spectrum in the frequency domain. It must be kept in mind that the result is complex although a real signal is transformed. Using the Eulerean relation in equation 2.2, it can be shown that the real part of X(f) corresponds to the cosine terms of x(t) and that the imaginary part corresponds to the sine components. Using:

$$e^{-j2\pi ft} = \cos(2\pi ft) - j\sin(2\pi ft) \quad (2.2)$$

the result of equation 2.1 is:

$$X(f) = \int_{-\infty}^{\infty} x(t) \cdot (\cos(2\pi ft) - j\sin(2\pi ft))dt \quad (2.3)$$

$$= \int_{-\infty}^{\infty} x(t) \cdot \cos(2\pi ft)dt - j\int_{-\infty}^{\infty} x(t) \cdot \sin(2\pi ft)dt \quad (2.4)$$

resulting in:

$$X(f) = Re\{X(f)\} + jIm\{X(f)\} \quad (2.5)$$

Since sine and cosine differ from each other only in their phase, the phase of the signal may be concluded from the ratio of the corresponding terms. The following applies:

$$X(f) = |X(f)| \cdot e^{j\phi(f)} \quad (2.6)$$

and:

$$|X(f)| = \sqrt{(Re\{X(f)\})^2 + (Im\{X(f)\})^2} \quad (2.7)$$

$$\varphi(f) = \arctan\left(\frac{Im\{X(f)\}}{Re\{X(f)\}}\right) \quad (2.8)$$

Thus, |X(f)| is referred to as absolute value frequency response and ϕ(f) is referred to as phase frequency response or simply as phase.

Due to the inverse Fourier transform (equation 2.9), the transformed signal is transferred again to its original representation in the time domain. It must be kept in mind that the Fourier transform and its inverse differ by a constant prefactor and the sign of the exponential function (Burrus and Parks, 1985).

$$x(t) = \frac{1}{2\pi} \int_{-\infty}^{\infty} X(f)e^{j2\pi ft} df \quad (2.9)$$

The discrete Fourier transform will be discussed below in greater detail.

In practice, problems occur in digital computers when using the Fourier transform. On the one hand, this is due to the fact that only a finite number of time values can be processed, and on the other hand, the frequency variable also has to be sampled discretely, apart from the time variable. The solution of these problems is the discrete Fourier transform (DFT). Using the DFT, a finite, discrete-time signal is transferred to a discrete, periodic spectrum. This means that it is one of the most important transforms in digital signal processing. The origin of DFT is to be found in the Fourier transform, a precise derivation can be found in (Lochmann, 1990). The DFT of a discrete-time signal x[n] of the length N is defined as follows (Burrus and Parks, 1985):

$$X[k] = \sum_{n=0}^{N-1} x[n]W^{kn}, \quad (2.10)$$

$$\forall k \in [0, N-1]$$

In analogy, the inverse discrete Fourier transform (IDFT) is:

$$x[n] = \frac{1}{N}\sum_{n=0}^{N-1} X[k]W^{-kn}, \quad (2.11)$$

$$\forall k \in [0, N-1]$$

with the complex rotating phasor W.

$$W = e^{-j\frac{2\pi}{N}} \quad (2.12)$$

Thus, X[k] is the discrete periodic spectrum of x[n] with ∀k, n∈ℕ. The period length of the spectrum corresponds to the transform length N and normalized frequencies are mapped in the interval [0,2π].

For real input signals, the DFT has an important feature. Here, not N independent frequency coefficients are calculated here, as is the case in the general case, but only half of it. This feature may exemplarily be made use of for the storage or transmission of the data. For the re-transform, the second N/2 values are calculated using the following correlation (Rao and Yip, 2001):

$$X[N-k] = X[k]^* \quad (2.13)$$

The operator * in equation 2.13 characterizes the complex conjugation. Thus, X(k)* is the complex-conjugate sequence of values for X(k).

The calculating complexity of DFT and IDFT is $N^2$ complex multiplications and additions. When symmetries are made use of when calculating, the number of calculating steps necessitated is reduced to N ld N and the complexity corresponds to o(N log N). However, with fast methods, the transform length N has to correspond to a power of two. The fast Fourier transform is referred to as FFT (Kiencke and Jäkel, 2005).

The discrete Fourier transform has not gained acceptance in the field of data compression. The great disadvantages of DFT are the high calculating complexity and the redundancy contained in the spectrum. Although there are efficient methods for calculating the DFT, i.e. FFT, the result will be a complex spectrum. This means that N complex pairs of values are calculated from N transform values. In addition, only the first N/2 spectral values contain new information.

The discrete cosine and sine transforms will be discussed below.

The discrete cosine transform (DCT) is a solution for the problems of DFT mentioned before. The DCT is a real, discrete, linear and orthogonal transform. Due to these very features, it is the most frequently used transform in digital data compression (Britanak et al., 2007).

The DCT is a discrete trigonometric transform. All in all, eight DCT forms are differentiated between. Depending on their edge continuation, they are divided into even and odd transforms, and in types I, II, III and IV. However, for digital signal processing, only the even types of DCT are of importance. These are listed below (Rao and Yio, 2001):

$$X^I[k] = \varepsilon[k]\sum_{n=0}^{N}\varepsilon[n]x[n]\cos\left(\frac{\pi nk}{N}\right), \quad (2.14a)$$

$$\forall k \in [0, N]$$

$$X^{II}[k] = \varepsilon[k]\sum_{n=0}^{N-1}x[n]\cos\left(\frac{\pi(n+0,5)k}{N}\right), \quad (2.14b)$$

$$\forall k \in [0, N-1]$$

$$X^{III}[k] = \sum_{n=0}^{N-1}\varepsilon[n]x[n]\cos\left(\frac{\pi(k+0,5)n}{N}\right), \quad (2.14c)$$

$$\forall k \in [0, N-1]$$

$$X^{IV}[k] = \sum_{n=0}^{N-1}x[n]\cos\left(\frac{\pi(n+0,5)(k+0,5)}{N}\right), \quad (2.14d)$$

$$\forall k \in [0, N-1]$$

with:

$$\varepsilon[p] = \begin{cases} \frac{1}{\sqrt{2}} & \text{if } p = 0 \lor p = N \\ 1 & \text{else} \end{cases} \quad (2.15)$$

Each of these forms has its special application in encoding. DCT-II is used primarily as a transform of image data. Literature sees it as the first type of DCT described. This means that generally the term "DCT" refers to DCT-II (Ahmed et al., 1974). Except for a pre-factor, DCT-III is the inverse transform of DCT-II and vice versa. For audio encoding, DCT-IV is of particular importance. It is the basis of the modified discrete cosine transform.

In order to be able to demonstrate important features of DCT, a correlation between DFT and DCT will be pointed out below. As has been illustrated before, the DFT calculates only N/2 independent frequency coefficients from a real-value signal of a length N. Conversely, this means that 2N values in the time domain are necessitated to obtain N spectral values. However, if only N time values are available, the signal has to be continued suitably. Symmetrical extension by reflecting/mirroring the entire signal seems to be suitable here. The extended signal thus seems to repeat itself at a period length of 2N. This is of advantage in that the spurious leakage effect of the DFT with clipped signals is suppressed (Kiencke and Jäkel, 2005).

Any real signal x[n] of a length N is extended symmetrically, the result being:

$$\tilde{x}[n] = [x[0], \ldots, x[N-1], x[N-1], \ldots, x[0]] \quad (2.16)$$

with $1 \le n \le 2N-1$. The length of $\tilde{x}[n]$ is thus 2N. The DFT from equation 2.10 with equation 2.12 is then applied to this signal and converted (Rao and Yip, 2001). A detailed derivation can be found in the annex A.1. The following applies:

$$\tilde{X}[k] = \sum_{n=0}^{2N-1}\tilde{x}[n]e^{-j\frac{2\pi}{2N}kn} \quad (2.17a)$$

$$= 2e^{j\frac{\pi}{2N}k}\sum_{n=0}^{N-1}x[n]\cos\left(\frac{\pi(n+0,5)k}{N}\right), \quad (2.17b)$$

$$\forall k \in [0, N-1]$$

When comparing this result to the DCT-II in equation 2.14b, one can see that these two equations only differ by the phase term $$2e^{j\frac{\pi}{2N}k}.$$

since same is signal-independent and does not contain any information, it can be neglected when calculating the DCT (Rao and Yip, 2001). For DCT-I, a similar correlation can be shown, but using a different signal continuation of x[n]. DCT-IV then results from a phase rotation of the basic function of DCT-II. A detailed derivation for this may be found in (Rao and Yip, 2001).

Some conclusions may be drawn from this result. At first, one will notice that the DCT, in contrast to DFT, is a purely real transform. Two advantages result from this. Firstly, no complex multiplications and additions have to be performed for the calculation and, secondly, only half of the storage space is necessitated for storing the data since there are no complex pairs of values. Furthermore, it is striking that the DCT, for calculating N independent frequency coefficients, necessitates exactly N values for the transform. The frequencies are all in the interval $[0, \pi]$. In contrast to DFT, the redundancy contained in the spectrum for real-value input signals has vanished and thus the frequency resolution is double as high. However, it is of disadvantage that the DCT spectrum cannot be transformed with regard to absolute value (or magnitude) and phase. Additionally, the situation may arise that frequencies which correspond to the DCT base functions (cf. equations 2.14a to 2.14d), but are rotated in relation thereto in their phase by 90° are contained in the signal. These frequencies are not represented by the DCT, i.e. the respective DCT coefficient is zero. For these reasons, the DCT is well suited for an effective and fast data compression, but less so for signal analysis (Malvar, 1992).

Apart from the discrete cosine transform, there is the discrete sine transform (DST). All in all, eight forms of DST are differentiated between. Only DST-IV is of importance here. With regard to its form and features, it corresponds to DCT-IV (Rao and Yip, 2001):

$$X_S^{IV}[k] = \sum_{n=0}^{N-1}x[n]\sin\left(\frac{\pi(n+0,5)(k+0,5)}{N}\right), \quad (2.18)$$

$$\forall k \in [0, N-1]$$

When a signal is transformed using both DCT-IV and DST-IV, the complex spectrum formed by the combination of the two real spectra again contains information on absolute value and phase. The frequency resolution here is still double as high as in DFT, which means that N frequencies are mapped in the interval $[0, \pi]$ (Malvar, 1992).

For a signal processing of long audio signals, it is not possible to transform the signal as a whole. On the one hand, the calculating complexity here increases enormously since $N^2$ calculating operations are necessitated also for calculating the DCT. On the other hand, it is not possible to process the signal in real time since transmission of the entire data stream has to be waited for until the signal may be reconstructed. Consequently, the signal has to be divided into blocks. In this case, the DCT is applied as a so-called block transform (Rao and Yip, 2001). Using the block index $b \in \mathbb{N}$, the following results for the DCT-IV from equation 2.14d:

$$X_b^{IV}[k] = \sum_{n=0}^{N-1} x[n+bN]\cos\left(\frac{\pi(n+0,5)(k+0,5)}{N}\right), \quad (2.19)$$

$$\forall k \in [0, N-1]$$

The signal length of x[n] corresponds to bN. With block transforms, block artefacts arise due to quantization. A known example where artefacts of this kind may be recognized is the JPEG compression method. The block artefacts originate from the edge continuations to be performed for periodizing. They do not correspond to the originally assumed signal continuations (cf. equation 2.16). The result are jumps at the block limits which in the frequency domain shift the energy towards high frequencies (Malvar, 1992). Jumps in an audio signal may be perceived as crackles. Human hearing is very sensitive towards such artefacts. Thus, they have to be absolutely avoided.

The modified discrete cosine transform will be discussed below.

The modified discrete cosine transform (MDCT) is the central transform for audio compression. It is used, among others, in mp3, AAC and Dolby Digital (ac-3). MDCT is a real, discrete, linear and orthogonal transform and a modification of DCT-IV. It is defined as follows (Rao and Yip, 2001):

$$X_b[k] = \sum_{n=0}^{2N-1} x[n+bN]\cos\left(\frac{\pi\left(n+0,5-\frac{N}{2}\right)(k+0,5)}{N}\right), \quad (2.20)$$

$$\forall k \in [0, N-1]$$

An advantage of MDCT compared to DCT-IV is avoiding block artefacts. This can be achieved mainly by the overlapping of several successive blocks. This kind of transform is also known as lapped orthogonal transform (LOT) (Malvar and Staelin, 1989).

The redundancy may be removed again by the overlap-add (OLA) method. Thus, the blocks forming in the inverse transform are overlapped up to 50% and added up, this procedure being referred to as overlap-add.

The frequency resolution of MDCT may be improved further by weighting the input sequence x[n+bN] with a window function. In equation 2.20, the window corresponds to a rectangular function clipping the current block b from the overall signal. In the frequency domain, this corresponds to convolution (folding) using the si function. The poor stop band attenuation of the si function can be improved by adapting this window function and thus an increased frequency selectivity can be achieved. In order for the MDCT to be able to reconstruct perfectly, the window function w[n] of a length 2N has to fulfill the Princen-Bradley (PR) conditions (Princen et al., 1987):

$$w[n]=w[2N-1-n] \quad (2.21a)$$

$$w^2[n]+w^2[n+N]=1 \quad (2.21b)$$

A simple window fulfilling these conditions and exhibiting sufficient stop band attenuation is the sine half wave window. It is used, among others, in mp3 and AAC and is defined as follows (Malvar, 1992):

$$w[n] = \sin\left(\frac{\pi(n+0,5)}{2N}\right), \quad (2.22)$$

$$\forall n \in [0, 2N-1]$$

By inserting the window function w[2N−1−n] into equation 2.20, another important feature of MDCT can be recognized. The result corresponds to the discrete convolution of x[n+bN] using the modulated window function w[n]. Thus, for $\forall k \in [0,N-1]$, the following results (Schuller and Smith, 1996):

$$X_k[b] = \quad (2.23)$$

$$\sum_{n=0}^{2N-1} x[n+bN]w[2N-1-n]\cos\left(\frac{\pi\left(n+0,5-\frac{N}{2}\right)(k+0,5)}{N}\right)$$

Thus, the MDCT cannot only be seen to be a block transform, but also a modulated filter bank (Malvar, 1992). Thus, the window function corresponds to the low-pass prototype FIR filter which is modulated by the cosine kernel and thus represents the frequency bands of the filter bank. The result of this is that the input sequence x[n+bN] is decomposed into exactly N subbands. In connection with the TDA feature, the MDCT fulfills the preconditions of a so-called "critically sampled filter bank".

Such a critically sampled filter bank is illustrated in FIG. 25. In particular, FIG. 25 shows an N-band critically sampled PR filter bank with a system delay of $n_d$ samples. Such filter banks are of particular importance for audio encoding since they describe a signal as precisely and completely as possible with the smallest number of samples (Rao and Yip, 2001).

The symbol ↓N corresponds to a reduction in the sample rate by the factor 1/N and ↑N to an increase by the factor N. The signal after the synthesis filter bank $\hat{x}[n]=x[n-n_d]$ is identical to the input signal x[n] before the analysis filter bank, except for a constant delay of $n_d$ samples. In the case of MDCT, $h_k[n]$ is the modulated window function $w_k[n]$. Since W[n] fulfills the PR conditions, the analysis filters $h_k$ are identical to the synthesis filters $g_k$.

From a mathematical point of view, it is suitable to formulate linear equation systems, including all the transforms mentioned so far, in the vector matrix notation. A signal x[n] of a length bN is represented as a column vector $\underline{x}=[x[0], x[1], \ldots, x[bN-1]]^T$. The operator T here characterizes the transposition. Forming a block may be represented as a matrix in which every column of the matrix contains a block of x[n]:

$$\underline{x} = \begin{bmatrix} x[0] & x[N] & \ldots & x[(b-1)N] \\ x[1] & x[N+1] & \ldots & x[(b-1)N+1] \\ \vdots & \ddots & \ldots & \vdots \\ x[N-1] & x[2N-1] & \ldots & x[bN-1] \end{bmatrix} \quad (2.24)$$

The transform rule may also be represented as a matrix. The modulated window functions here form the lines of the matrix. For $\forall k \in [0,N-1]$, $\forall n \in [0, 2N-1]$, the following applies:

$$T_{MDCT}(k, n) := w[n]\cos\left(\frac{\pi\left(n + 0,5 - \frac{N}{2}\right)(k + 0,5)}{N}\right) \in \mathbb{R}^{N \times 2N} \quad (2.25)$$

In order to be able to calculate the MDCT of $\underline{x}$, the block structure of have $\underline{x}$ to be extended by a 50% overlap for the TDA. Thus, the MDCT may be written as follows:

$$\underline{X} = T_{MDCT} \cdot \underline{x}_{TDA} \quad (2.26)$$

with:

$$\underline{x}_{TDA} = \begin{bmatrix} x[0] & x[N] & \cdots & x[(b-2)N] \\ x[1] & x[N+1] & \cdots & x[(b-1)N+1] \\ \vdots & \vdots & \ddots & \vdots \\ x[2N-1] & x[3N-1] & \cdots & x[bN-1] \end{bmatrix} \quad (2.27)$$

Every column of $\underline{x}$ forms the MDCT spectrum of the respective block with an index b in $\underline{x}$.

For calculating a block, this form of the MDCT necessitates $2N^2$ multiplications and additions. However, the calculating complexity can be reduced considerably.

Thus, the filter bank in FIG. 25 has to be transferred to an equivalent polyphase filter bank (see FIG. 26). Using the polyphase representation and the z-transform, multirate systems, like the MDCT filter bank, may be analyzed more extensively.

An FIR filter h[n] can be divided into M∈ℕ phases when the length of the filter corresponds to an integer multiple of M. The $m^{th}$ phase $p_m[n]$ of h[n] is produced by delaying n[n] by $z^{-m}$ and reducing the sample rate by the factor M (Malvar, 1992). The following applies:

$$p_m[n] = h[nM+m] \quad (2.28)$$

Using the decomposition and the z-transform, the filter h[n] may be represented as follows (Malvar, 1992):

$$H[z] = \sum_{n=0}^{MN-1} h[n]z^{-n} \quad (2.29)$$

$$= \sum_{m=0}^{M-1} z^{-m} \sum_{n=0}^{N-1} h[nM+m]z^{-nM} \quad (2.30)$$

Instead of sum notation, vector notation is of advantage here as well. Equation 2.30 may thus be represented as an N-dimension vector:

$$\underline{H} = \begin{bmatrix} H_0[z] \\ H_1[z] \\ \vdots \\ H_{N-1}[z] \end{bmatrix} \quad (2.31)$$

with:

$$H_n[z] = \sum_{m=0}^{M-1} h[nM+m]z^{-nM-m} \quad (2.32)$$

This polyphase decomposition may then be applied to each filter of the MDCT filter bank. The result is the equivalent polyphase representation of the filter bank, mentioned before, in FIG. 26 (Schuller and Smith, 1996). Thus, FIG. 26 represents an equivalent N-band critically sampled PR polyphase filter bank.

By making use of symmetries in the MDCT kernel and the TDA feature, the analysis and synthesis polyphase filter matrices $\underline{P}_a$ and $\underline{P}_s$ may each be divided into a weakly occupied folding (convolution) matrix and a transform matrix (Schuller and Smith, 1996). The folding matrices $\underline{F}_a$ and $\underline{F}_s$ here exhibit a diamond structure with the coefficients of the window function w[n] as polynomials in the z-domain. They may be decomposed further to a window matrix and a delay matrix:

$$\underline{F}_a = \underline{D} \cdot \underline{F} \quad (2.33a)$$

$$\underline{F}_s = \underline{F}^T \cdot \underline{D}^{-1} \quad (2.33b)$$

The precise form and splitting of the folding matrices will be shown further below. The transform matrices correspond to the DCT-IV matrix:

$$\underline{T}(k, n) := \cos\left(\frac{\pi(n+0,5)(k+0,5)}{N}\right) \in \mathbb{R}^{N \times N} \quad (2.34a)$$

$$\underline{T}^{-1} = \frac{2}{N} \cdot \underline{T} \quad (2.34b)$$

Using these matrices, the MDCT spectrum of the input signal divided into blocks $\underline{x}$ is calculated as follows (Schuller and Smith, 1996):

$$\underline{X} = \underline{T} \cdot \underline{D} \cdot \underline{F} \cdot \underline{x} \quad (2.35)$$

wherein the following applies for the inverse transform:

$$\hat{\underline{x}} = \underline{F}^T \cdot \underline{D}^{-1} \cdot \underline{T}^{-1} \cdot \underline{X} \quad (2.36)$$

This solution offers several advantages compared to calculating the MDCT in accordance with equation 2.26. At first, the time domain aliasing forming may be recognized more easily. With the polyphase representation of the folding matrix in equation 2.33a, the process may be interpreted to be turning over weighted signal portions of block (b−1) to the current block b. By adding these signal portions, the TDA forms. The greatest advantage of calculating the MDCT using polyphases is the considerably reduced calculating complexity. By using the squared DCT-IV matrix and the sparsely occupied folding matrix, the calculating complexity is reduced to N(N+2) multiplications and additions. By using fast implementations of the DCT, similarly to FFT, the number of operations necessitated may be decreased down to N(log N+2) and thus the complexity be reduced to o(N log N) (Rao and Yip, 2001). For these reasons, the MDCT here is considered to be implemented in accordance with to the polyphase approach.

In audio signal processing, it may be necessary to shift a signal of a low frequency to higher frequencies, wherein said frequency shift should be freely selectable and precise. Audio encoders which try to restore the higher frequencies of a signal have to face this problem. Modern audio encoding technologies use methods of bandwidth extension for a more efficient compression of audio data. Apart from the psycho-acoustic features of human hearing, the correlation of the low-frequency signal portions to the high-frequency portions is made use of for data reduction.

Despite the existence of various ways of reducing the data rate by audio encoding, current audio encoders reach their limits when low bit rates are desired. In particular the psycho-acoustic methods in this case produce undesired signal corruptions. This may be seen in interfering artefacts, like missing heights, blurred transients or artificial hissing of the audio signal reproduced. In many cases of application, however, only a limited transmission bandwidth is available. Bandwidth extension (BWE) offers a solution for these problems. Generally, bandwidth extension unites a number of methods using which a band-limited audio signal may be extended spectrally in order to again obtain the original bandwidth. All in all, four categories of methods for bandwidth extension are differentiated between (Larsen and Aarts, 2004). These are illustrated graphically in FIG. 27.

FIG. 27 shows categories of bandwidth extension (Larsen and Aarts, 2004). In FIG. 27, low-frequency psycho-acoustic BWE is shown at the top left. In FIG. 27, high-frequency psycho-acoustic BWE is shown at the top right. FIG. 27 shows low-frequency BWE at the bottom left. In addition, high-frequency BWE is illustrated in FIG. 27 at the bottom right. The energy of the band 'a' (broken line) is shifted to the band 'b' (dotted line).

Only category III (bottom right in FIG. 27) is useful for audio encoding. With the so-called "high-frequency BWE", the frequencies present in the band-limited signal are used in order to reconstruct the high-frequency range of the spectrum. The idea of using such a method for bandwidth extension of audio signals is based on the fact that there is a strong correlation between the high-frequency and low-frequency portions of the signal. Thus, it is possible to reconstruct the missing high frequencies from the low signal portions present (Larsen and Aarts, 2004). Current techniques and methods, using which a band-limited signal may be extended to its original bandwidth by means of high-frequency BWE will be presented below.

Spectral band replication (SBR) is known from known technology, as is, among others, employed in HE-AAC. With spectral band replication with SBR, correlations between low-frequency and high-frequency signal portions are made use of in order to expand the low-pass signal provided by the encoder spectrally. The low frequency bands of the underlying filter bank are copied to the missing high bands and the spectral envelope is adapted. This copying process causes, in particular with low cutoff frequencies, perceivable artefacts like roughness and undesired changes in timbre. These are caused mainly by the missing harmonic continuation of the spectrum at the limit between the baseband and the algorithmically produced high frequency bands.

A known SBR audio encoder uses pQMF subband decomposition of the signal and in this way ensures high encoding efficiency [Eckstrand 2002]. This is achieved by transmitting only the lower frequency bands, whereas the higher frequency portions are reconstructed using side information and the frequency shift of the lower bands mentioned before.

Spectral band replication at present is the most widespread method for bandwidth extension. It is, among others, employed in HE-AAC and mp3PRO. SBR has been developed by Coding Technologies, with the goal of increasing the efficiency of existing audio encoders. This is achieved by processing, by an encoder, only frequencies below a certain edge frequency $f_g$. In the examples mentioned, mp3 and AAC encoders are used as core encoders. Frequencies above the edge frequency are described only by a few parameters. Depending on the quality to be achieved, these are between 5 kHz and 13 kHz. The high frequency portions are then reconstructed in the receiver using said side information and the decoded band-limited signal (Ekstrand, 2002).

FIG. 28 shows the block circuit diagram of an extended SBR encoder. The sample rate of the input signal is reduced and subsequently fed to the actual encoder. In parallel, the signal is analyzed by a complex quadrature mirror filter bank (QMF) and an energy calculation is performed. The QMF used consists of 64 subbands. The parameters necessitated for estimating the spectral envelopes may be derived from this. Further parameters allow reacting to the special characteristics of the input signal. By knowing the SBR encoder, it may recognize strong differences between the original and the synthesized high-frequency portion (HF) by producing the high frequency band.

When, for example, strongly distinct individual sounds above the cutoff frequency are present in the signal, these are described by additional parameters and may be fed again to the reconstructed signal. The side information produced is inserted into the outgoing bit stream, apart from the actual audio data (Larsen and Aarts, 2004).

FIG. 29 shows the block circuit diagram of the respective decoder extended by SBR. The band-limited audio data are decoded by the decoder and the control parameters are extracted from the bit stream. Subsequently, the audio data are fed again to a QMF filter bank for reconstructing the high frequency portions. The baseband is copied within this filter bank and inserted above the cutoff frequency (cf. FIG. 30, left).

FIG. 30 is a schematic illustration of the absolute value frequency response. Thus, FIG. 30 is a schematic illustration of SBR-HF reconstruction. FIG. 30 shows copying and shifting the baseband on the left. FIG. 30 illustrates a spectrum after adjusting the spectral envelope on the right.

The information, produced in the SBR encoder, on the spectral envelope is used to match the envelope of the copied spectrum to the original one. This adaptation is done using the control parameter transmitted and the energy of the respective QMF band. If the features of the reconstructed spectrum differ from the original ones, additionally tonal components or noise will be added to the signal (Larsen and Aarts, 2004). FIG. 30 shows the adapted reconstructed spectrum on the right.

Finally, the band-limited signal and the reconstructed high-frequency signal are merged and transferred to the time domain by the synthesis filter bank. In this way, a bandwidth-extended signal which is now ready for reproduction has formed.

In this kind of bandwidth extension, problems arise with highly tonal signals of a highly distinct harmonic structure. Even if the SBR method provides for techniques for tonal adaptation of the spectrum, these are not sufficient for restoring a destroyed harmonic structure. The result is a perceivable roughness in the signal (Wilde, 2009). These artefacts are very unpleasant for the listener. This originates from the copying process of the SBR decoder. This does not take into consideration the harmonic fine structure of the signal and simply replicates the baseband. The result is shown in FIG. 31.

FIG. 31 shows a destruction of the harmonic structure with SBR. FIG. 31 shows an original broad-band spectrum on the left. FIG. 31 shows a spectrum after SBR HF reconstruction on the right.

It is clearly recognizable that the harmonics are shifted relative to the original spectrum in the range above the cutoff frequency. The reconstructed HF spectrum is harmonic, but the harmonic structure is spread by an additional frequency swing tag at the cutoff frequency. Additionally, the amplitude ratios of harmonic sub-tones are distorted by reconstructing the envelope. This effect will occur with all harmonic signals, as are exemplarily generated by musical instruments.

For harmonic signals, such as, for example, a pitch pipe, SBR and equivalent bandwidth extension methods produce undesired artefacts, such as, for example, tonal roughness and unpleasant timbres, since the harmonic structure of the signal is not maintained completely. For signals exhibiting a distinct harmonic structure, undesired artefacts, like roughness and changes in timbre, occur when applying SBR.

This is why two time-domain bandwidth extension methods which contain these structures have been developed: phase vocoder-controlled harmonic bandwidth extension (HBE) and continuous modulation (CM) BWE which uses special sideband modulation [Nagel and Disch 2009], [Nagel et al. 2010]. Due to the continuous modulation with freely selectable frequencies, in particular CM-BWE achieves good harmonic restoring.

There are some alternative bandwidth extension methods which avoid the problem of disharmonic spectral continuation. Two of these methods will be introduced below. Basically, these methods replace the HF generator of the SBR decoder in FIG. 29 and thus represent an alternative to the simple copying process. Adapting the spectral envelope and tonality remains unchanged. Since the input signal has to be in the time domain, this method is also referred to as the time domain method for bandwidth extension.

Harmonic bandwidth extension (HBE) is to be mentioned at first. HBE uses a phase vocoder for producing the high-pitch range. The spectrum is expanded by applying a phase vocoder. As is shown on the left in FIG. 32, the baseband is spread up to the maximum signal frequency $f_{max}$ and the frequency range between the cutoff frequency and $f_{max}$ is clipped out. The spectrum is then composed of said portion and the baseband (cf. FIG. 32, right). The envelope is adapted, as is also done in SBR (Nagel and Disch, 2009).

FIG. 32 is a schematic illustration of HBE-HF reconstruction. FIG. 32 shows expansion of the baseband by the factor 2 on the left. FIG. 32 shows a spectrum after having adapted the spectral envelope on the right.

Using integral expansion factors $\sigma \in \mathbb{N}^+$ ensures that the cutoff frequency $f_g$ does not change the harmonic structure. The following applies:

$$f_{max} = \sigma \cdot f_g \quad (3.1)$$

Of disadvantage is the fact that the distance between the sub-tones in the HF region changes with the expansion factor by spreading the spectrum, as can be seen in FIG. 33. In addition, complicated calculations are necessitated for spreading the spectrum. Among these are high-resolution DFT, phase adaptation and sample rate conversion (Dolson, 1986). When the audio signal is subdivided into blocks, additionally an overlap-add structure is needed in order to be able to continue the phase of neighboring blocks continuously. For highly tonal signals, very good results can be achieved using the phase vocoder technique, however in percussive signals the transients blur and performing a separate transient treatment becomes necessary (Wilde, 2009).

FIG. 33 shows a harmonic structure with HBE. FIG. 33 shows an original broad-band spectrum on the left. FIG. 33 illustrates a spectrum after HBE HF reconstruction on the right.

Continuous single sideband modulation will be presented below.

Continuously modulated bandwidth extension (CM-BWE) is another time-domain method for bandwidth extension. In this method, the baseband is modulated by the frequency $f_{mod}$ by means of single sideband modulation and thus shifted to another spectral location, as is illustrated in FIG. 34. A variable modulation frequency ensures the harmonic structure of the bandwidth-extended signal to be maintained. With modulation frequencies greater than the cutoff frequency $f_g$, the gap forming in the spectrum has to be filled with noise (Nagel et al., 2010).

FIG. 34 shows a schematic illustration of CM-BWE-HF reconstruction. FIG. 34 shows modulation of the baseband with the frequency $f_{mod}$ on the left. FIG. 34 shows a spectrum after adapting the spectral envelope on the right.

Apart from the case illustrated in FIG. 34, it may also be necessary for the baseband to be modulated several times. In such a case, the modulation frequency has to be adapted for every modulation in which its respective next integral multiple is selected (Nagel et al., 2010). Before modulation, the baseband has to be filtered by a low-pass in accordance with the modulation frequency, in order for the maximum allowed signal frequency $f_{max}$ not to be exceeded after modulation. Similarly to the methods already presented, subsequently the spectral envelope is formed and the tonality adapted.

FIG. 35 shows the harmonic structure as it forms in a signal extended by means of CM-BWE. FIG. 35 shows an original broad-band spectrum on the left. FIG. 35 shows a spectrum after CM-BWE-HF reconstruction on the right. Like in the HBE method, CM-BWE lacks a harmonic sub-tone in the spectrum. However, this does not attract attention in a negative way, since the harmonic structure itself is maintained.

Of disadvantage with this method is calculating the single sideband modulation. An analytical signal is necessitated for correct calculation, i.e. a signal containing only positive frequencies. A Hilbert transformer is needed for calculating such a signal. This basically is a non-causal filter of infinite impulse response. Such a filter cannot be realized and has to be simplified. In order to nevertheless achieve the highest possible stop band attenuation with a minimal filter order, a non-negligible delay is added to the signal by causalization of the filter (Wilde, 2009).

However, when the frequency shift is realized in the time domain, this may be very complex. Realizing the shift in the subband domain of a subband audio encoder in contrast may result in the frequency resolution to be too coarse for the frequency shift needed.

What is desired is minimizing the memory space of the digital data necessitated or the bandwidth necessitated for transmitting said data by encoding audio signals. At the same time, the perceived quality of the reproduced audio signal is to be comparable to the CD standard (sampling frequency 44100 Hz at a quantization depth of 16 bits). Thus, the quality is to be maximized at a decreasing data rate.

SUMMARY

According to an embodiment, a device for producing a frequency-shifted audio signal based on an audio input signal, wherein the audio input signal, for a plurality of first subbands, may be represented by one or several first subband values, may have: an interface for receiving the audio input signal, and a frequency-shifting unit for producing the frequency-shifted audio signal, for a plurality of second subbands, having one or several second subband values each, wherein each of the first and second subband values has information on a respective phase angle, and wherein the frequency-shifting unit is configured to produce one of the second subband values based on one of the first subband values such that the second phase angle of this second subband value may differ from the first phase angle of this first subband value by a phase angle difference, the phase angle difference being dependent on frequency information indicating by which frequency difference the audio input signal is to be shifted in order to obtain the frequency-shifted audio signal, and the phase angle difference being dependent on a frequency bandwidth of one of the first subbands.

According to another embodiment, a method of producing a frequency shifted audio signal based on an audio input signal, wherein the audio input signal, for a plurality of first subbands, may be represented by one or several first subband values, may have the steps of: receiving the audio input signal, and producing the frequency-shifted audio signal, for a plurality of second subbands, having one or several second subband values each, wherein each of the first and second subband values has information on a respective phase angle, and wherein one of the second subband values is produced based on one of the first subband values such that the second phase angle of this second subband value may differ from the first phase angle of this first subband value by a phase angle difference, the phase angle difference being dependent on frequency information indicating by which frequency difference the audio input signal is to be shifted in order to obtain the frequency-shifted audio signal, and the phase angle difference being dependent on a frequency bandwidth of one of the first subbands.

Another embodiment may have a computer program for performing the above method of producing a frequency shifted audio signal based on an audio input signal when the computer program is executed on a computer or signal processor.

Embodiments provide improved concepts for bandwidth extension, these improved concepts subsequently being referred to as "harmonic spectral band extension" or "HSBE". This developed harmonic bandwidth extension in the frequency domain allows suppressing undesired artefacts. The replicated spectrum here is modulated such that the original harmonic structure is maintained. In contrast to other methods, HSBE can be based on the signal representation in the MDCT domain and thus allows efficient implementation. The harmonically correct bandwidth extension is achieved by a copying process of the spectral values with subsequent modulation.

In accordance with an embodiment, the subband domain of the MDCT which is usually realized already in audio encoders is used. In this way, the transform does not result in additional complexity or delay.

When the signal is shifted by an even integral multiple of the subband bandwidth, in embodiments the subband signals of lower frequencies are shifted to the corresponding higher frequency bands.

When the signal is to be shifted by an odd integral multiple, in embodiments every second sample value of the subband signals which are to be copied is provided with an inverse sign (increasing block index, in the direction of time). In this way, the aliasing cancelation property of the MDCT filter bank still works for the frequency-shifted and copied signal.

When the signals of lower frequencies are shifted by a non-integral multiple of the subband bandwidth, in embodiments complex-valued versions of the subbands of lower frequencies are produced, a copy of these is made and they are modulated (multiplied) by a complex exponential function, wherein said complex exponential function is of a frequency which corresponds to the difference of the frequency of the next integral multiple of the subband bandwidth (this being a fractured subband bandwidth shift). However, the aliasing compensation property of the MDCT filter bank is affected or destroyed by this.

In order to prevent or reduce the resulting frequency distortion, a folding-like processing between neighboring subband signals is performed, wherein a weighted version of the one subband signal adds to the subband signal of a subband in its neighborhood, so that it exhibits the reverse sign of the aliasing component, and so that aliasing is compensated or reduced. In one embodiment, the weights here are chosen such that they correspond to the desired fractured frequency shift.

Modulating the spectrum violates the TDAC property of the MDCT, the result being aliasing components. In order to eliminate these, in embodiments an FIR filter structure for aliasing cancelation is provided. The filter impulse responses necessitated for this are optimized by means of successive approximation and, for example, stored as a look-up table.

However, for the applicability of the concepts presented here, it is not required to adapt the encoding process, i.e. compressing the data, exemplarily by applying a psychoacoustic model.

The concepts provided are based on bandwidth extension methods already present and improve same. Using this new method, it is possible to increase the quality of the audio material reproduced, with constant storage requirements. The encoding process here is not influenced, but the decoder is developed further. The method developed realizes harmonic bandwidth extension. It is based on spectral band replication (SBR), as is used in HE-AAC technology.

The inventive efficient spectral band replication concepts provided maintain the harmonic structure of the original spectrum and thus reduce the described artefacts of the known SBR technology.

Concepts for harmonic spectral band extension (HSBE) are provided. Since efficiency plays an important role, the underlying signal processing will be described, starting at the filter bank used to suppressing artefacts by FIR filters.

The harmonic spectral band extension presented here provides a powerful and efficient way of extending the band-limited spectrum of an audio signal while continuing its harmonic structure.

It will be shown that a number of problems have to be kept in mind with harmonic spectral band extension, in order for the spectrum to be continued in a harmonically correct manner. Even if some methods for reconstructing the harmonic structure of the spectrum are known, it is nevertheless useful to develop novel and more efficient techniques. In particular for integration in modern audio encoder structures, like AAC or USAC, adaptation to the general conditions there is indispensible.

An essential component of successful harmonic spectral band extension is suppressing spurious components occurring. This is exactly why the mode of functioning and optimization of the aliasing cancelation designed for this are in the focus here. It has been shown that the undesired signal portions can be reduced enormously by selecting suitable FIR filters. Thus, in contrast to classical filtering, it is not a time signal which is folded using the filter impulse response, but the complex MDCT/MDST coefficients. Even if this method is not able to cancel all the aliasing components occurring, it is sufficient to eliminate a few dominant spurious portions.

Apart from that, transforming the MDCT coefficients to MDST spectral values is another important element of harmonic spectral band extension. Modern audio encoders operate exclusively in the MDCT domain. The signal is described sufficiently precisely in its spectral representation, nevertheless this information is not sufficient for replicating the spectrum using HSBE. The phase form necessitated can only be modified by additional MDST coefficients. A transform is introduced here which allows, using a constant delay, calculating the missing MDST coefficients as effectively as possible from the known MDCT values. Apart from a precise solution, an error-prone, but resource-saving alternative will be presented.

Modulation of the spectrum is important with HSBE. It shows that two steps are useful for an efficient replication of the spectrum. On the one hand, the spectrum is shifted by integral MDCT subbands and, on the other hand, a modulation within the bandwidth of an MDCT subband is performed for fine resolution. For signals in CD quality, the resolution achieved with this technique is about 0.5 Hz. This means that the harmonic structure of the spectrum may be replicated highly precisely.

The lag frequency necessitated for determining the modulation may exemplarily be provided by the encoder.

In embodiments, a system, a device or a method or a computer program is provided in order to produce a frequency-shifted signal, wherein subband decomposition is used, wherein, for fractured subband bandwidth shifts, the subbands are multiplied by means of multiplication by a complex exponential function.

In embodiments, the aliasing components are compensated or at least reduced by performing a butterfly processing between neighboring subband signals.

In accordance with further embodiments, the frequency shift is performed in the subband domain of an audio encoding system.

In embodiments, the frequency shift is used to fulfill missing frequency portions and/or spectral holes of a frequency representation of a signal in an audio encoding system.

In accordance with embodiments, the frequency shift is used in combination with sample rate conversion to change the replay speed, the pitch remaining the same.

When exemplarily increasing the frequency by means of a frequency shift at first and then reducing the replay speed, the replay time of a certain amount of audio data will become longer with a constant pitch. When, on the other hand, exemplarily reducing at first the frequency by a frequency shift and then increasing the replay time of the certain amount of audio data, the replay time becomes shorter with a constant pitch.

In further embodiments, the concepts are used for fine-adjusting a music signal. The concepts provided may exemplarily be used in a particularly advantageous manner for audio tune. When, for example, only small pitch changes of a digital music signal are to be realized, i.e., exemplarily, frequency changes smaller than the bandwidth of a subband, exemplarily smaller that an MDCT or a QMF subband, the concepts provided are of particular advantage.

In accordance with embodiments, the concepts are used to produce higher frequencies of a spectrum by copying or frequency shifting smaller frequency portions of a spectrum.

In embodiments, the subband decomposition is a modified discrete cosine transform (MDCT).

In further embodiments, the subband decomposition is a polyphase quadrature mirror filter bank (QMF).

The concepts provided in the above embodiments may, among other things, be realized as both a system, a device or a method or a computer program.

An executable implementation of harmonic spectral band extension has formed on the basis of the algorithms and functional principles provided and developed. A real-time implementation in Matlab or in the programming language C or in another programming language is possible. This means that the concepts provided may be applied in real-time systems. The quality of the signal reproduced is expected to increase using these methods, as is also the case with SBR.

Analyzing the complexity of the modulation of the spectrum in accordance with the concepts provided provides very good values. The calculating complexity here is dependent largely on the MDCT-MDST transform.

BRIEF DESCRIPTION OF THE DRAWINGS

Embodiments of the present invention will be detailed below referring to the drawings, in which:

FIG. 5 shows impulse responses of the MDCT-MDST transform matrices in accordance with an embodiment, FIG. 30 is a schematic illustration of SBR-HF reconstruction, FIG. 31 shows a destruction of the harmonic structure with SBR.

DETAILED DESCRIPTION OF THE INVENTION

Figure 1A:
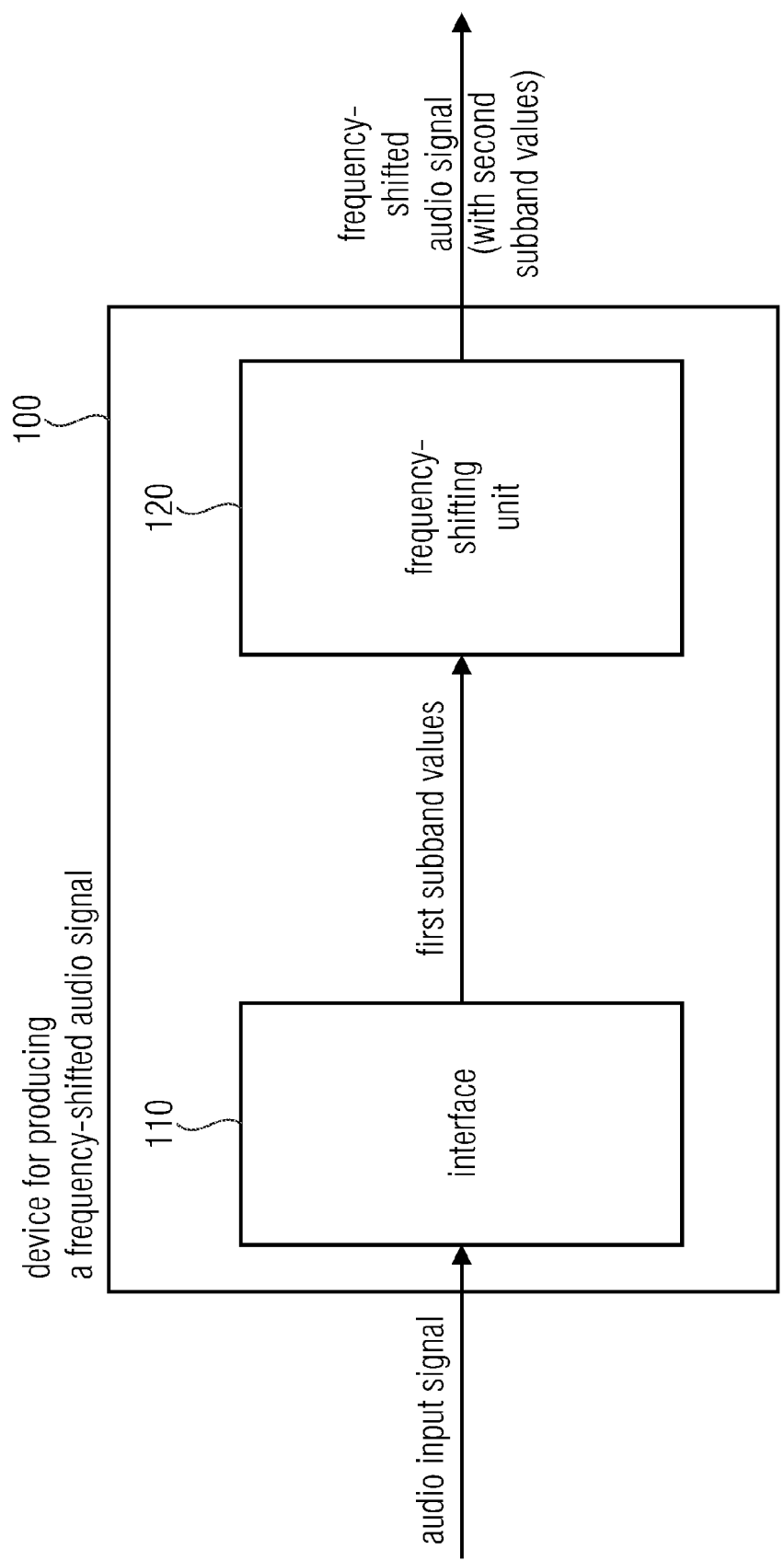
FIG. 1a shows a device for bandwidth extension in accordance with an embodiment.

FIG. 1a shows a device 100 for producing a frequency-shifted audio signal based on an audio input signal. The audio input signal, for a plurality of first subbands, here may be represented by one or several first subband values. The device includes an interface 110 and a frequency-shifting unit 120. The interface 110 is configured for receiving the audio input signal. The frequency-shifting unit 120 is configured for producing the frequency-shifted audio signal, for a plurality of second subbands, comprising one or several second subband values each. In addition, each of the first and second subband values comprises information on a respective phase angle. The frequency-shifting unit 120 is additionally configured to produce one of the second subband values based on one of the first subband values such that the second phase angle of this second subband value may differ from the first phase angle of this first subband value by a phase angle difference, the phase angle difference being dependent on frequency information indicating by which frequency difference the audio input signal is to be shifted, i.e., for example, by which frequency difference the first subband values of the subbands of the audio input signal are to be shifted in order to obtain the frequency-shifted audio signal, and the phase angle difference being dependent on a frequency bandwidth of one of the first subbands.

In some embodiments, the interface may be configured for receiving the frequency information indicating by which frequency difference the first subband values of the subbands of the audio input signal are to be shifted.

Figure 1B:
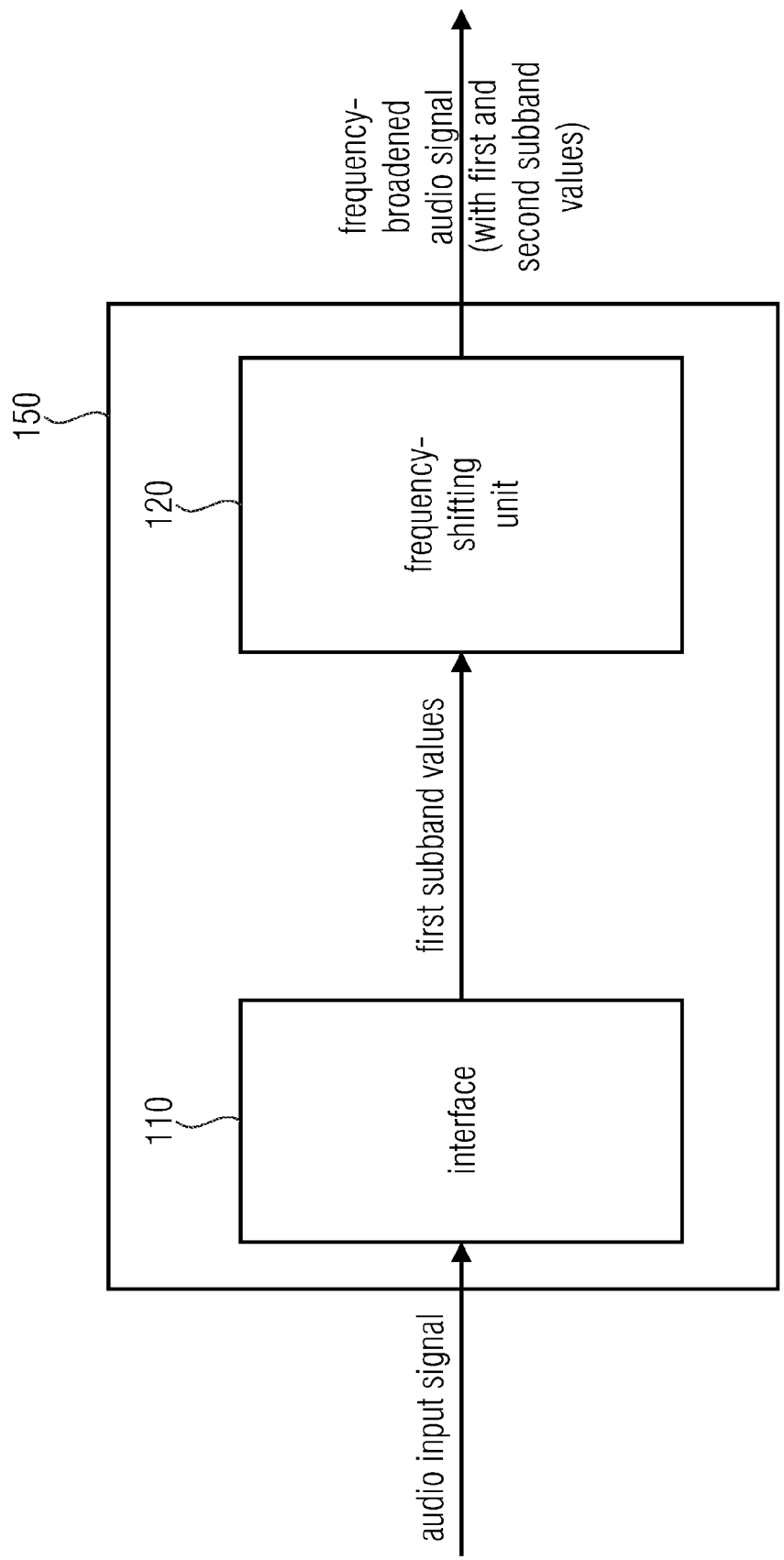
FIG. 1b shows a device in accordance with an embodiment, wherein the device is configured to produce a frequency-broadened audio signal.

FIG. 1b shows a device 150 in accordance with an embodiment. The device 150 is configured for producing a frequency-broadened audio signal. The device 150 here is configured for producing the frequency-broadened audio signal by the device 150 producing the second subband values of the frequency-shifted audio signal, the frequency-broadened audio signal including the first subband values of the audio input signal and the second subband values of the frequency-shifted audio signal.

Concepts of bandwidth extension in accordance with embodiments will be introduced below, being referred to as harmonic spectral band extension (HSBE). This is about concepts combining the advantages of SBR and those of continuous single sideband modulation. It is based on signal representation in the MDCT domain. Thus, HSBE may be integrated directly into current audio encoders, like HE-AAC or USAC, without using an additional QMF filter bank, as is done in SBR. In contrast to the time domain methods, a high-resolution DFT is to be calculated, not requiring an analysis signal.

The mode of functioning of harmonic spectral band extension will be discussed below. Harmonic spectral band extension uses a copy of the baseband in order to generate the HF portion. The baseband is replicated using a copy process in the high-frequency domain. In contrast to CM-BWE, where a gap in which certain harmonic sub-tones are missing is formed by copying, shifting the baseband in HSBE is extended. The baseband is at first also copied upwards, so that the 0 Hz frequency subsequently will be at $f_g$. The gap thus formed between the last harmonic of the frequency $f<f_g$ in the baseband and the frequency $f_g$ is compensated by shifting the copied baseband again downwards such that the harmonic structure will be continuous again. Thus, a gap caused by skipping a harmonic sub-tone, like in the time domain methods is avoided. The bandwidth extension process here consists of two parts. One part is realized by a copy process in the MDCT domain. The low-frequency MDCT coefficients are replicated by simple copying. The other part of bandwidth extension, i.e. maintaining the harmonic structure, is obtained by manipulating the phase. Thus, phase information need to be present for this step. The harmonic spectral band extension basically operates using purely real MDCT coefficients. This means that a transfer to a complex spectrum takes place in order to change phase information. This is achieved by the MDCT-MDST transform provided here.

In order for the high frequencies of the baseband not to superimpose the frequencies of the replicated band during adaptation, the HF band is subjected to high-pass filtering. Due to representing the signal as MDCT coefficients, this filtering is very simple since the undesired coefficients may be set to zero. However, this type of shifting causes a band limitation of the synthesized signal. This means that, after reconstructing the HF band, the original maximum signal frequency $f_{max}$ cannot be obtained, but only the frequency $f_{syn}$. The gap arising between $f_{max}$ and $f_{syn}$ may, if needed, be filled with noise.

Figure 2:
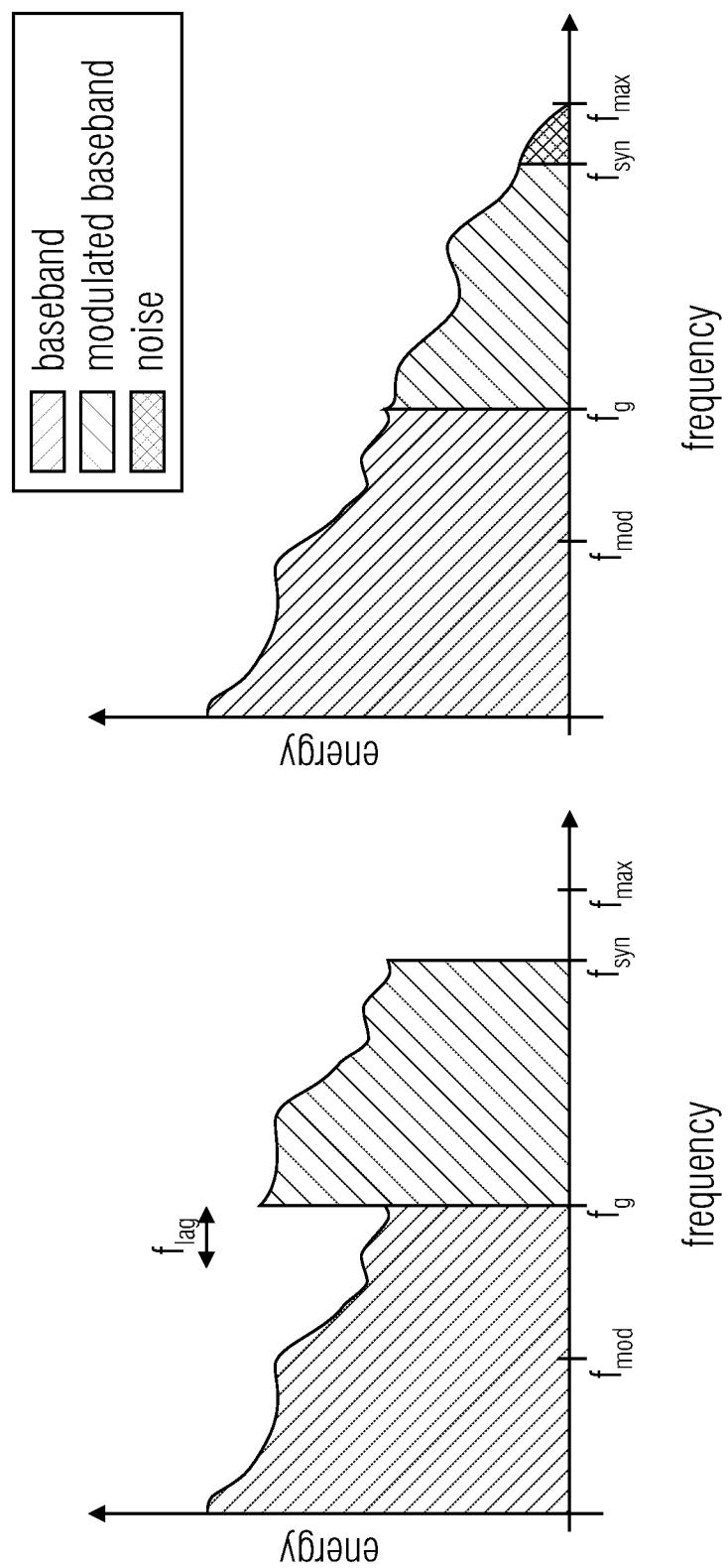
FIG. 2 is a schematic illustration of HSBE-HF reconstruction in accordance with an embodiment.

FIG. 2 is a schematic illustration of the copy process, including harmonic adaptation. Thus, FIG. 2 is a schematic illustration of HSBE-HF reconstruction. FIG. 2 shows copying and shifting the baseband on the left. FIG. 2 shows a spectrum after adaptation of the spectral envelope on the right.

The adaptation of the phase needed causes additional spurious components in the signal. These are suppressed by the anti-aliasing filtering of the complex MDCT/MDST spectral values developed. Finally, the spectral envelope is adapted to its original course by a suitable method.

Figure 3:
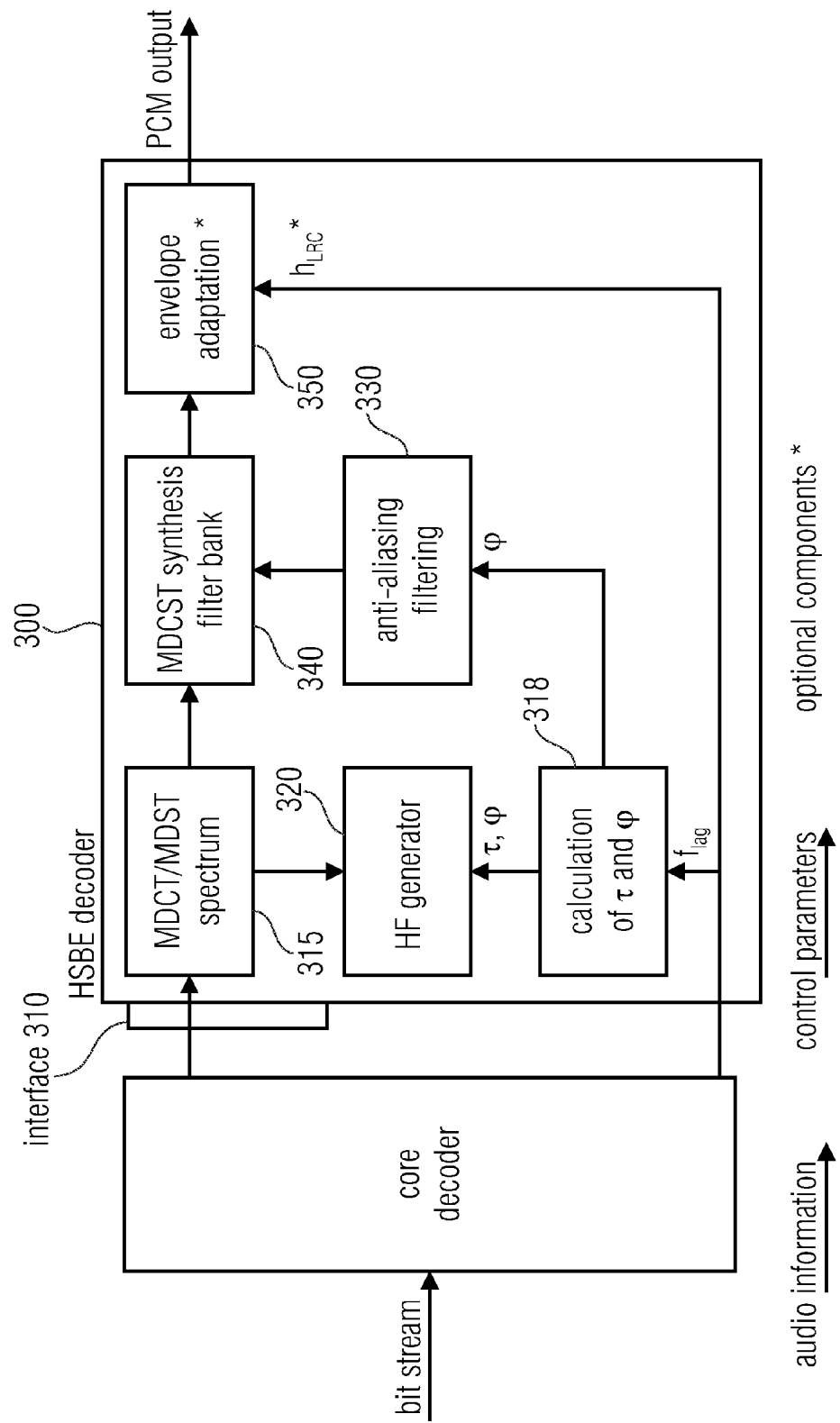
FIG. 3 shows a device 300 for producing a frequency-shifted audio signal in accordance with an embodiment.

FIG. 3 shows an HSBE decoder, i.e. a decoder extended by HSBE, resulting from the procedure mentioned.

FIG. 3 shows a device 300 for producing a frequency-shifted audio signal in accordance with an embodiment. In one embodiment, this may be an HSBE decoder, i.e. a decoder extended by HSBE.

The device 300 comprises an interface 310 and a frequency-shifting unit 320.

An MDCT/MDST transform unit 315 is located between the interface 310 and the frequency-shifting unit 320. Additionally, the device 300 comprises a filter unit 330. Furthermore, the device 300 comprises a synthesis transform unit 340, exemplarily in the form of a filter bank, and an envelope adaptation unit 350. Additionally, the device 300 in the embodiment of FIG. 3 includes a unit for calculating $\tau$ and $\phi$ (318).

The MDCT/MDST transform unit 315 may be configured to obtain one or several first MDCT coefficients of the audio input signal, which are coefficients of a modified discrete cosine transform of the audio input signal. The MDCT/MDST transform unit 315 may obtain these first MDCT coefficients for example from the interface 310.

The MDCT/MDST transform unit 315 is configured to determine, based on one or several of the first MDCT coefficients of the audio input signal, one or several first MDST coefficients of the audio input signal, which are coefficients of a modified discrete sine transform.

The frequency-shifting unit 320 may then be configured for producing second subband values based on a respective one of the first subband values, each of the first subband values being based on one of the first MDCT coefficients and one of the first MDST coefficients having been determined based on this first MDCT coefficient.

The structure of the device 300 shown, exemplarily realized as an HSBE decoder, is dependent on the algorithms implemented. When using this decoder in other environments, it may be necessitated to perform envelope reconstruction in the frequency domain. The corresponding block in this case will be directly in front of the MDCT/MDST synthesis filter bank. Further components may also be inserted here, like tonality adaptation used in SBR. However, these methods do not have an effect on the general mode of functioning of harmonic spectral band extension.

The decoding process of a signal in accordance with an embodiment having been encoded in the MDCT domain also results from FIG. 3. In order to shift some parts of the spectrum as desired, the decoded MDCT coefficients are at first transformed to a combined MDCT/MDST representation. This is useful since the modulation of a complex spectrum will produce greater aliasing components only in every second subband. Thus, compensation is necessitated only in every second subband, wherein this compensation is performed using the aliasing compensation method suggested.

The HF generator shifts the complex frequency inputs from the MDCT/MDST transform representation in accordance with the desired shift, either in a decoded manner from the bit stream or determined at the decoder or by external processes. The modulation term used is:

$$e^{-jb\,\varphi}\frac{\pi}{180°},$$

b being the block index, φ being the frequency shift in degrees (a frequency shift by 180° corresponds to a shift to the center of the next subband).

After that, aliasing reduction will be performed, wherein then the complex spectrum is retransformed inversely to the time domain and reproduced.

The modulation term used is a complex exponential function. φ is an angle in degrees, which is dependent on the frequency difference by which the first subband values of the subbands are to be shifted.

Transfer from MDCT to MDST will be discussed below.

The single sideband modulation for maintaining the harmonic structure is partly realized using a manipulation of the phase. For harmonic spectral band extension, the phase response is of essential importance. As has already been discussed, HSBE generally operates in the real MDCT domain.

The encoder makes available only MDCT coefficients so that additionally the MDST coefficients are necessitated for the phase response. Transferring the MDCT coefficients to the corresponding MDST coefficients is possible and will be discussed below.

The precise calculation of MDST will be discussed below.

As in DCT, in MDCT there is a corresponding function for calculating the sine portions in the signal: the discrete modified sine transform (MDST). For MDST, the same characteristics apply as for MDCT, however it is hardly used in audio encoding.

For some applications, like, for example, HSBE, it is nevertheless useful to calculate the MDST spectrum of a signal. A precise absolute value and phase spectrum can be obtained by combining the two spectra (Cheng, 2004).

The MDST is calculated similarly to the MDCT in equation 2.35. The transform matrix $T$ and the window matrix $F$ exhibit differences. The MDST transform matrix is calculated using the modulation core of DST-IV (cf. equation 2.18):

$$T_{DST}(k,n) := \sin\left(\frac{\pi(n+0,5)(k+0,5)}{N}\right) \in \mathbb{R}^{N \times N} \quad (4.1\text{a})$$

$$T_{DST}^{-1} = \frac{2}{N} \cdot T_{DST} \quad (4.1\text{b})$$

Due to other symmetry properties and other edge continuations of DST-IV compared to DCT-IV, the folding matrices need to be adapted correspondingly. The modification is a change in sine of the second and fourth quadrants of the window matrix $F$:

$$F_{sin} = \begin{bmatrix} 0 & -w\left[\frac{N}{2}-1\right] & w\left[\frac{N}{2}\right] & 0 \\ \cdot^{\cdot^{\cdot}} & & & \ddots \\ -w[0] & 0 & & w[N-1] \\ w[N] & & & w[2N-1] \\ \ddots & & & \cdot^{\cdot^{\cdot}} \\ 0 & w\left[N+\frac{N}{2}-1\right] & w\left[N+\frac{N}{2}\right] & 0 \end{bmatrix} \quad (4.2)$$

Using these adaptations, the MDST of a signal $\underline{x}$ divided into blocks may be calculated as follows:

$$\underline{X}_{MDST} = T_{DST} \cdot \underline{D} \cdot F_{sin} \cdot \underline{x} \quad (4.3)$$

For the inverse transform, the following applies:

$$\hat{\underline{x}} = F_{sin}^T \cdot \underline{D}^{-1} \cdot T_{DST}^{-1} \cdot \underline{x} \quad (4.4)$$

A complex transfer function calculated from a combination of MDCT and MDST spectra is necessitated in order to manipulate the phase response, for example. The method implemented for transferring the MDCT spectrum to MDST coefficients will be presented below.

A trivial method, complex as far as calculating is concerned, is transferring the signal in the MDCT domain back to the time domain, with subsequent MDST:

$$\underline{X}_{MDST} = T_{DST} \cdot \underline{D} \cdot F_{sin} \cdot F^T \cdot \underline{D}^{-1} \cdot T^{-1} \cdot \underline{X} \quad (4.5)$$

This calculation may be simplified in order to reduce the complexity necessitated. Thus, at first the polyphase matrix $H$ is defined as follows:

$$H = T_{DST} \cdot \underline{D} \cdot F_{sin} \cdot F^T \cdot \underline{D}^{-1} \cdot T^{-1} \quad (4.6)$$

The elements of the matrix $\underline{H}$ each consist of third-order polynomials in z. This property may be used to represent $\underline{H}$ as an addition of three matrices:

$$\underline{H} = \underline{H}_0 z^0 + \underline{H}_1 z^{-1} + \underline{H}_2 z^{-2} \qquad (4.7)$$

The three sub-matrices $\underline{H}_0$, $\underline{H}_1$ and $\underline{H}_2$ show characteristic features which result in efficient calculation. The matrix $\underline{H}_1$ is a weakly populated matrix with elements 0.5 and −0.5. There is a direct connection between the matrices $\underline{H}_0$ and $\underline{H}_2$ so that the matrix $\underline{H}_2$ may be produced to be a reflection of the elements of $\underline{H}_0$ relative to its secondary diagonal. The precise shape and a detailed calculation of these matrices will be presented below. The MDST spectrum of block (b−1) may then be calculated as follows:

$$\underline{X}_{MDST}(b-1) = \underline{H}_0 \cdot \underline{X}(b) + \underline{H}_1 \cdot \underline{X}(b-1) + \underline{H}_2 \cdot \underline{X}(b-2) \qquad (4.8)$$

Thus, $\underline{X}(b)$ is the $b^{th}$ column of the matrix $\underline{X}$. It can also be recognized from this equation that a delay of one block is introduced for calculating the MDST spectrum. When the MDST spectrum of block b is present, at first the MDST spectrum of the previous block is available. Using the MDST coefficients achieved in this way, a phase response may be calculated from the complex MDCT/MDST spectrum and be manipulated using a phase rotation in order to maintain the harmonic structure, as has been discussed before.

A simplified MDST calculation will be discussed below.

Even if, in accordance with the method derived, calculating the MDST is simplified enormously, the calculation of this transform is nevertheless highly calculating-intensive. In addition, lots of memory space is necessitated for storing the matrix $\underline{H}_0$. This means that a further simplification of the transform is sought.

When analyzing the matrices $\underline{H}_0$ and $\underline{H}_2$ more precisely, it is striking that they contain a very high number of values which approximate zero. The coefficients of the largest absolute values are concentrated to a narrow region close to the principal diagonal of the matrices. Thus, it seems to be obvious to replace the remaining coefficients by zero in order to save both calculating power and storage requirements in this way. Furthermore, the values on the diagonals are highly similar. They basically only differ from one another by their signs. Solely in the regions close to the edges are the coefficients of greater values.

For simplification purposes, it is assumed that the values below and above the principal diagonal are equal, meaning that there is an axial symmetry of the matrix relative to the principal diagonal. A simplified matrix is calculated, the values of which are taken from the center column of the matrix $\underline{H}_0$. Thus, a region including the element of the principal diagonal and any number of further elements below the principal diagonal is cut out from the center column. This cut-out sector is referred to by $\underline{h}[n]$. The center column of the new matrix is then formed from $\underline{h}[n]$ and a point reflection of $\underline{h}[n]$ relative to the main axis element $h_i,j$, the rest of the column being zero. The other columns of the simplified matrix are then formed by cyclic shifting of this column. The sign of every second column is adapted. Using these methods for simplifying the fully occupied matrix $\underline{H}_0$, the weakly occupied matrix $\underline{H}'_0$ may then be determined using a very small number of coefficients. The symmetrical Toeplitz-like structure is a particularity of this matrix. It is formed by the cyclic shifting of the clipped impulse response h[n] mirrored relative to the principal diagonal with:

$$h[n] = [h_{i,j}, h_{i+1,j}, \ldots, h_{i+\sigma-1,j}, h_{i+\sigma,j}], \qquad (4.9)$$

$$i, j = \frac{N}{2} - 1$$

Thus, i is the line index and j the column index of the matrix $\underline{H}_0$ and σ is the window index determining the length of the sector. The length of this sector will be 2σ+1. For σ=1 and N=6, the following applies for the structure of the matrix $\underline{H}'_0$:

$$\underline{H}'_0 = \begin{bmatrix} -h[0] & h[1] & 0 & 0 & 0 & 0 \\ -h[1] & h[0] & -h[1] & 0 & 0 & 0 \\ 0 & h[1] & -h[0] & h[1] & 0 & 0 \\ 0 & 0 & -h[1] & h[0] & -h[1] & 0 \\ 0 & 0 & 0 & h[1] & -h[0] & h[1] \\ 0 & 0 & 0 & 0 & -h[1] & h[0] \end{bmatrix} \qquad (4.10)$$

It must be kept in mind that, starting with the first column, every second column is multiplied by −1. In the following considerations, the window index σ corresponds to about 10% of the transform length N, i.e. σ=[0, 1·N]. This means that the memory requirements for the transform matrix have decreased to 20% due to mirroring the values of h[n].

Figure 4A:
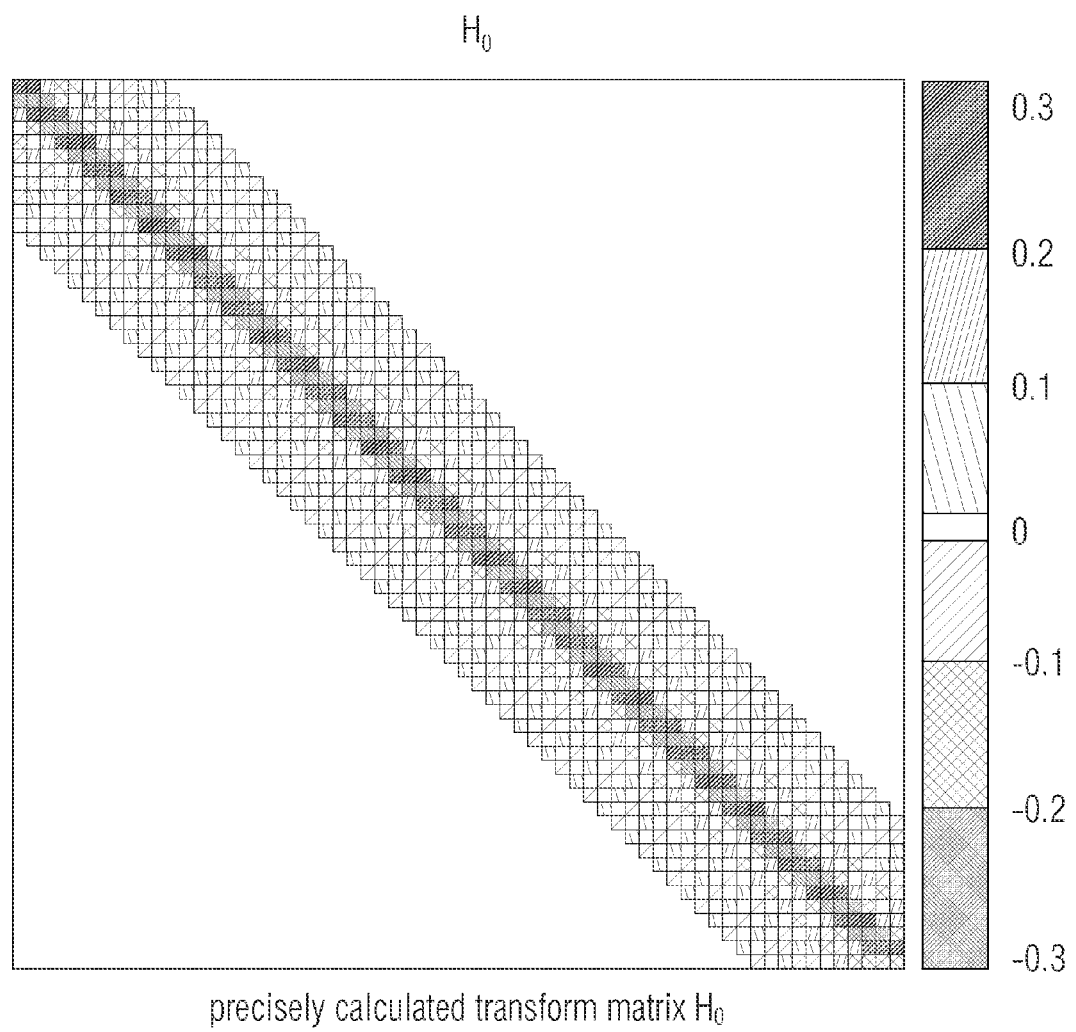
FIGS. 4a, 4b show an estimation of the MDCT-MDST transform matrix in accordance with an embodiment.
Figure 4B:
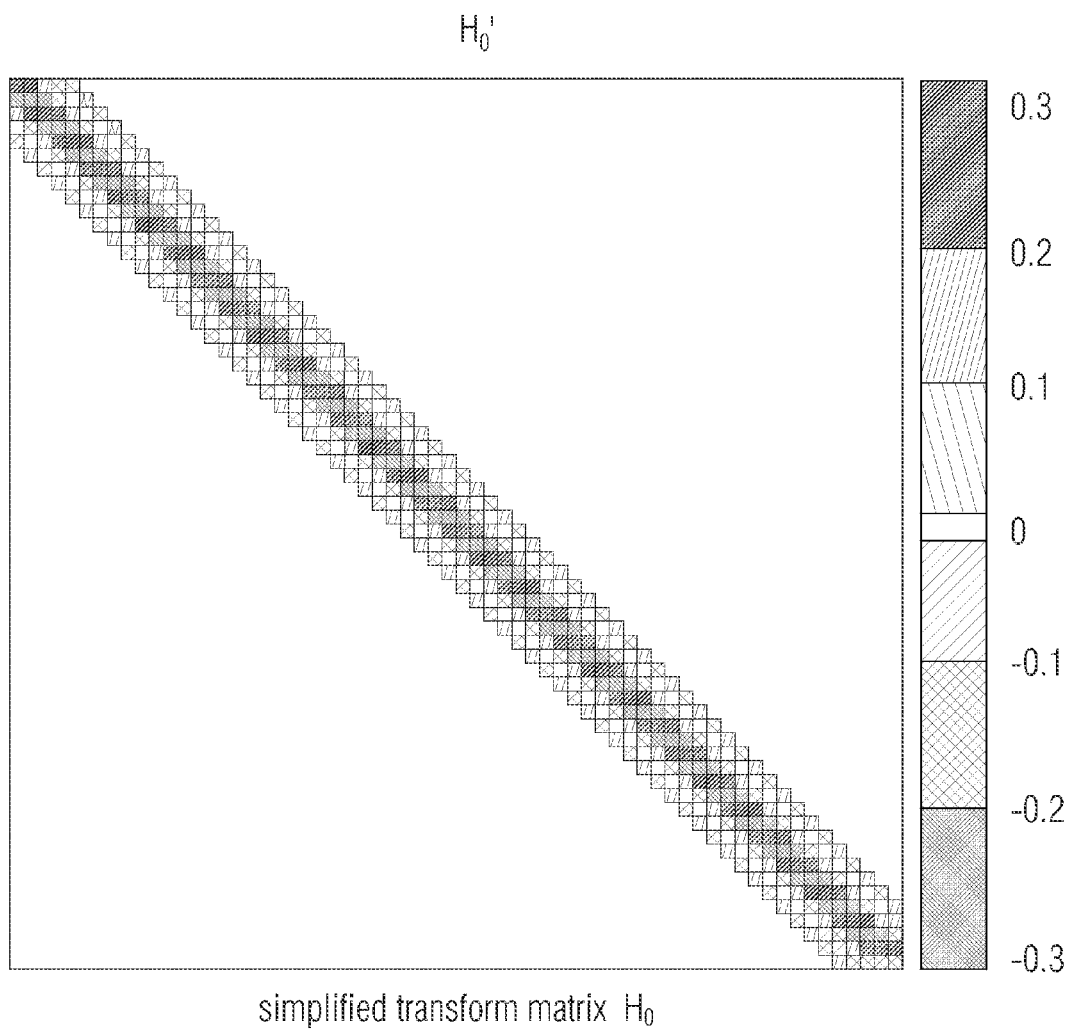

FIG. 4a and FIG. 4b represent an estimation of the MDCT-MDST transform matrix. FIG. 4a shows a fully occupied transform matrix $\underline{H}_0$ for N=64 on the left. FIG. 4b shows a simplified transform matrix $\underline{H}'_0$ for N=64 on the right.

FIG. 4a shows the fully occupied matrix $\underline{H}_0$ on the left and, in comparison, FIG. 4b shows the simplified matrix $\underline{H}'_0$ in a symmetric Toeplitz-like structure on the right. As can be seen, a large part of the coefficients is off the principal diagonal of $\underline{H}'_0$ equals zero, caused by the simplification.

FIG. 5 represents the impulse responses of the MDCT-MDST transform matrices. In particular, FIG. 5 illustrates the original impulse response of the $33^{rd}$ column of the matrix $\underline{H}_0$ (continuous line). For comparison, additionally, the corresponding impulse response, having formed by the copy process and mirroring, of the new matrix $\underline{H}'_0$, is to be seen. Clipping out the values takes place using a rectangular window with the window index σ=6.

Figure 6:
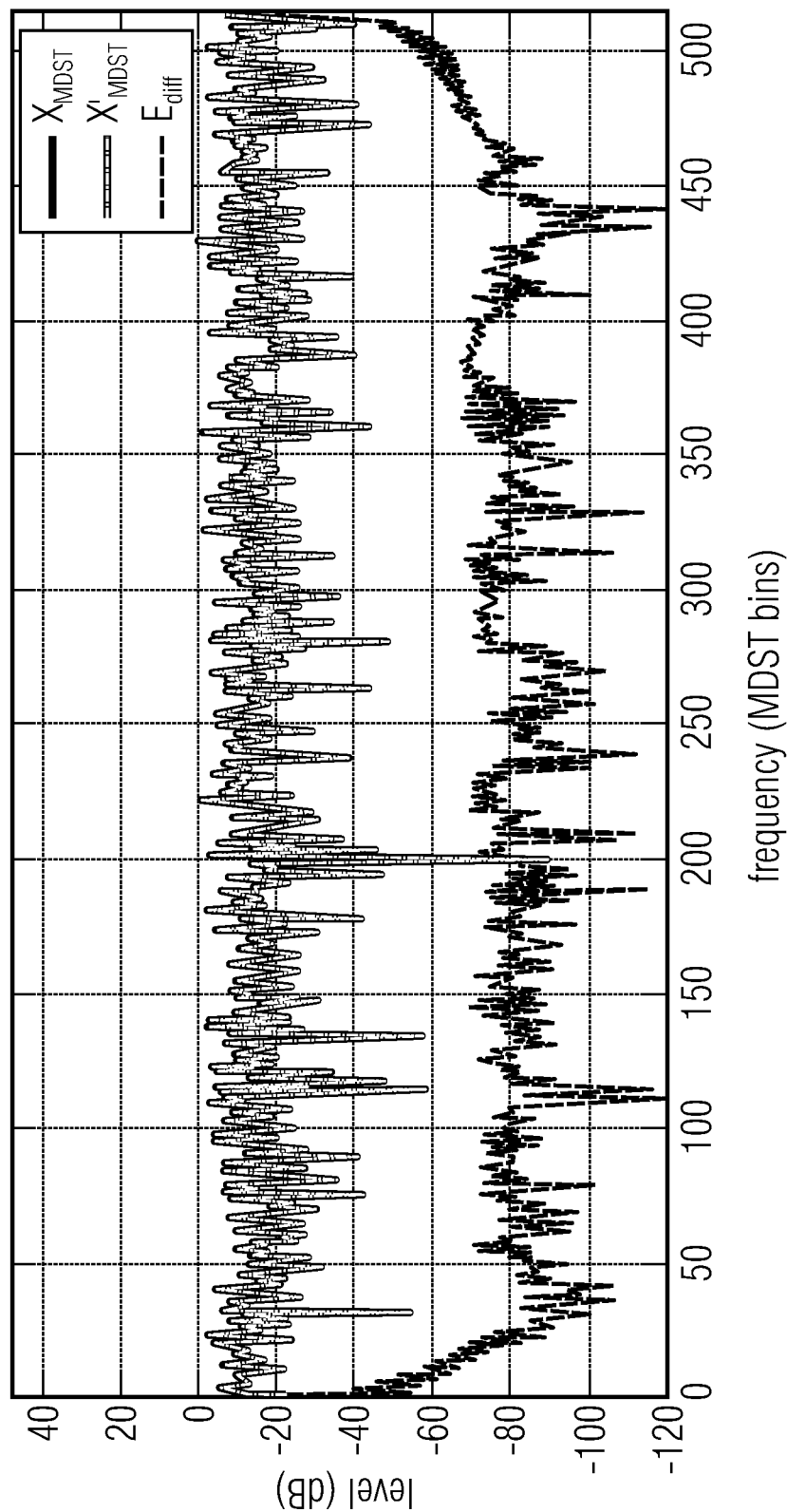
FIG. 6 shows an estimation of the MDST spectrum for white noise.

This kind of simplification of the MDCT-MDST transform does not provide the precise MDST spectrum, as is formed by means of the calculation of equation 4.8. An error is added to the spectrum by the simplification of the matrices $\underline{H}_0$ and $\underline{H}_2$ performed. This causes a reduction of the signal-to-noise distance to roughly −70 dB, as is shown in FIG. 6. FIG. 6 shows an estimate of the MDST spectrum for white noise. The error of estimating the MDST spectrum increases at the edge regions of the spectrum. This effect is owing to the imprecise estimation of the matrix coefficients close to the ends of the principal diagonal. The mirror produced is reduced by high-pass filtering of the HSBE algorithm and is consequently only present in high frequencies.

Adapting the harmonic structure of the frequency spectrum will be discussed below.

An advantage of the HSBE method is maintaining the harmonic structure after bandwidth extension. As has already been mentioned, this takes place by a phase manipulation in the complex MDCT/MDST region. The copied spectral band of the bandwidth $B=f_{max}-f_g$ will be considered here. The goal is shifting the spectrum downwards such that the first harmonic in this band (exemplarily with the frequency $f_{H,n}>f_g$) after shifting will be at the frequency of the highest harmonic in the baseband of the frequency $f_{H,\alpha}<f_g$. The distance between the frequencies $f_{H,n}$ and $f_{H,\alpha}$ is referred to as lag frequency $f_{lag}$.

Adaptation of the harmonic structure is regulated using this frequency. This frequency can also be represented as a respective integral and non-integral multiple of MDCT subbands, by which the frequency band is to be shifted downwards. This allows a maximum flexibility of the method developed. After having fulfilled the condition mentioned before, all the MDCT coefficients with a discrete frequency of smaller than $f_g$ are set to zero in order for the baseband and the shifted band not to overlap.

Figure 7:
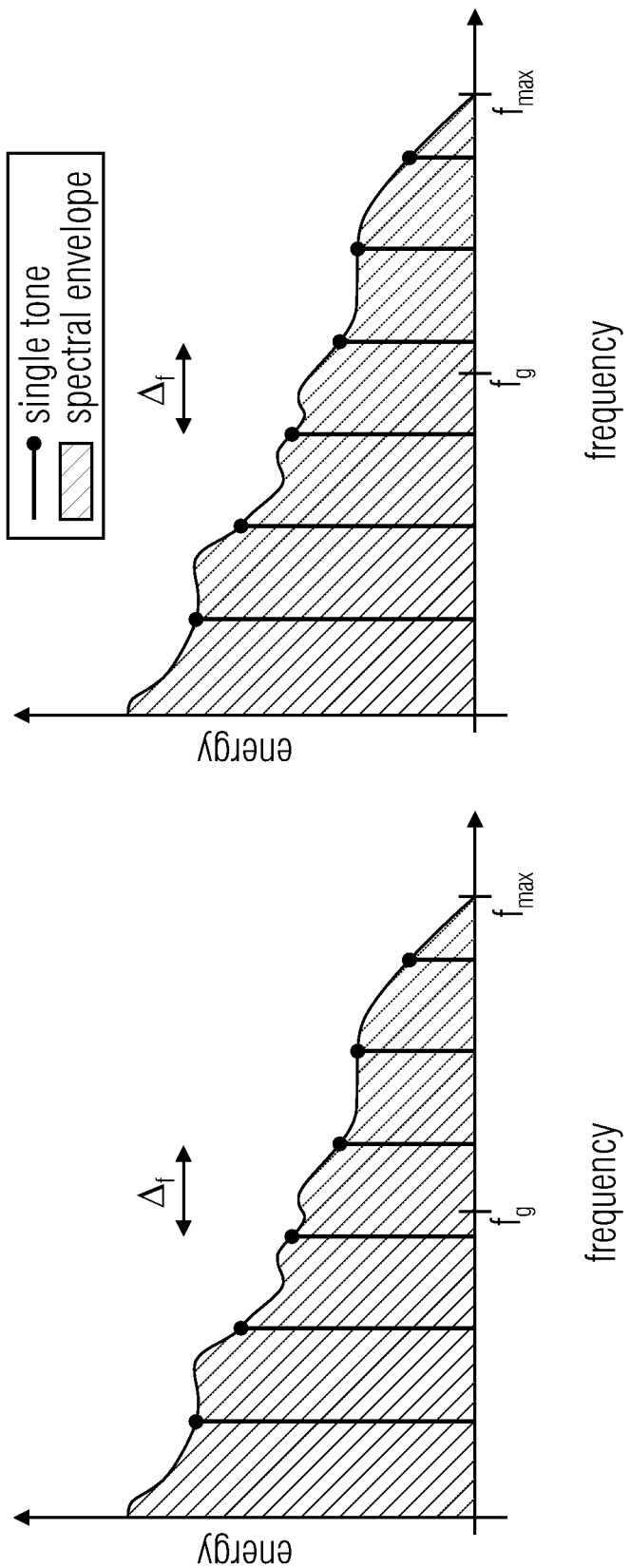
FIG. 7 shows a harmonic structure with HSBE in accordance with an embodiment.

FIG. 7 is a schematic illustration of the desired result of the HSBE method for a tonal signal. Thus, FIG. 7 shows the harmonic structure in HSBE. FIG. 7 shows the original broadband spectrum on the left. FIG. 7 shows the spectrum after HSBE HF reconstruction on the right.

The original harmonic structure is maintained here. No harmonic sub-tone is left out by the discussed shift of the replicated high-frequency band to frequencies smaller than the cutoff frequency $f_g$. Shifting the spectrum may thus be interpreted to be a single sideband modulation of the high-pass-filtered baseband signal using the modulation frequency $f_{mod}$. The following applies:

$$f_{mod}=f_g-f_{lag} \quad (4.11)$$

Thus, it must be kept in mind that, with frequencies $f_{lag}$ greater than half the bandwidth of an MDCT band, MDCT coefficients close to $f=f_{max}$ become zero by the shift. These may be filled up with noise. This is not necessitated when the frequency $f_{lag}$ is smaller than half the bandwidth of an MDCT band, since no MDCT coefficient is set to zero.

The adaptation of non-integral subbands will be discussed below.

Maintaining the harmonic structure is complicated when an MDCT band comprises a high bandwidth compared to the frequency difference of successive sub-tones of the harmonic structure. When performing the modulation using only frequencies which are an integral multiple of the bandwidth of an MDCT band, the resolution of the harmonic reconstruction is limited strongly and consequently a fine harmonic structure cannot be restored. Thus, high modulation precision has to be allowed so that the spectrum of the baseband can not only be modulated by integral multiples of the MDCT band bandwidth, but also by fractions thereof.

Using the following approach, it is possible to shift the spectrum within the bandwidth of an MDCT subband. The method is based on modifying the phase of the complex MDCT/MDST spectrum. The phase here is rotated by a normalized frequency shift $\phi$, in dependence on the temporal course of the signal. This temporal rotation of the phase angle thus allows a very fine shift of the spectrum. The following applies:

$$\underline{X}_{mod}(b) = \underline{X}(b) \cdot e^{-j \cdot b \cdot \varphi \cdot \frac{\pi}{180°}} \quad (4.12)$$

Thus, $\underline{X}(b)$ is the $b^{th}$ column of the complex matrix $\underline{X}=\underline{X}_{MDCT}+j \cdot \underline{X}_{MDST}$ and $\phi$ is the normalized frequency shift in degrees. Theoretically, any angles may be used for $\phi$, but for practical reasons the range of values is limited strongly and is within an interval $[-90, 90] \subset \mathbb{Z}$. Using this interval, it is possible to calculate modulations covering the bandwidth of an MDTC band. By setting the normalized frequency shift to the interval indicated, the spectrum may be shifted by half the MDCT bandwidth each towards higher or lower frequencies.

For the complex exponential function $$e^{-j \cdot b \cdot \varphi \cdot \frac{\pi}{180°}},$$

which is dependent on b and $\phi$, at first a result value may be calculated. $\phi$ is an angle in degrees which is dependent on the frequency difference by which the first subband values of the subbands are to be shifted. A second subband value to be determined may then be established by multiplying one of the first subband values in $\underline{X}(b)$ by the result value.

Adaptation of integral subbands will be discussed below.

The limited range of values of the phase angle $\phi$, using the modulation introduced, allows only the spectrum to be shifted by at most the bandwidth of an MDCT band. For shifts of the spectrum greater than the bandwidth of an MDCT band, this shift is divided into two parts, an integral multiple of the MDCT band bandwidth and a fraction of said bandwidth. At first, the spectrum is modulated by the necessitated frequency smaller than the bandwidth of an MDCT band in accordance with equation 4.12, and subsequently the spectrum is shifted by integral spectral values.

Subsequently, the shift which corresponds to precisely a multiple of the bandwidth of an MDCT band will be considered. In this case, there is a phase angle $\phi'$ which is an integral multiple of 180°. Thus, the shift of the spectrum by integral MDCT spectral values may be considered to be a special case of the method introduced above for non-integral subbands. Evaluating the complex modulation function in equation 4.12 has the following results. If the product of block index b and $\phi'$ is an even multiple of 180°, the result of the modulation function will be 1, otherwise $-1$. Knowing this, it is not necessary to evaluate the function in equation 4.12 for adaptation of integral subbands, a simple distinction of cases is sufficient. The following applies:

$$\underline{x}_{mod}(b, 0:N-\tau-1) = \quad (4.13)$$

$$\begin{cases} -\underline{x}(b, \tau:N-1) & \text{if } \left(b * \frac{\varphi'}{180°}\right) \in [1, 3, 5, \cdots] \\ \underline{x}(b, \tau:N-1) & \text{else} \end{cases}$$

using the integral modulation index $\tau$:

$$\tau = \frac{\varphi'}{180°} \quad (4.14)$$

Thus, $\underline{X}(b, \tau: N-1)$ again is the $b^{th}$ column of the complex matrix $\underline{X}=\underline{X}_{MDCT}+j \cdot \underline{X}_{MDST}$, with the difference that only the vector elements starting at $\tau$ up to the last element N are used here. This clipping of vector elements corresponds to the high-pass filtering mentioned above of the complex MDCT/MDST spectrum.

For applying the modulation, the modulation frequency is transferred to the modulation index $\tau$ and the phase angle $\phi$ in dependence on $f_{lag}$. At first, the frequency $f_{lag}$ is normalized to half the sampling frequency $f_s$. Subsequently, the equivalent shift in MDCT bands $\phi_{lag}$ is established and the modulation index $\tau$ and the phase angle $\phi$ are calculated as follows:

$$\omega_{lag} = f_{lag} \cdot 2/f_s \quad (4.15)$$

$$\phi_{lag} = N \cdot \omega_{lag} \quad (4.16)$$

$$\tau = \lfloor \phi_{lag} \rfloor \quad (4.17)$$

$$\phi = \lfloor (\phi_{lag} - \tau) \cdot 180° \rfloor \quad (4.18)$$

By combining the two methods, it is possible to realize variable patch ratios. The patch ratio here is the ratio of the maximum signal frequency possible $f_{max}$ and the cutoff frequency of the baseband $f_g$. A patch ratio of 2:1, for example, expresses that a single copy of the baseband is established and modulated (cf. FIG. 2). Patch ratios greater than 2:1 occur with lower or varying transfer rates. Such ratios are, similarly to CM-BWE (see above), realized by copying and modulating the baseband several times. It must also be kept in mind here that the lag frequency needed here is increased by $f_{lag}$ with each copy of the baseband, as is illustrated in FIG. 8 for a patch ratio of 2.5:1.

Figure 8:
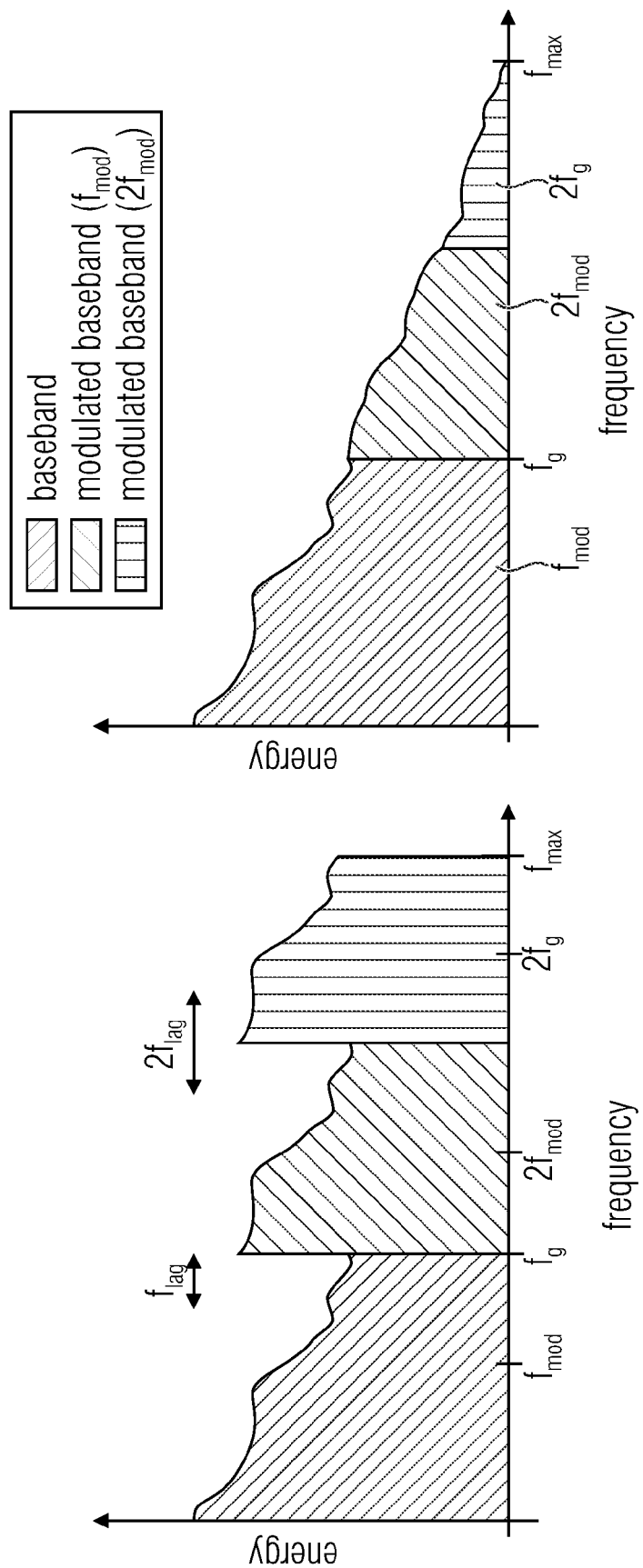
FIG. 8 shows a diagram of extended HSBE-HF reconstruction in accordance with an embodiment.

FIG. 8 illustrates a scheme of extended HSBE-HF reconstruction. FIG. 8 shows copying and shifting the baseband on the left. FIG. 8 shows the spectrum after having adapted the spectral envelope on the right.

Subsequently, concepts for suppressing spurious components occurring will be described. The concepts described here may exemplarily be applied in the filter unit 330 of FIG. 3.

Modulation of the spectrum in the MDCT domain cannot be performed easily. Perfect reconstruction in the inverse MDCT is no longer possible due to the modulation of the spectrum. The cause is the time domain aliasing components having formed. The energy of these spurious components is redistributed by the modulation of the spectrum. The TDAC feature of the MDCT is violated by this and can no longer cancel these components with the inverse transform. When considering the modulated signal after the inverse MDCT, spurious components can be found in the DFT absolute value frequency response for this reason. When shifting the spectrum by $\phi = 0°$ and $\tau > 0$, these aliasing components exhibit only a very low amplitude and are located in the first or last MDCT band. In this case, it is not necessary to reduce the components. With shift factors $\phi \neq 0°$, the amplitude of the spurious components forming is considerably larger. In this case, they are clearly audible. Consequently, these components will be treated.

Figure 9:
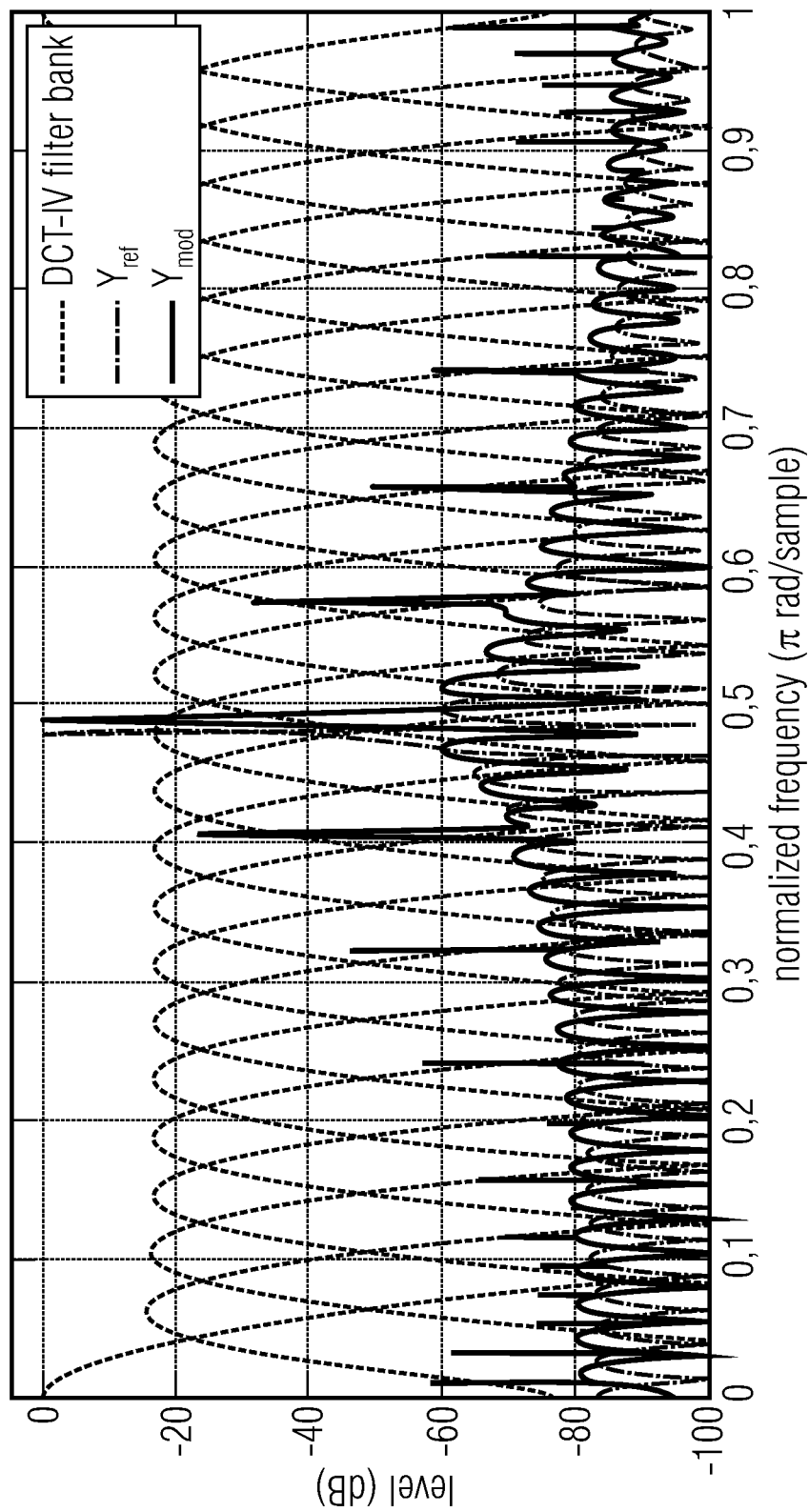
FIG. 9 shows aliasing components for $\phi=45°$.

FIG. 9 shows aliasing components for $\phi = 45°$: $y_{ref}$ is an original sine tone; $y_{mod}$ is a modulated sine tone including aliasing components, the DCT-IV filter bank being shown in an expanded manner for an improved illustration.

In particular, FIG. 9 illustrates the absolute value frequency response of a sine tone ($y_{mod}$) shifted by $\phi = 45°$. The frequency of the original sine tone ($y_{ref}$) corresponds to the band center of the $12^{th}$ MDCT band. The entire spectrum is modulated by a fourth of the bandwidth of an MDCT band towards high frequencies by the selected phase angle. As can be seen, the eight dominant aliasing components are each located in every second band below and above the $12^{th}$ MDCT band. This feature of the aliasing components applies for any signal. The reason for this is that each signal may be decomposed to a weighted sum of sine and cosine oscillations (see above). For each of these sub-oscillations, this special pattern of aliasing components results when modulating in accordance with equation 4.12. Knowing this, a method which allows freeing any signal from the undesired spurious components can be developed. Thus, it is sufficient to analyze and cancel the aliasing components forming by the modulation of a sine signal.

Subsequently, concepts for anti-aliasing filtering will be provided.

Additional signal portions form in the frequency domain by the temporal overlapping of the blocks for TDA. These are present as spurious portions in the spectrum of the bandwidth-extended signal since they are not canceled out in the inverse transform by the shift in the frequency domain. In MDCT, these spurious components recognizable as peaks in the FFT spectrum (cf. FIG. 9) are illustrated by the low stop band attenuation of the DCT-IV filter bank of only about 15 dB by a sum of portions in several of the overlapping MDCT bands. The energy of the spurious components in the high-resolution DFT spectrum may thus be considered to be calculating the sum of the energy of several MDCT bands.

Due to this association, a filter for reducing the spurious components in the MDCT domain is provided. The filter is based on a sequential summing of the frequency values weighted by the filter coefficients. Extending the filter by a centered frequency value represents the frequency domain in which the spurious components are canceled. For every dominant aliasing component, a filter coefficient which minimizes same is necessitated. The filter is dependent on the frequency shift $\phi$. The following applies:

$$\underline{X}_{AntiAlias}(b) = \underline{X}(b) * \underline{h}(\phi) \quad (4.19)$$

Thus, $\underline{h}(\phi)$ is the real anti-aliasing filter for a certain phase angle $\phi$ and $\underline{X}(b)$ is the complex MDCT/MDST spectrum. The spectrum after filtering ($\underline{X}_{AntiAlias}(b)$) here is longer than the original spectrum $\underline{X}(b)$. This means that the spectrum has to be clipped in order for it to correspond again to the transform length N. That part of the spectrum where the filter settles and decays is removed. Thus, clipping by half the filter length is performed both at the beginning and the end of the folding product in the complex MDCT/MDST domain.

Figure 10:
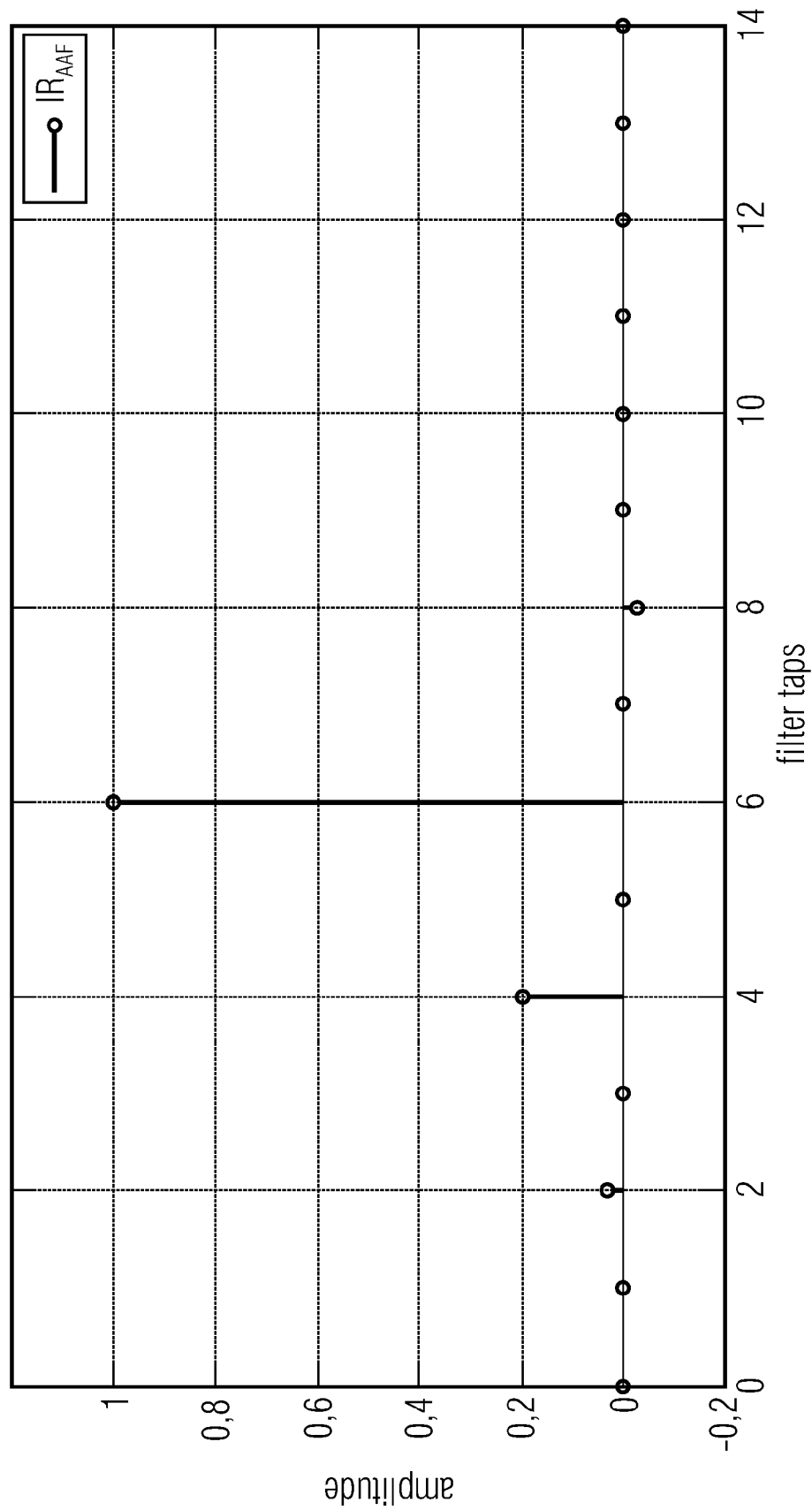
FIG. 10 shows a filter impulse response of an anti-aliasing filter in accordance with an embodiment for $\phi=90°$.

In FIG. 10, the filter impulse response of the anti-aliasing filter (AAF) for $\phi = 90°$ can be seen. Using the example of a single sine tone, it is possible using the filter shown to cancel out a total of seven dominant aliasing components. Three components are below the frequency of the sine tone. These components which, corresponding to their position to the frequency of the sine tone, are referred to as components up to the third order are treated by the filter coefficients (filter taps) 0, 2 and 4. The filter taps 8, 10, 12 and 14 cancel four spurious components at frequencies above the sine tone, i.e. components up to the fourth order. All in all, the filter comprises 15 coefficients, every second value equaling zero. This corresponds to the above observation of aliasing components to arise only in every second band.

The filter coefficients of FIG. 10 thus are in a certain order. Every filter coefficient in this order which follows a filter coefficient unequal to zero comprises a zero value.

Using such a filter structure, it is possible in general to suppress any number of aliasing components. It is sufficient to cancel out the components up to the fourth order. This allows achieving a signal noise distance of at least 70 dB, which can be considered to be sufficient. In addition, high-order aliasing components become noticeable only with very large phase angles $\phi$. The limitation to cancelation up to the fourth order thus is a good compromise between the SNR achievable and the calculating complexity for aliasing cancelation.

The optimization of anti-aliasing filters will be discussed below.

An important component of the aliasing cancelation described are the anti-aliasing filters used. The reduction in the amplitude of the individual spurious components achievable is decisively dependent on selecting suitable filter coefficients. Thus, these filters have to be optimized such that the highest suppression possible is ensured. A reliable method here is numerical optimization of the filter coefficients by means of successive approximation.

Successive approximation is an iteration method of numerical mathematics and refers to the process of approximating a calculating problem to the precise solution step by step. Thus, a calculating method is applied repeatedly and the result of one step used as a starting value for the respective next step. The sequence of results is to be convergent. When the acceptable error for the precise solution is minimal, the result has been determined to a sufficiently precise degree (Jordan-Engeln and Reutter, 1978).

At the beginning of the optimization process, an analysis signal is modulated, using equation 4.12, by a certain phase angle $\phi$. The analysis signal is a sine signal, for the reasons cited above. The frequency of the tone ideally is at one fourth of the underlying sampling frequency. The advantage of this is that the aliasing components forming up to the fourth order exhibit the largest distance possible to the edges of the spectrum and do not interfere with other spurious components. For optimization purposes, an MDCT transform length of 32 samples is ideal. What follows is that the frequency of the sine tone corresponds to the band center of the $16^{th}$ MDCT band. Limitation to this transform length offers several advantages. On the one hand, this allows reducing the calculating complexity of the MDCT. On the other hand, aliasing components up to the fourth order are generated with no interferences at a maximum distance to one another. This is of particular advantage for the necessitated signal peak recognition. Signal peak recognition automatically detects the aliasing components to be suppressed in the high-resolution DFT absolute value frequency response.

After modulating the analysis signal, the aliasing components are optimized one after the other in an alternating order. This is necessitated since the spurious components influence one another. Thus, the order is from the weakest component of the fourth order to the most dominant first order one. This ensures that the first-order aliasing components receive the largest possible attenuation. For the direct component, i.e. the spectral value for which the aliasing components are to be canceled, the filter is set to one. This value is not changed during optimization.

The actual numerical optimization is done in accordance with the principle of successive approximation illustrated. Thus, a starting value is allocated to the filter coefficient to be optimized, all the other coefficients, except for the direct component, remain zero. Subsequently, the complex MDCT/MDST spectrum is folded using this filter and the absolute value frequency response is examined as to a reduction of the respective spurious component. If this is the case, the filter coefficient will be increased in correspondence with the step size set. This method of examination and increase is repeated until a stronger suppression of this aliasing component is no longer possible. Subsequently, the following filter coefficients are treated in the same way, wherein filter coefficients optimized already are maintained.

Due to the mutual influence of the aliasing components, it is practical to perform several iterations of this process. The step size by which the filter coefficients are increased is reduced with each iteration. This means that the quality of the optimized filter increases with every pass. It is shown that three iterations are sufficient for an optimal filter set consisting of one filter each per phase angle. This allows reducing the aliasing components to <−90 dB.

Figure 11:
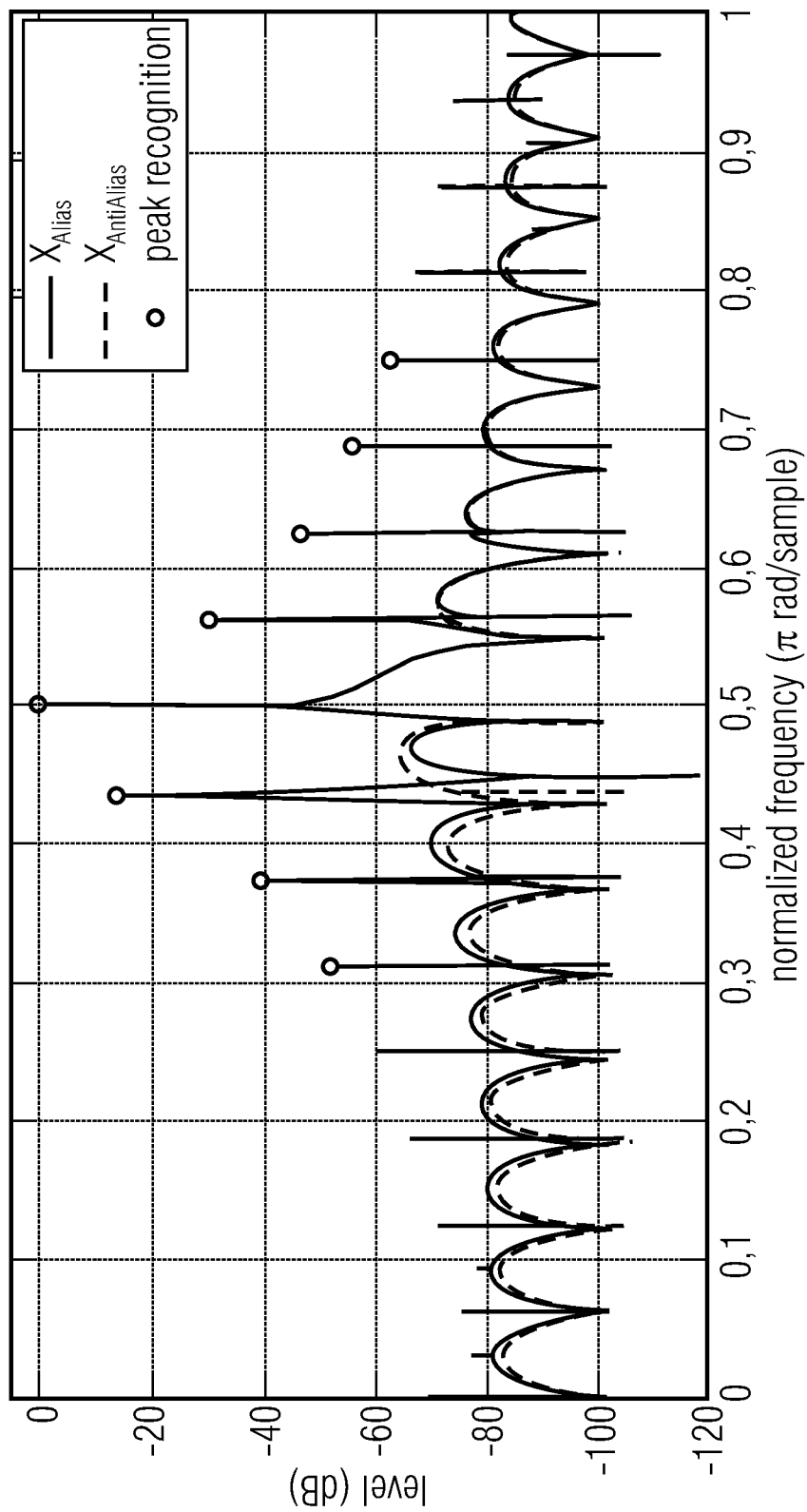
FIG. 11 shows the influence of anti-aliasing filtering on a sine signal for $\phi=90°$ in accordance with an embodiment.

FIG. 11 illustrates the influence of anti-aliasing filtering on a sine signal for $\phi=90°$. $X_{Alias}$ is a sine signal modulated by $\phi=90°$; $X_{AntiAlias}$ is a filtered signal including suppressed spurious components.

In particular, FIG. 11 shows the influence of anti-aliasing filtering on a sine signal modulated by $\phi=90°$, in the absolute value frequency response. $X_{Alias}$ is the spectrum of the modulated signal and $X_{AntiAlias}$ that of the modulated signal, folded using the optimized filter for the corresponding phase angle. The peaks in the spectrum characterized by peak recognition are the aliasing components detected by the signal peak recognition, including the direct component (fourth peak recognized from the left). In this example, the numerical optimization of the filters reduces the spurious components on average to −103 dB.

It is sufficient to establish a set of filters for each phase angle in the range of values once. For filtering the signal, the filter necessitated may then be loaded from a database.

Exemplarily, the filter coefficients of the filter may be read out from a database or a storage of a device for producing a frequency-shifted audio signal in dependence on the phase angle.

Figure 12:
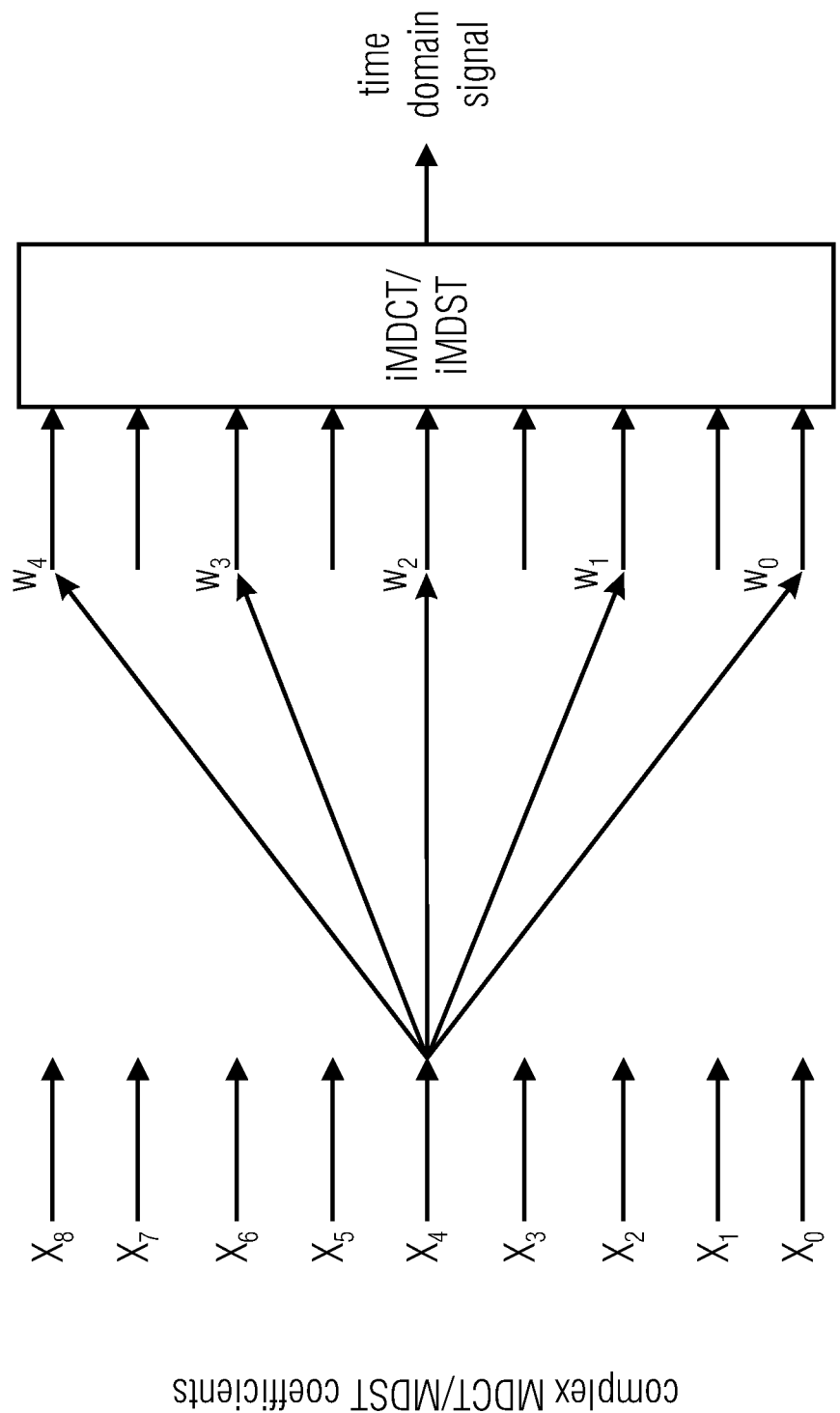
FIG. 12 shows a butterfly structure for aliasing reduction in accordance with an embodiment.

FIG. 12 shows the butterfly structure. The weights are determined by successive approximations. FIG. 12 thus shows the aliasing reduction for the subband $X_4$ (black line). The same method is to be performed correspondingly for all the modified subbands. For reducing the aliasing component caused by the modulation of $X_4$, $X_4$ is to be multiplied by the weights $w_0$ to $w_4$ and added to the subband signals $X_0$, $X_2$, $X_4$, $X_6$ and $X_8$. It must be kept in mind that the weight $w_2$ will equal 1.

Inversely, this means that in order to produce a filtered subband value of one of the subbands, a sum of the unfiltered subband value of this subband and further addends has to be formed (the weight/filter coefficient $w_2$ which would be applied to the unfiltered subband value of this subband is $w_2=1$). The further addends are weighted subband values, namely one subband value each of other subbands having been multiplied/weighted by the other weight/filter coefficients.

Reconstructing the spectral envelope will be described below.

Reconstructing the spectral envelope is done using LPC filtering. Thus, the tonal portions of the signal are removed in the encoder by a linear prediction filter and transmitted separately as LPC coefficients. The filter coefficients necessitated for this may be calculated using the Levinson-Durbin recursion (Larsen and Aarts, 2004). The result is that the baseband in the decoder obtains a white spectral characteristic. After bandwidth extension by means of HSBE, inverse filtering using the LPC coefficients is performed and thus the original spectral envelope is impressed again onto the signal.

Figure 13:
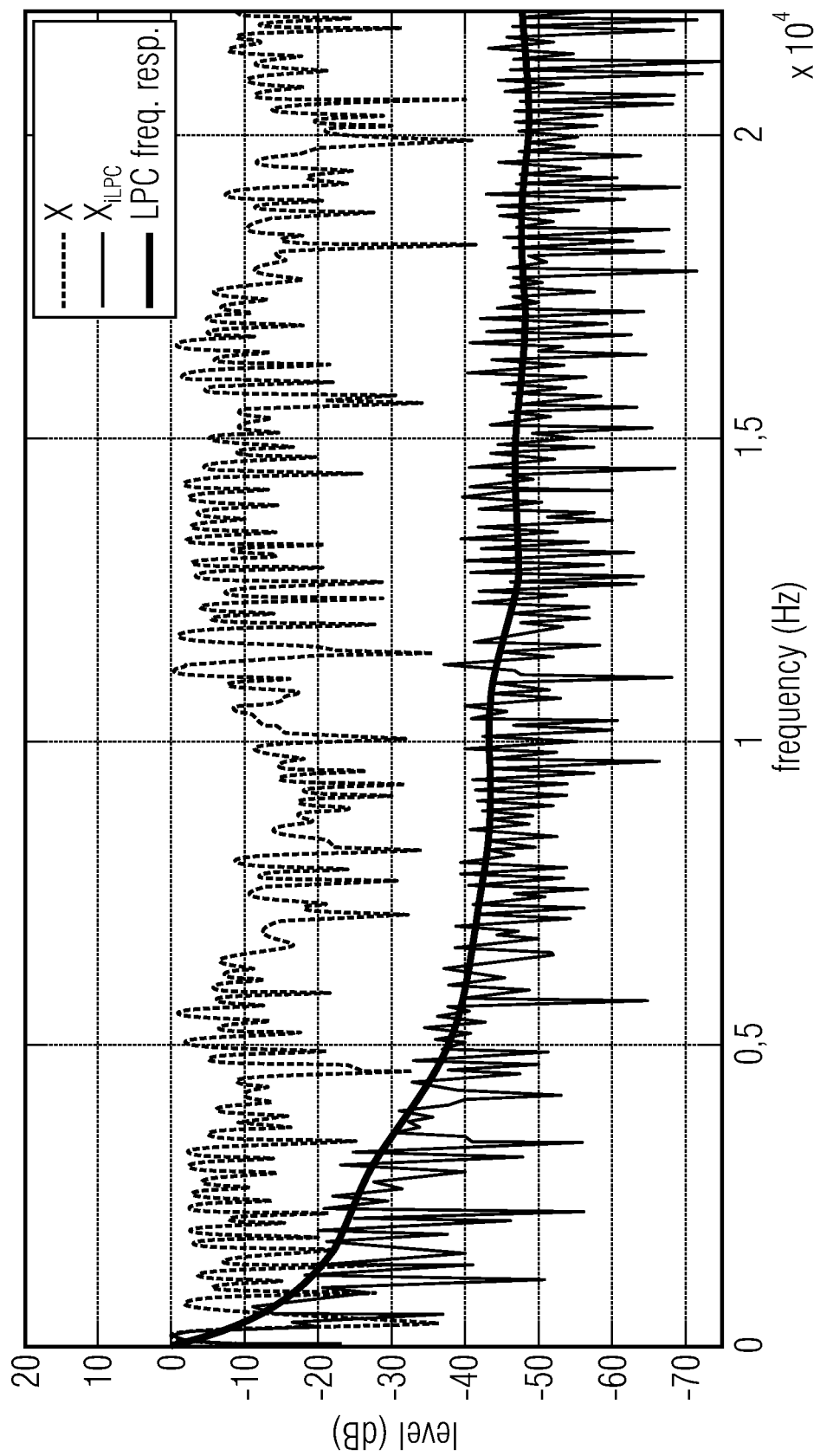
FIG. 13 shows HSBE-LPC envelope adaptation in accordance with an embodiment.

FIG. 13 shows an HSBE-LPC envelope adaptation. Thus, X represents a BWE signal before envelope adaptation. $X_{iLPC}$ is a BWE signal after envelope adaptation.

In particular, FIG. 13 shows the DFT absolute value frequency responses of a signal bandwidth-extended using HSBE. Before the reconstruction of the spectral envelope, the signal X comprises the white signal characteristic mentioned. After adaptation of the envelope by inverse LPC filtering, the envelope corresponds to the original spectral characteristic. Additionally, FIG. 13 shows the transfer function of the LPC filter used. A few filter coefficients are already sufficient for a sufficiently precise description of the spectral envelope, in this example 14 LPC filter taps are used. The envelope reconstruction is not a standard component of HSBE and may be replaced by another method.

The concepts provided will now be subjected to an evaluation. Evaluation here means both a comparison between the novel method of harmonic spectral band extension and bandwidth extension by means of CM-BWE and examination of the HSBE efficiency with regard to potentials and limits, and the algorithmic calculating complexity.

A comparison of the spectral band replication methods will be presented at first.

Bandwidth extension by means of continuous single sideband modulation is a time domain method. This means that a time signal will be necessitated for applying same. Since, after bandwidth extension, envelope and tonality adaptation take place, each necessitating a signal in the spectral domain, when applying the CM-BWE method, the bandwidth-extended signal has to be transformed back to the frequency domain. This transform to the time domain and back to the frequency domain may be omitted with harmonic spectral band extension, since same operates in the MDCT/MDST domain.

Additionally, the time signal is to be transferred to an analysis signal before applying the continuous single sideband modulation. Calculating the analysis signal necessitated is problematic since this is realized using a Hilbert transformer. The ideal transfer function of the Hilbert transform is the sign function. This function can be represented in the time domain only by a filter of infinite length. When using a realizable filter of a finite impulse response, the ideal Hilbert transformer may only be approximated. In addition, the signal is not of a perfectly analytical character after the approximated Hilbert transform. The quality of the pseudo-analytical signal calculated is thus dependent on the length of the filter used.

Applying the harmonic spectral band extension also necessitates an additional transform. Since HSBE operates in the frequency domain, a complex spectrum is necessitated for calculating the phase modulation. However, before applying the bandwidth extension, only MDCT coefficients are present in the decoder structure. Thus, the MDCT coefficients need to be transferred to the MDST domain in order to obtain a complex spectrum and thus obtain the phase information necessitated. This is exemplarily considered here to be realized using a matrix multiplication having formed by simplifying an inverse MDCT transform and a subsequent MDST transform. As has been shown, the calculating complexity necessitated for this can be minimized enormously, wherein nevertheless a precise calculation of the MDST coefficients may be performed.

When considering the schematic setup of the absolute value frequency response after applying CM-BWE and HSBE, it can be seen that part of the spectrum in CM-BWE has to be filled up with white noise. The harmonic structure in this part is lost since individual harmonic sub-tones cannot be replicated here. This problem does not arise when applying HSBE. The harmonic structure is continued without any gaps.

The complexity of harmonic spectral band extension will be considered below.

The efficiency of the novel harmonic spectral band extension is dependent on the calculating complexity and memory space necessitated. Examining these factors is based on implementing the algorithm in the programming language C. With the algorithmic realization, much emphasis is put on minimizing the number of calculating steps. However, transforming the MDCT coefficients to MDST spectral values and anti-aliasing filtering are among the most calculating-complex steps. Modulation to form a harmonically correct replication of the spectrum is relatively easy since shifting by the modulation index $\tau$ only corresponds to a copying process and the phase rotation by the angle $\phi$ may be reduced to a complex multiplication per spectral value. Adaptation of the spectral envelope is not taken into consideration here. Since this is not a part of the HSBE method which is important for evaluation purposes, it is not realized algorithmically.

All the relevant instructions, like additions (ADD), multiplications (MULT), and the multiply-and-accumulate (MAC) instructions performed in anti-aliasing filtering are considered in the evaluation. Table 5.1 is a summary of the results for the modulation and filtering of the spectrum. They refer to the function local_HSBEpatching( ) in which the corresponding algorithms are implemented.

TABLE 5.1

| | N | | | | | | | | | | |
|---|---|---|---|---|---|---|---|---|---|---|---|
| | 2 | 4 | 8 | 16 | 32 | 64 | 128 | 256 | 512 | 1024 | 2048 |
| ADD | 4 | 8 | 16 | 32 | 64 | 128 | 256 | 512 | 1024 | 2048 | 4096 |
| ABS | 1 | 1 | 1 | 1 | 1 | 1 | 1 | 1 | 1 | 1 | 1 |
| MULT | 6 | 12 | 24 | 48 | 96 | 192 | 384 | 768 | 1536 | 3042 | 6144 |
| MAC | 16 | 32 | 64 | 128 | 256 | 512 | 1024 | 2048 | 4096 | 8192 | 16384 |

Table 5.1 illustrates the complexity of HSBE modulation and anti-aliasing filtering in a table. The listing contains the number of relevant operations in dependence on the transform length N. A total of 10241 operations are necessitated for modulating the spectrum for N=2048, among which are 2N additions and 3N multiplications. The aliasing cancelation necessitated is much more complex. 16384 MAC operations are performed here. This corresponds to the number of non-zero elements of the anti-aliasing filter multiplied by the transform length, i.e. in this case 8N (cf. explanations relating to anti-aliasing filtering above). with this result, a linear context with the complexity o(N)·results for the calculating complexity of the modulation and AAF.

Figure 14:
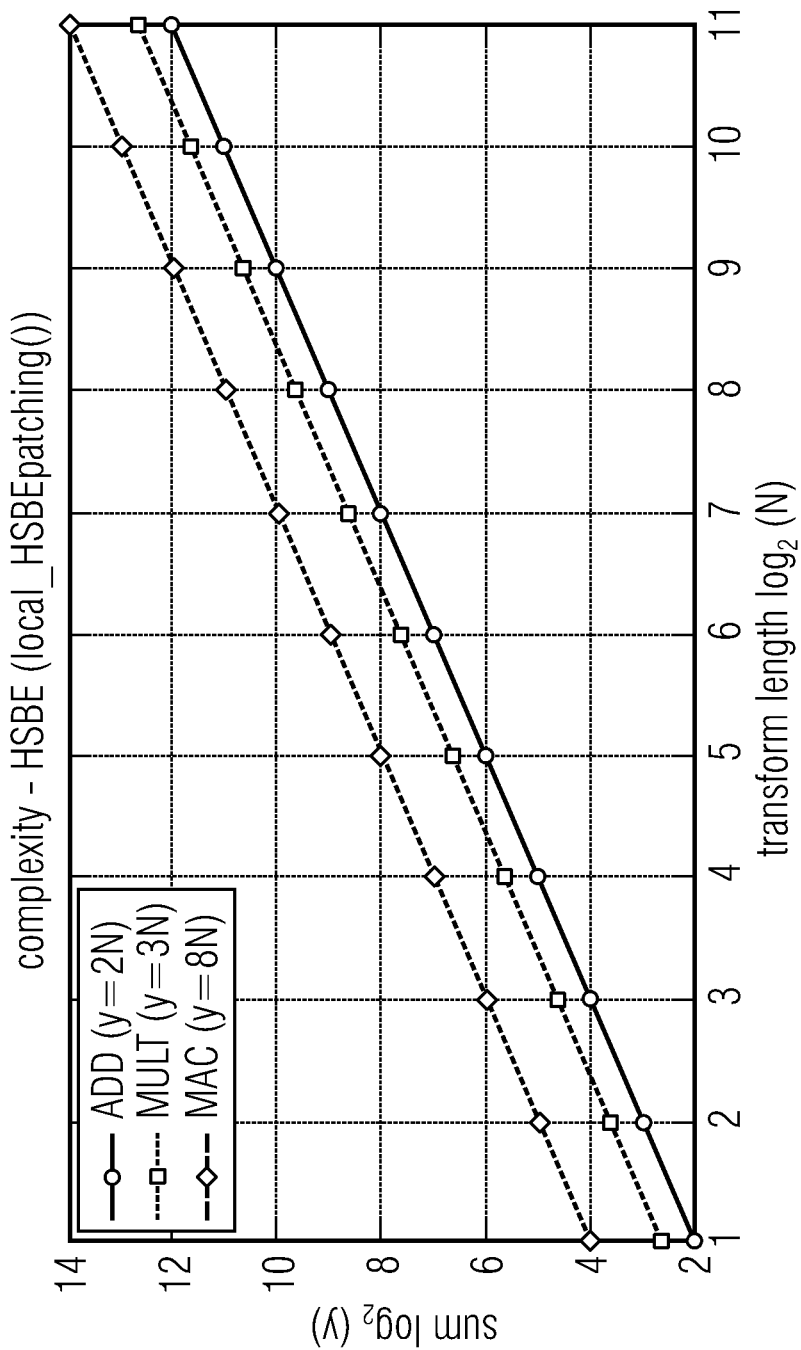
FIG. 14 shows the complexity of modulation and anti-aliasing filtering in HSBE.

FIG. 14 is a graphical illustration of this context. FIG. 14 thus illustrates the complexity of HSBE modulation and anti-aliasing filtering.

A central element of harmonic spectral band extension is transforming the signal by means of MDCT and MDST. Similarly to the fast Fourier transform, a fast algorithm is used for these transforms as well. The structure of the underlying fast DCT-IV will be discussed further below. The results of the evaluation relate to the function fmdcst1d( ) in which the fast MDCT/MDST is implemented in accordance with the polyphase approach described before. The analysis of MDCT and MDST is summarized in Table 5.2.

TABLE 5.2

Complexity of fast MDCT/MDST

| | N | | | | |
|---|---|---|---|---|---|
| | 2 | 8 | 32 | 128 | 512 | 2048 |
| ADD | 5 | 106 | 1046 | 6630 | 35974 | 181094 |
| MULT | 7 | 40 | 204 | 956 | 4348 | 19452 |

When evaluating these results, one can see that a total of approximately 9~N ld N operations are necessitated for calculating an MDCT/MDST. N multiplications more are performed in the inverse transform. The reason for this is that the scaling necessitated for transforming is performed here. The corresponding evaluation is summarized in Table 5.3.

TABLE 5.3

Complexity of fast inverse MDCT/MDST

| | N | | | | |
|---|---|---|---|---|---|
| | 2 | 8 | 32 | 128 | 512 | 2048 |
| ADD | 5 | 106 | 1046 | 6630 | 35974 | 181094 |
| MULT | 9 | 48 | 236 | 1084 | 4860 | 21500 |
| DIV | 1 | 1 | 1 | 1 | 1 | 1 |

The result is a complexity of o(N log N) for the forward and inverse transforms. The algorithm implemented thus fulfils, as expected, the requirements for a fast transform. The results of this evaluation are shown in FIG. 15.

Figure 15:
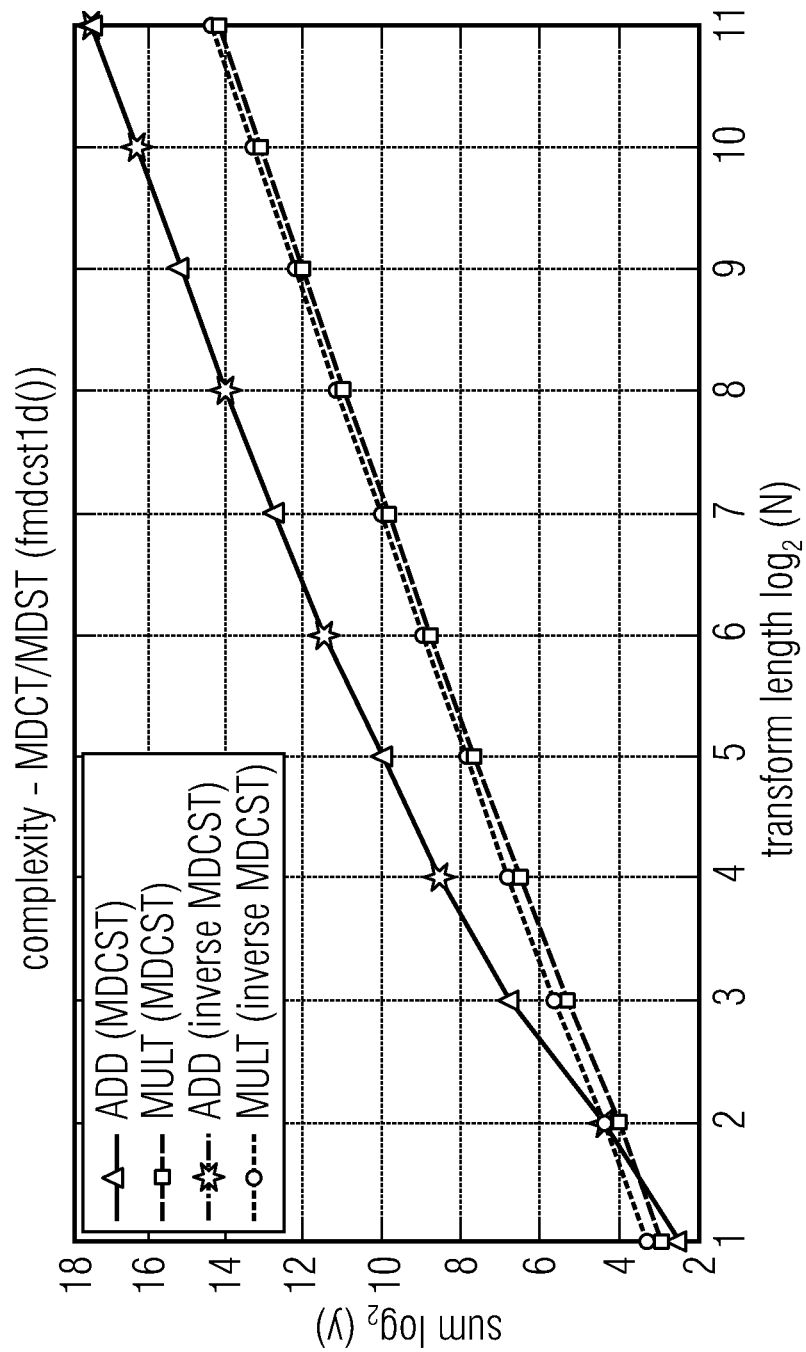
FIG. 15 shows the complexity of fast MDCT/MDST.

FIG. 15 shows the complexity of the fast MDCT/MDST. It must be kept in mind that two inverse transforms need to be calculated for transferring the signal from the complex MDCT/MDST domain to the time domain. The number of operations necessitated doubles.

The precise transfer of MDCT coefficients to MDST spectral values is the most calculating-complex process in HSBE. Not only does a constant delay of one block form here, but also the longest calculating time. Even when the complexity necessitated is reduced by the method introduced, this results in the largest number of operations, as is summarized in Table 5.4.

TABLE 5.4

Complexity of precise MDCT/MDST transform

| | N | | | | |
|---|---|---|---|---|---|
| | 2 | 8 | 32 | 128 | 512 | 2048 |
| ADD | 6 | 120 | 2016 | 32640 | 523776 | 8386560 |
| MULT | 12 | 144 | 2112 | 33024 | 525312 | 8392704 |

Figure 16:
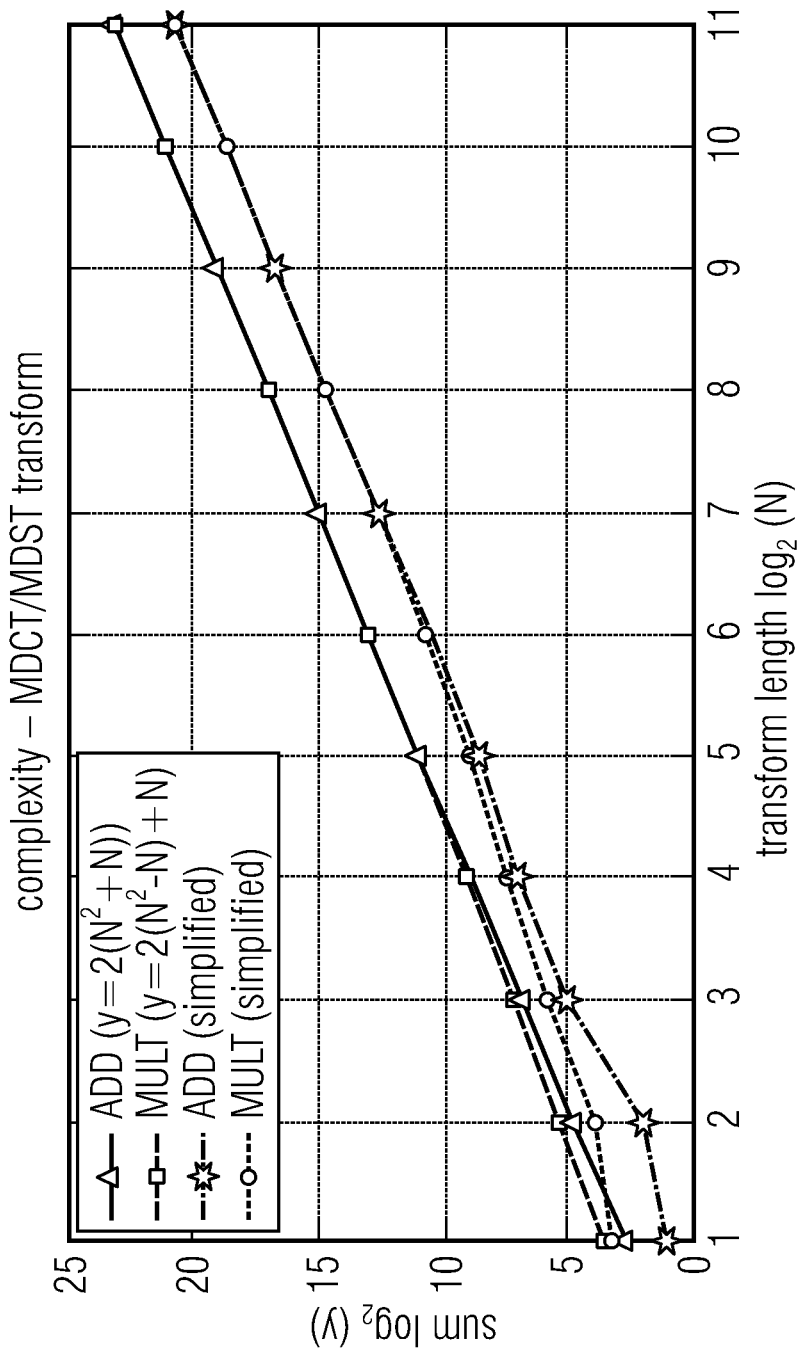
FIG. 16 is an illustration of the complexity of the MDCT-MDST transform.

For the multiplication of the fully occupied matrices, both $H_0$ and $H_2$ to the spectral vector, a total of $N^2$ multiplications and $N(N-1)$ additions each are necessitated. The sparsely occupied matrix $H_1$ allows an efficient implementation so that 2N multiplications and N additions need to be performed here. For the precise transfer of the MDCT values to MDST coefficients, a total number of $4N^2+N$ additions and multiplications are calculated. For the complexity of the algorithm implemented, there is a square dependence on the transform length. This may be expressed by $o(N^2)$. The simplified method necessitates fewer operations, approximately by the ratio $2\sigma+1/N$. The corresponding context is illustrated in FIG. 16. Thus, FIG. 16 shows the complexity of the MDCT/MDST transform.

Apart from the algorithmic complexity, memory utilization has an important role when considering efficiency. Depending on the terminal device on which the audio decoder is implemented, only a very limited amount of storage may be available. Thus, utilization of the main storage has to be kept as low as possible. Table 5.5 lists the resources used. The module description is directed to the C source file of the same name. Only the most important buffers necessitated for storing and processing signal vectors and matrices are considered here.

TABLE 5.5

Memory utilization by HSBE:

| module | elements | size in bytes | size in KiB |
|---|---|---|---|
| hsbelib | 20480 | 81920 | 80 |
| Hmatrix | 4194304 | 16777216 | 16384 |
| | (205) | (820) | (0.80) |
| hsbeConv | 15 | 60 | 0.05 |
| fastDCSTIV | 3072 | 12288 | 12 |
| fastDCSTIII | 4096 | 16384 | 16 |
| AAF database | 2715 | 10860 | 10.61 |
| total | 4224682 | 16898728 | 16502.66 |
| | (30583) | (122332) | (119.46) |

Information in ( ): contains the simplified calculation of the MDCT/MDST transform.

The implementation of the harmonic spectral band extension is based on the single-precision floating-point arithmetics, which means that a floating-point number is represented by 32 bits. The number indicated in Table 5.5 relates to the number of floating-point numbers necessitated in this module. As can be gathered from the table, the memory utilization for the actual HSBE algorithm is comparatively small with approximately 109 KiB for modulation, aliasing cancelation and MDCT/MDST. The database for the anti-aliasing filters is also stored as a look-up table and necessitates almost 11 KiB for the total number of 2715 filter coefficients. Of decisive influence for the memory space requirement is the transform matrix $H_0$. Approximately 16 MiB of working memory are used for this matrix. The memory requirements of the matrix $H_0$ are reduced enormously by the simplifications of the MDCT/MDST transform presented before. For the example taken with $\sigma=[0, 1 \cdot N]$ only about 0.8 KiB working memory are consumed here.

Using the technology presented, the bandwidth extension by means of harmonic spectral band extension provided here allows a harmonically correct extension of the spectrum. Subsequently, the potentials and limits of the concepts provided will be discussed.

Generally, signals of different lengths may be processed. However, for calculating the fast MDCT/MDST implemented, it is absolutely necessitated for the transform length N to be a positive integer power of the number two. The maximum block length possible is, similarly to AAC, limited to $2^{11}$, i.e. 2048. With HSBE, it is also possible to vary the block length during run time. This is in particular necessitated for transient treatment in modern audio encoders. The SNR is determined decisively by the block length.

Large transform lengths tend to result in a better result than very short block lengths. This is caused by the aliasing components occurring due to the modulation. Spurious components up to the fourth order are suppressed by the anti-aliasing filtering, but nevertheless some undesired components remain in the signal. With very short block lengths, these aliasing components extend over a large bandwidth and are clearly audible. With large transform lengths, the bandwidth becomes correspondingly smaller and the aliasing components are masked. A block length of 256 has turned out to be a limit in different trials. From this length on, the artefacts are hardly perceived, as is shown in FIG. 17.

Figure 17:
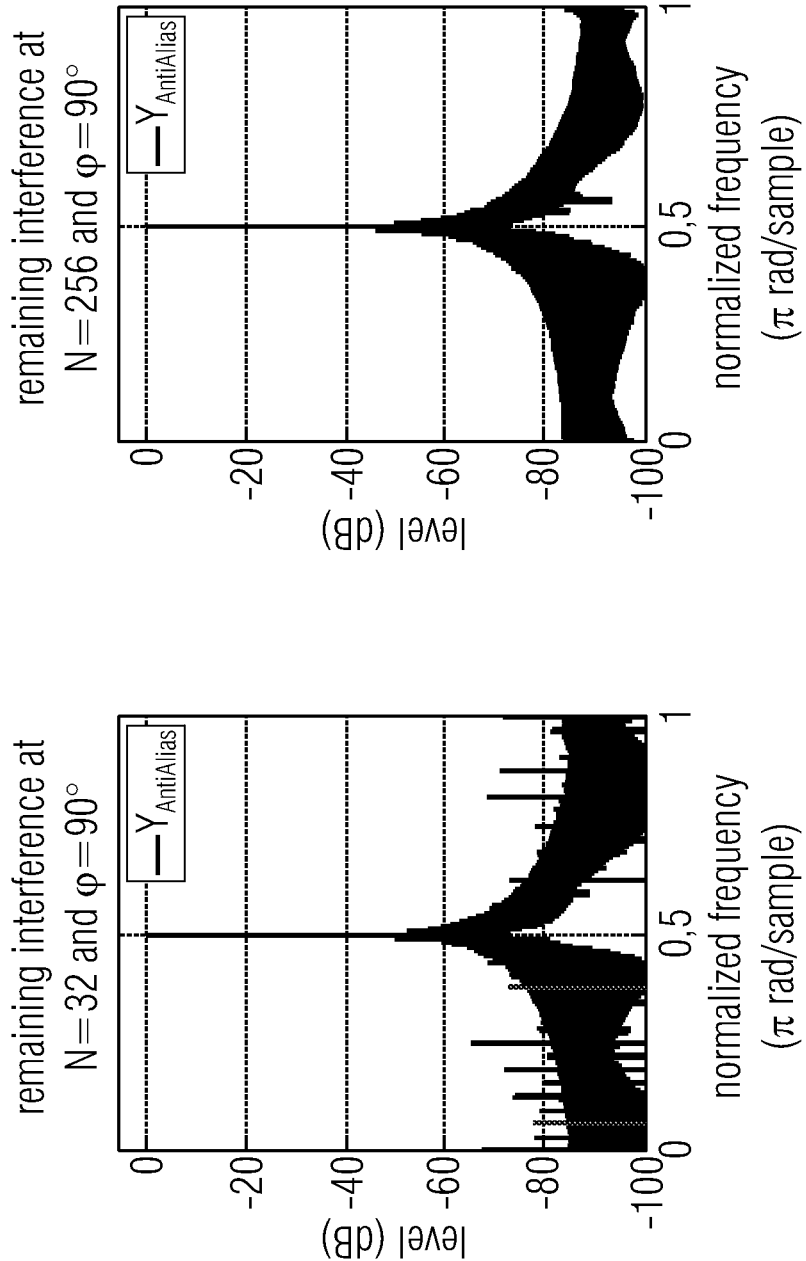
FIG. 17 shows a remaining disturbance in HSBE in dependence on the transform length.

FIG. 17 shows an interference remaining in HSBE, in dependence on the transform length. FIG. 17 shows a spectrum after inverse MDCT with N=32 and φ=90 on the left. FIG. 17 shows a spectrum after inverse MDCT with N=256 and φ=90 on the right.

What can be seen are the absolute value frequency responses of a sine signal modulated with the phase angle φ. As can be recognized clearly, with small block sizes (left in FIG. 17), there are clearly spurious components after the aliasing cancelation. They are in a range of approximately −70 dB and are decisive for the SNR. With block sizes larger than 256 (right in FIG. 17), these portions are masked by the useful signal.

All in all, the harmonic spectral band extension provides a highly precise reconstruction of the harmonic structure of the signal. For a transform length of 2156 and a sampling frequency for the audio data corresponding to the CD standard of 44100 Hz, the resolution of the method developed is in the range of approximately 0.5 Hz. This means that the spectrum can be modulated with a precision of half a Hertz. With smaller sampling frequencies or larger block lengths, the resolution increases and the modulation may be performed in even more accurate ranges. The result of applying HSBE to a multi-sine signal is illustrated in FIG. 18.

Figure 18:
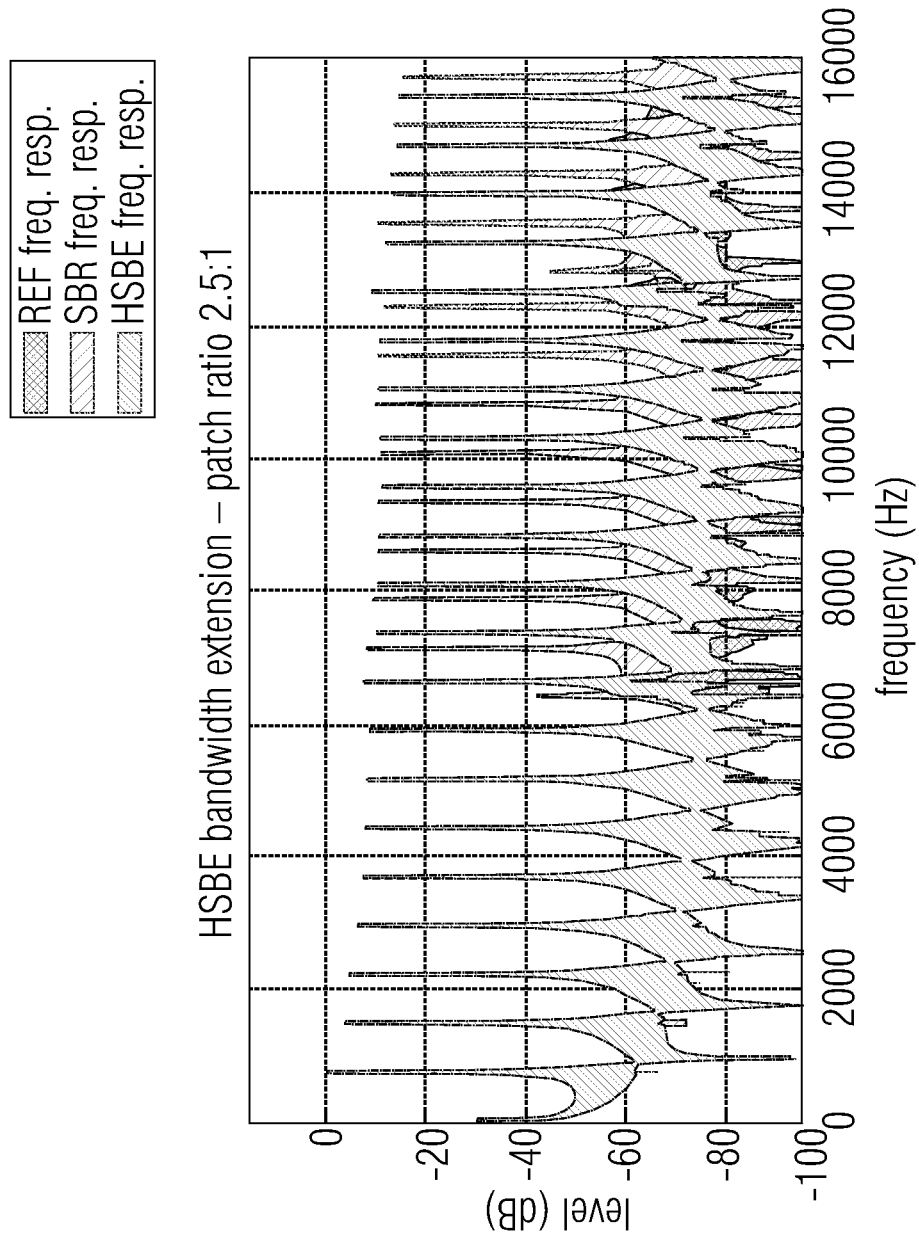
FIG. 18 shows a comparison of HSBE and SBR.

FIG. 18 shows a comparison of HSBE and SBR. REF freq. resp. refers to a spectrum of the original multi-sine signal. SBR freq. resp. refers to a signal bandwidth extended by means of SBR; HSBE freq. resp. refers to a signal bandwidth extended by means of HSBE.

As can be recognized in the absolute value frequency responses shown, the spectrum is reconstructed precisely using the HSBE method developed. After processing the band-limited signal using HSBE (HSBE freq. resp.), the spectrum is precisely above the original spectrum (REF freq. resp.). The corresponding spectrum not having been adapted harmonically (SBR freq. resp.) is shown for comparative purposes. This signal is calculated using the HSBE algorithm, but the underlying lag frequency is zero. This causes a bandwidth extension which basically corresponds to the SBR method. Shifting the harmonic structure at the cutoff frequency $f_g$=6400 Hz and double this frequency can be seen clearly here.

Derivations thereof will be provided below.

At first, the transfer of DFT to DCT-II is derived. In particular, DCT-II is derived from the DFT in equation 2.10 using equation 2.12 (see also Rao and Yip, 2001). The following applies:

$$\tilde{X}[k] = \sum_{n=0}^{2N-1} \tilde{x}[n] e^{-j\frac{2\pi}{2N}kn} \quad (A.1a)$$

$$= \sum_{n=0}^{N-1} \tilde{x}[n]\left[e^{-j\frac{\pi}{N}kn} + e^{-j\frac{\pi}{N}k(2N-1-n)}\right] \quad (A.1b)$$

$$= \sum_{n=0}^{N-1} \tilde{x}[n] e^{-j\frac{\pi}{2N}k}\left[e^{-j\frac{\pi}{N}k(n+0.5)} + e^{-j\frac{\pi}{N}k(2N-0.5-n)}\right] \quad (A.1c)$$

$$= 2e^{j\frac{\pi}{2N}k} \sum_{n=0}^{N-1} \tilde{x}[n]\cos\left(\frac{\pi(n+0.5)k}{N}\right), \forall k \in [0, N-1] \quad (A.1d)$$

with $e^{-j\frac{\pi}{N}k(n+0.5)} + e^{-j\frac{\pi}{N}k(2N-0.5-n)} = \ldots$ (A.2a)

$$= \cos\left(\frac{\pi}{N}k(n+0,5)\right) -$$
$$j\sin\left(\frac{\pi}{N}k(n+0,5)\right) + \cdots +$$
$$\cos\left(\frac{\pi}{N}k(2N-0,5-n)\right) -$$
$$j\sin\left(\frac{\pi}{N}k(2N-0,5-n)\right)$$

$$= \cos\left(k\left(\frac{\pi}{N}n+0,5\frac{\pi}{N}\right)\right) + \cos\left(-k\left(\frac{\pi}{N}n+0,5\frac{\pi}{N}\right) + 2\pi k\right) + \cdots - \quad (A.2b)$$
$$j\sin\left(k\left(\frac{\pi}{N}n+0,5\frac{\pi}{N}\right)\right) - j\sin\left(-k\left(\frac{\pi}{N}n+0,5\frac{\pi}{N}\right) + 2\pi k\right)$$

$$= 2\cos\left(\frac{\pi}{N}k(n+0,5)\right) \quad (A.2c)$$

and the properties of the sine and cosine functions:

$$\cos(-x)=\cos(x) \quad (A.3a)$$

$$\cos(2\pi+x)=\cos(x) \quad (A.3b)$$

$$\sin(-x)=-\sin(x) \quad (A.3c)$$

$$\sin(2\pi+x)=\sin(x) \quad (A.3d)$$

This connection may also be used to calculate the DCT effectively using the FFT (see also Ahmed et al., 1974).

Folding matrices will be discussed below.

The folding matrices $F_a$ and $F_s$ necessitated for calculating the MCDT (cf. equation 2.35) are composed of a delay matrix $D$ and the window matrix $F$. The window matrix contains the coefficients of the window function w[n], arranged in a diamond structure. The following applies:

$$F_a = D \cdot F \quad (A.4a)$$

$$= \begin{bmatrix} 0 & w\left[\frac{N}{2}-1\right]z^{-1} & w\left[\frac{N}{2}\right]z^{-1} & 0 \\ \cdot^{\cdot^{\cdot}} & & & \cdot_{\cdot_{\cdot}} \\ w[0]z^{-1} & 0 & & w[N-1]z^{-1} \\ w[N] & & & -w[2N-1] \\ \cdot_{\cdot_{\cdot}} & & & \cdot^{\cdot^{\cdot}} \\ 0 & w\left[N+\frac{N}{2}-1\right] & -w\left[N+\frac{N}{2}\right] & 0 \end{bmatrix} \quad (A.4b)$$

(A.4c)

$$F_s = F^T \cdot D^{-1} \quad (A.5a)$$

-continued $$= \begin{bmatrix} 0 & w[0] & w[N]z^{-1} & & & 0 \\ & \ddots & & & \ddots & \\ w\left[\frac{N}{2}-1\right] & 0 & & & w\left[N+\frac{N}{2}-1\right]z^{-1} \\ w\left[\frac{N}{2}\right] & & & & -w\left[N+\frac{N}{2}\right]z^{-1} \\ & \ddots & & & \ddots & \\ 0 & w[N-1] & -w[2N-1]z^{-1} & & & 0 \end{bmatrix} \quad (A.5b)$$

with:

$$F = \begin{bmatrix} 0 & w\left[\frac{N}{2}-1\right] & w\left[\frac{N}{2}\right] & & & 0 \\ & \ddots & & & \ddots & \\ w[0] & 0 & & & w[N-1] \\ w[N] & & & & -w[2N-1] \\ & \ddots & & & \ddots & \\ 0 & w\left[N+\frac{N}{2}-1\right] & -w\left[N+\frac{N}{2}\right] & & & 0 \end{bmatrix} \text{ and:} \quad (A.6)$$

$$D = \begin{bmatrix} z^{-1} & & & & 0 \\ & \ddots & & & \\ & & z^{-1} & & \\ & & & 1 & \\ & & & & \ddots \\ 0 & & & & & 1 \end{bmatrix} \quad (A.7a)$$

$$D^{-1} = \begin{bmatrix} 1 & & & & 0 \\ & \ddots & & & \\ & & 1 & & \\ & & & z^{-1} & \\ & & & & \ddots \\ 0 & & & & & z^{-1} \end{bmatrix} \quad (A.7b)$$

In order to preserve causality, the inverse delay matrix $D^{-1}$ has been multiplied by the delay $z^{-1}$. This is the origin of the delay of the MDCT filter bank (Schuller and Smith, 1996).

Transform Matrix H

The transform matrix $H$ is necessitated for transferring the MDCT spectrum to the respective MDST spectrum. The following applies:

$$H = T_{DST} \cdot D \cdot F_{sin} \cdot F^T \cdot D^{-1} \cdot T^{-1} \quad (A.8)$$

The detailed decomposition will be shown using the example of N=4:

$$T' = \begin{bmatrix} a_{1,1} & a_{1,2} & a_{1,3} & a_{1,4} \\ a_{2,1} & a_{2,2} & a_{2,3} & a_{2,4} \\ a_{3,1} & a_{3,2} & a_{3,3} & a_{3,4} \\ a_{4,1} & a_{4,2} & a_{4,3} & a_{4,4} \end{bmatrix} \cdot \begin{bmatrix} z^{-1} & 0 & 0 & 0 \\ 0 & z^{-1} & 0 & 0 \\ 0 & 0 & 1 & 0 \\ 0 & 0 & 0 & 1 \end{bmatrix} \quad (A.9a)$$

$$= \begin{bmatrix} a_{1,1}z^{-1} & a_{1,2}z^{-1} & a_{1,3} & a_{1,4} \\ a_{2,1}z^{-1} & a_{2,2}z^{-1} & a_{2,3} & a_{2,4} \\ a_{3,1}z^{-1} & a_{3,2}z^{-1} & a_{3,3} & a_{3,4} \\ a_{4,1}z^{-1} & a_{4,2}z^{-1} & a_{4,3} & a_{4,4} \end{bmatrix} = T_{DST} \cdot D$$

$$F' = \begin{bmatrix} 0 & -w[1] & w[2] & 0 \\ -w[0] & 0 & 0 & w[3] \\ w[4] & 0 & 0 & w[7] \\ 0 & w[5] & w[6] & 0 \end{bmatrix} \cdot \begin{bmatrix} 0 & w[0] & w[4] & 0 \\ w[1] & 0 & 0 & w[5] \\ w[2] & 0 & 0 & -w[6] \\ 0 & w[3] & -w[7] & 0 \end{bmatrix} \quad (A.9b)$$

$$= \begin{bmatrix} w'_{1,1} & 0 & 0 & w'_{1,4} \\ 0 & w'_{2,2} & w'_{2,3} & 0 \\ 0 & w'_{3,2} & w'_{3,3} & 0 \\ w'_{4,1} & 0 & 0 & w'_{4,4} \end{bmatrix} = F_{sin} \cdot F^T$$

$$T'^{-1} = \begin{bmatrix} 1 & 0 & 0 & 0 \\ 0 & 1 & 0 & 0 \\ 0 & 0 & z^{-1} & 0 \\ 0 & 0 & 0 & z^{-1} \end{bmatrix} \cdot \begin{bmatrix} b_{1,1} & b_{1,2} & b_{1,3} & b_{1,4} \\ b_{2,1} & b_{2,2} & b_{2,3} & b_{2,4} \\ b_{3,1} & b_{3,2} & b_{3,3} & b_{3,4} \\ b_{4,1} & b_{4,2} & b_{4,3} & b_{4,4} \end{bmatrix} \quad (A.9c)$$

$$= \begin{bmatrix} b_{1,1} & b_{1,2} & b_{1,3} & b_{1,4} \\ b_{2,1} & b_{2,2} & b_{2,3} & b_{2,4} \\ b_{3,1}z^{-1} & b_{3,2}z^{-1} & b_{3,3}z^{-1} & b_{3,4}z^{-1} \\ b_{4,1}z^{-1} & b_{4,2}z^{-1} & b_{4,3}z^{-1} & b_{4,4}z^{-1} \end{bmatrix} = D^{-1} \cdot T^{-1}$$

The matrices with the delay elements $z^{-1}$ may be represented to be additions of two matrices each. The following will result:

$$T'(z) = T'(z^0) + T'(z^{-1}) = \quad (A.10a)$$

$$\begin{bmatrix} 0 & 0 & a_{1,3} & a_{1,4} \\ 0 & 0 & a_{2,3} & a_{2,4} \\ 0 & 0 & a_{3,3} & a_{3,4} \\ 0 & 0 & a_{4,3} & a_{4,4} \end{bmatrix} + \begin{bmatrix} a_{1,1}z^{-1} & a_{1,2}z^{-1} & 0 & 0 \\ a_{2,1}z^{-1} & a_{2,2}z^{-1} & 0 & 0 \\ a_{3,1}z^{-1} & a_{3,2}z^{-1} & 0 & 0 \\ a_{4,1}z^{-1} & a_{4,2}z^{-1} & 0 & 0 \end{bmatrix}$$

$$T'^{-1}(z) = T'^{-1}(z^0) + T'^{-1}(z^{-1}) = \begin{bmatrix} b_{1,1} & b_{1,2} & b_{1,3} & b_{1,4} \\ b_{2,1} & b_{2,2} & b_{2,3} & b_{2,4} \\ 0 & 0 & 0 & 0 \\ 0 & 0 & 0 & 0 \end{bmatrix} + \quad (A.10b)$$

$$\begin{bmatrix} 0 & 0 & 0 & 0 \\ 0 & 0 & 0 & 0 \\ b_{3,1}z^{-1} & b_{3,2}z^{-1} & b_{3,3}z^{-1} & b_{3,4}z^{-1} \\ b_{4,1}z^{-1} & b_{4,2}z^{-1} & b_{4,3}z^{-1} & b_{4,4}z^{-1} \end{bmatrix}$$

Using this decomposition and the matrix $F'$, equation A.8 may be expressed as follows:

$$H(z) = T'(z) \cdot F' \cdot T'^{-1}(z) \quad (A.11a)$$

$$= (T'(z^0) + T'(z^{-1})) \cdot F' \cdot (T'^{-1}(z^0) + T'^{-1}(z^{-1})) \quad (A.11b)$$

$$= (T'(z^0) \cdot F' + T'(z^{-1}) \cdot F') \cdot (T'^{-1}(z^0) + T'^{-1}(z^{-1})) \quad (A.11c)$$

$$= T'(z^0) \cdot F' \cdot T'^{-1}(z^0) + T'(z^{-1}) \cdot F' \cdot T'^{-1}(z^0) + \cdots + \quad (A.11d)$$
$$T'(z^0) \cdot F' \cdot T'^{-1}(z^{-1}) + T'(z^{-1}) \cdot F' \cdot T'^{-1}(z^{-1})$$

The individual terms of the equation are then substituted using their dependence on z:

$$H(z^0) = T'(z^0) \cdot F' \cdot T'^{-1}(z^0) \quad (A.12a)$$

$$H(z^{-1}) = T'(z^{-1}) \cdot F' \cdot T'^{-1}(z^0) + T'(z^0) \cdot F' \cdot T'^{-1}(z^{-1}) \quad (A.12b)$$

$$H(z^{-2}) = T'(z^{-1}) \cdot F' \cdot T'^{-1}(z^{-1}) \quad (A.12c)$$

and inserted into equation A.11a:

$$H(z)=H(z^0)+H(z^{-1})+H(z^{-2}) \quad (A.13)$$

the result being the simplified notation from equation 4.7:

$$H=H_0 z^0 + H_1 z^{-1} + H_2 z^{-2} \quad (A.14)$$

The numerical analysis of the three sub-matrices $H_0$, $H_1$ and $H_2$ provides some important realizations which contribute to reducing the calculating complexity of the matrix $H$ considerably. It will be noticed at first that $H_1$ is a weakly occupied matrix. It will exhibit the same form for different transform lengths N and includes elements 0.5 and −0.5 exclusively. The following applies:

$$H_1 = \begin{bmatrix} 0,5 & -0,5 & 0 & & \cdots & & 0 \\ 0,5 & 0 & -0,5 & 0 & & & \\ 0 & 0,5 & 0 & -0,5 & 0 & & \vdots \\ & \ddots & \ddots & \ddots & \ddots & \ddots & \\ \vdots & & 0 & 0,5 & 0 & -0,5 & 0 \\ & & & 0 & 0,5 & 0 & -0,5 \\ 0 & & \cdots & & 0 & 0,5 & 0,5 \end{bmatrix} \quad (A.15)$$

There is a direct connection between the matrices $H_0$ and $H_2$, resulting in:

$$H_2 = \pi_N \cdot H_0^T \cdot \pi_N \quad (A.16)$$

with:

$$\pi_N = \begin{bmatrix} 0 & \cdots & 0 & 1 \\ 0 & \cdots & 1 & 0 \\ \vdots & \ddots & \vdots & \vdots \\ 1 & \cdots & 0 & 0 \end{bmatrix} \quad (A.17)$$

Thus, $\pi_N$ is an N×N matrix which, multiplying from the left, reverses the order of the lines and, multiplying from the right, reverses the order of the columns. Thus, equation A.16 may be interpreted to be a reflection of the values of the matrix $H_0$ relative to its secondary diagonals. Using these properties, the complexity necessitated for calculating $H$ may be reduced from originally $4N^3$ operations necessitated (cf. equation A.11d) to a fourth thereof.

Figure 19:
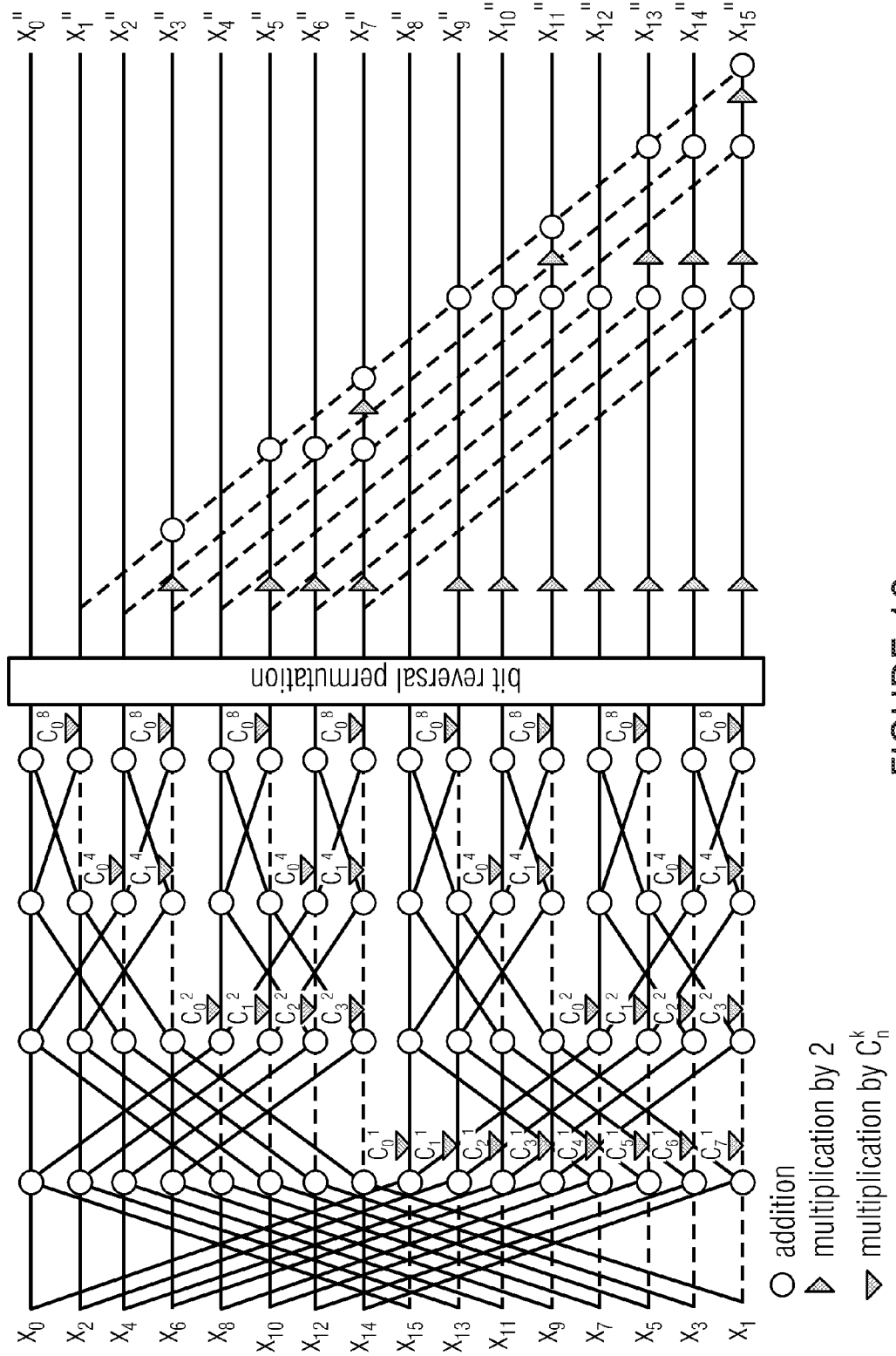
FIG. 19 shows a fast universal DCT-III/DST-III structure.

Fast DCT-IV will be discussed below. Implementing the DCT-IV is dependent on the algorithm of the fast DCT-IV. The advantage of this realization is the efficient calculation of the transform and the short algorithmic delay connected thereto. The core of the DCT-IV are two DCT-III transforms in accordance with equation 2.14c connected in parallel. Similarly to the FFT, it is composed of a so-called butterfly structure and a pipeline structure (Rao and Yip, 2001). The complexity of this algorithm is o(N log N) and is comparable to the necessitated calculating complexity of the FFT. The specific setup of the DCT-III is illustrated in FIG. 19. In particular, FIG. 19 illustrates a fast universal DCT-III/DST-III structure (Rao and Yip, 2001).

Figure 20:
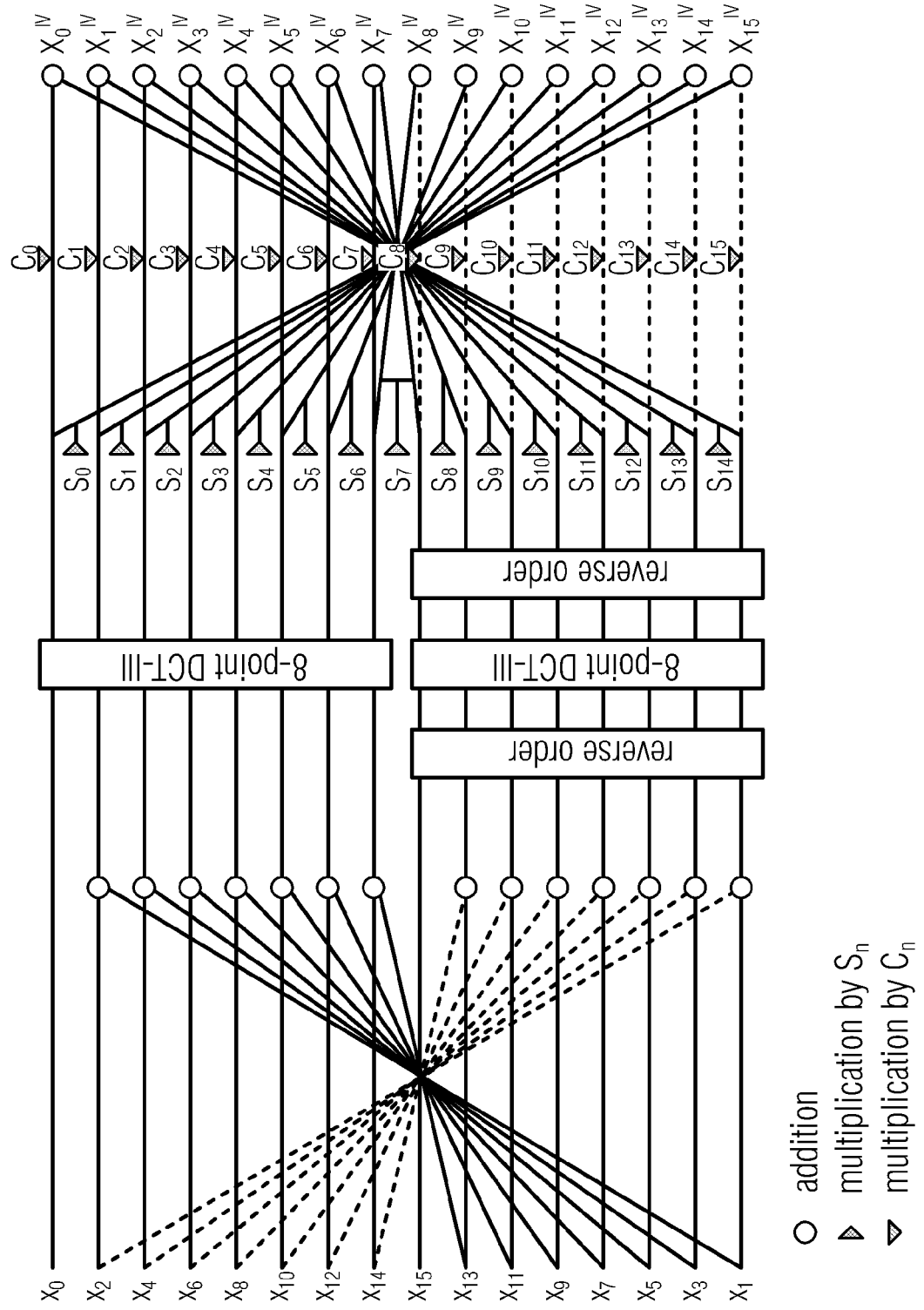
FIG. 20 shows a fast DCT-IV structure.
Figure 21:
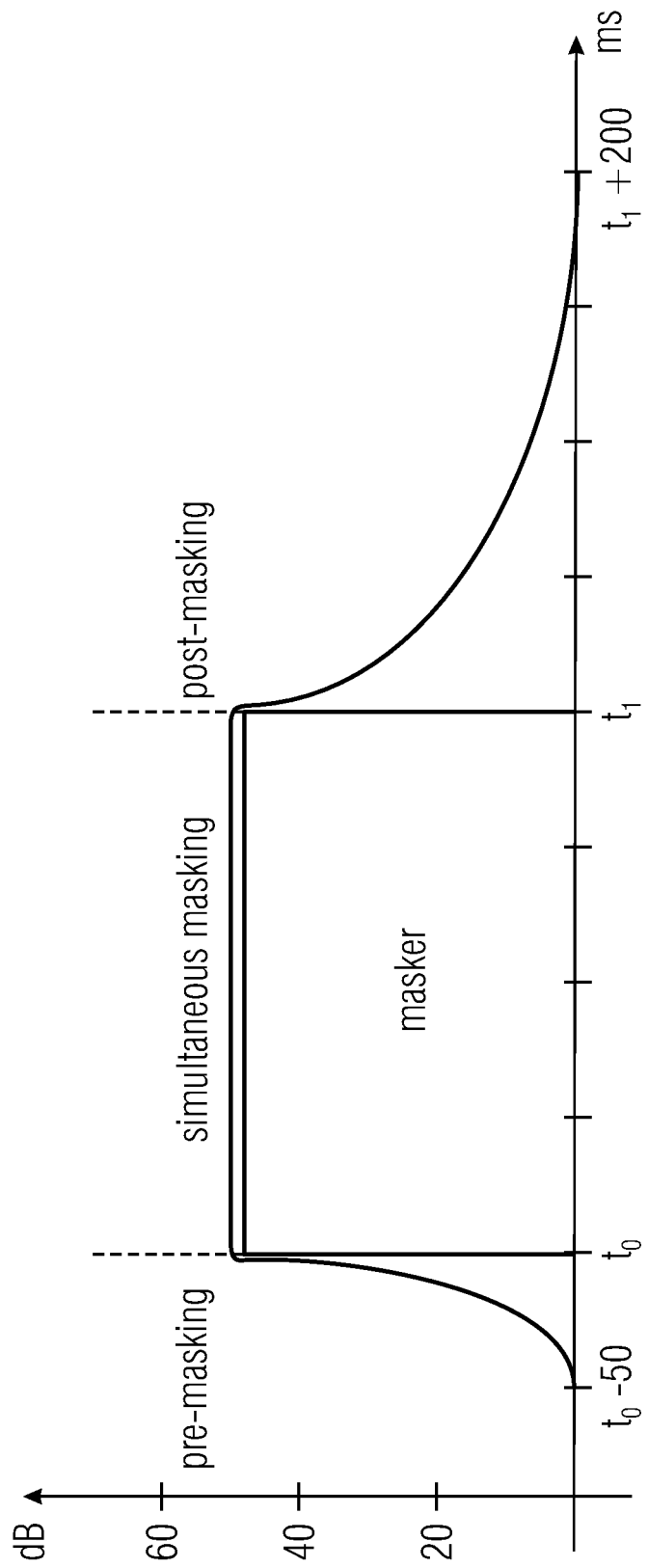
FIG. 21 is a schematic illustration of temporal masking.
Figure 22:
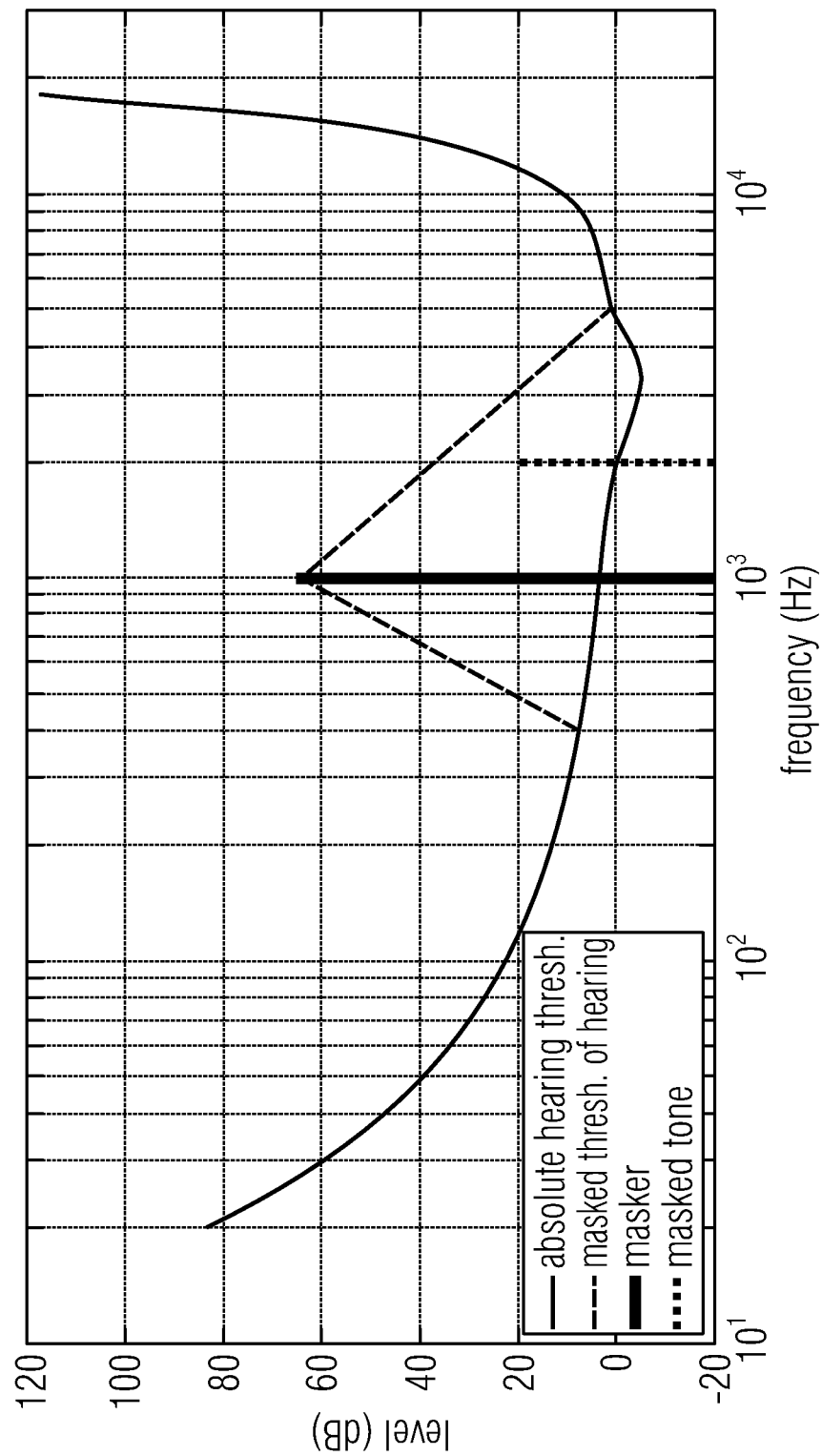
FIG. 22 is a schematic illustration of the frequency-dependent masking in human hearing.
Figure 23:
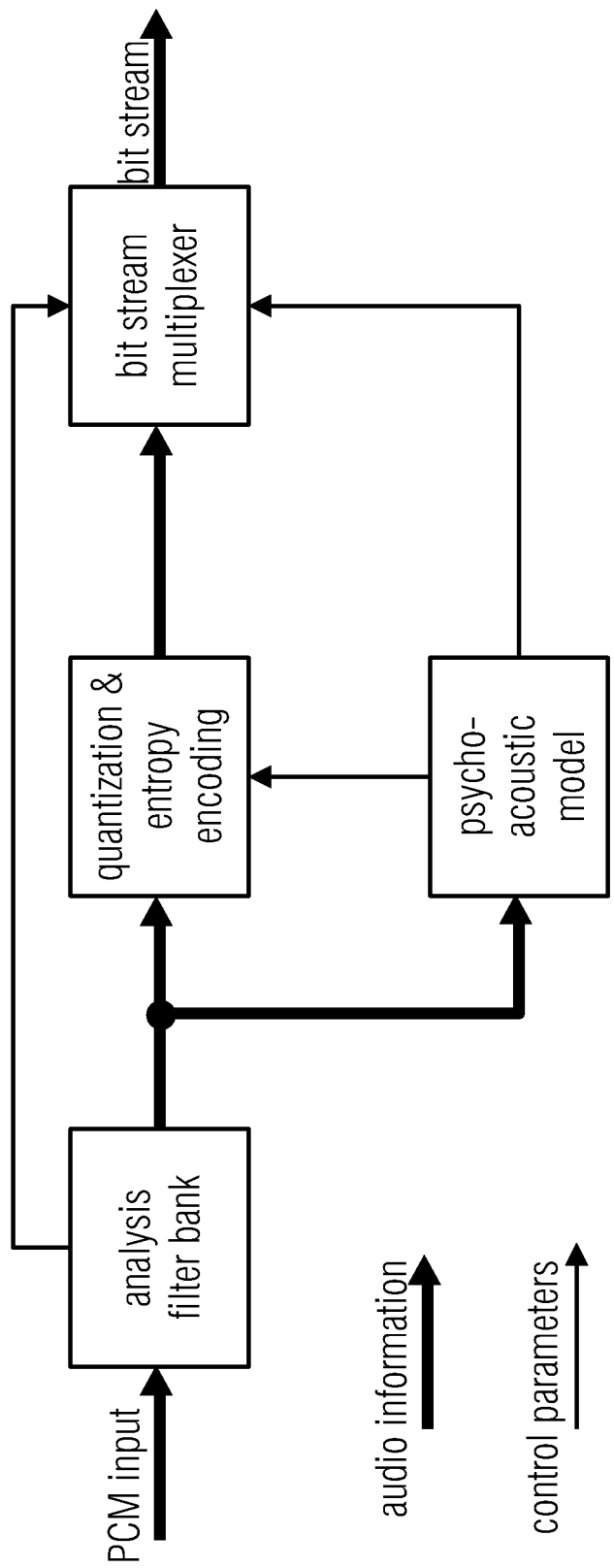
FIG. 23 shows a block circuit diagram of a psychoacoustic audio encoder.
Figure 24:
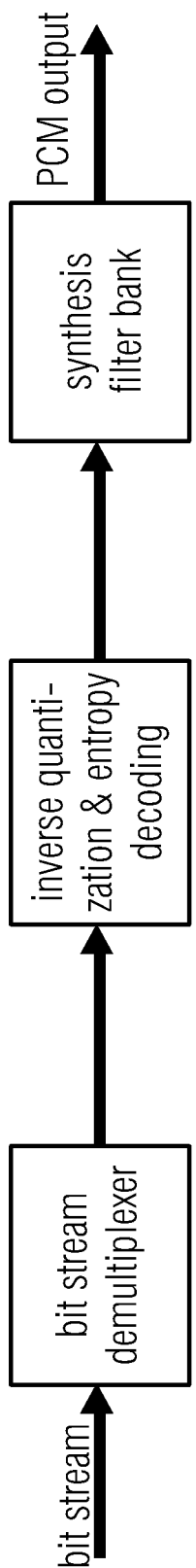
FIG. 24 shows a block circuit diagram of a psychoacoustic audio decoder.
Figure 25:
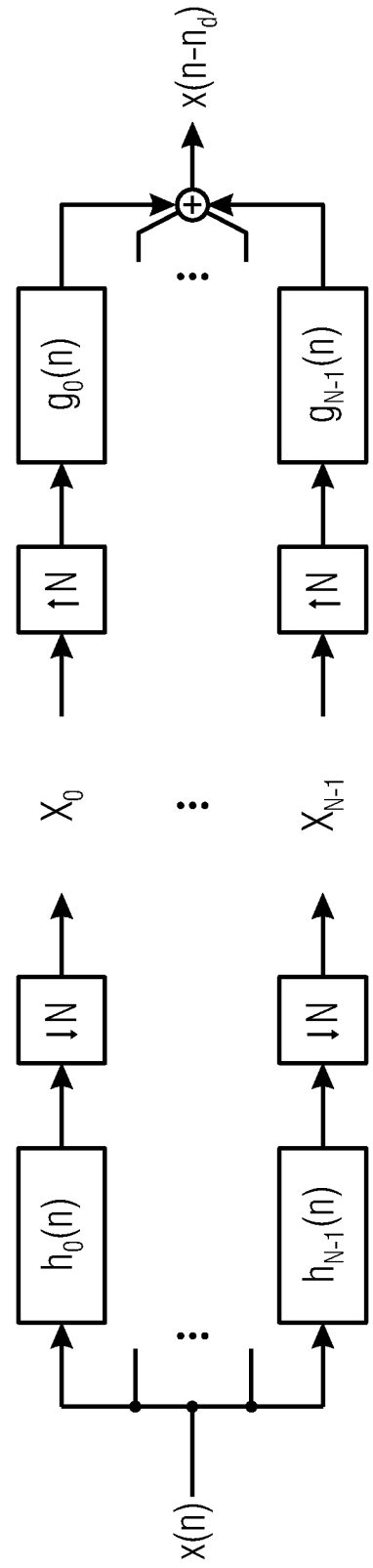
FIG. 25 shows a filter bank with a system delay of $n_d$ samples.
Figure 26:
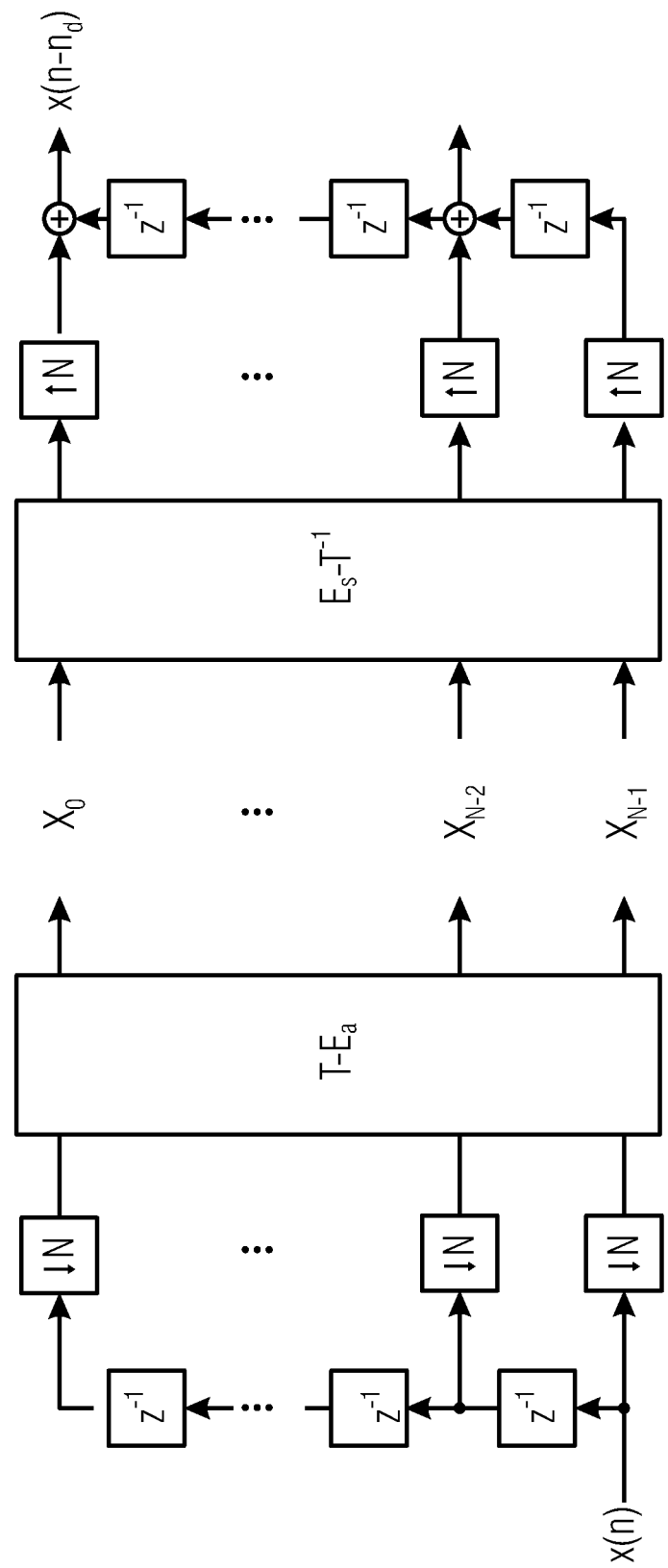
FIG. 26 shows a polyphase filter bank.
Figure 27:
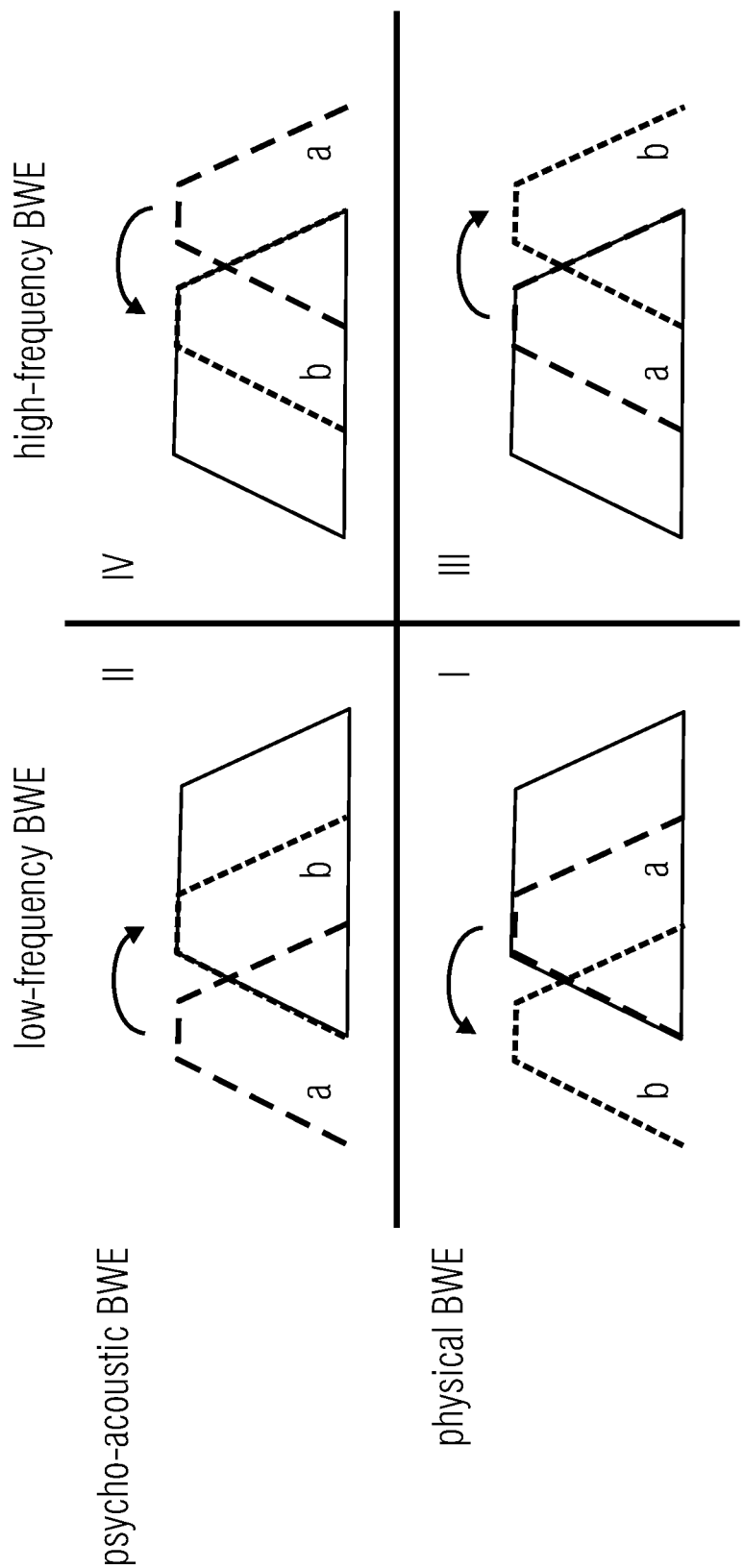
FIG. 27 shows categories of bandwidth extension.
Figure 28:
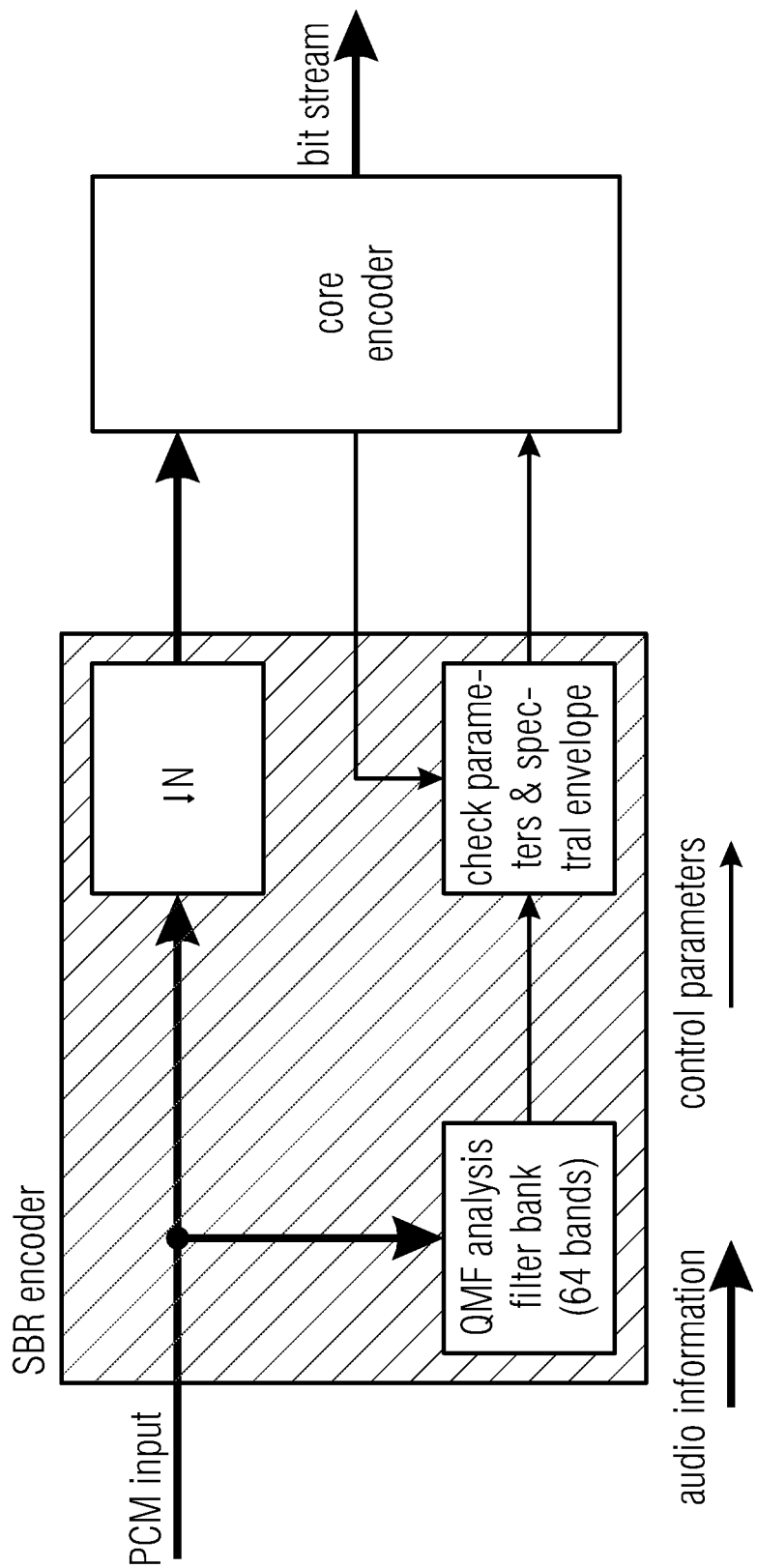
FIG. 28 shows a block circuit diagram of an extended SBR encoder.
Figure 29:
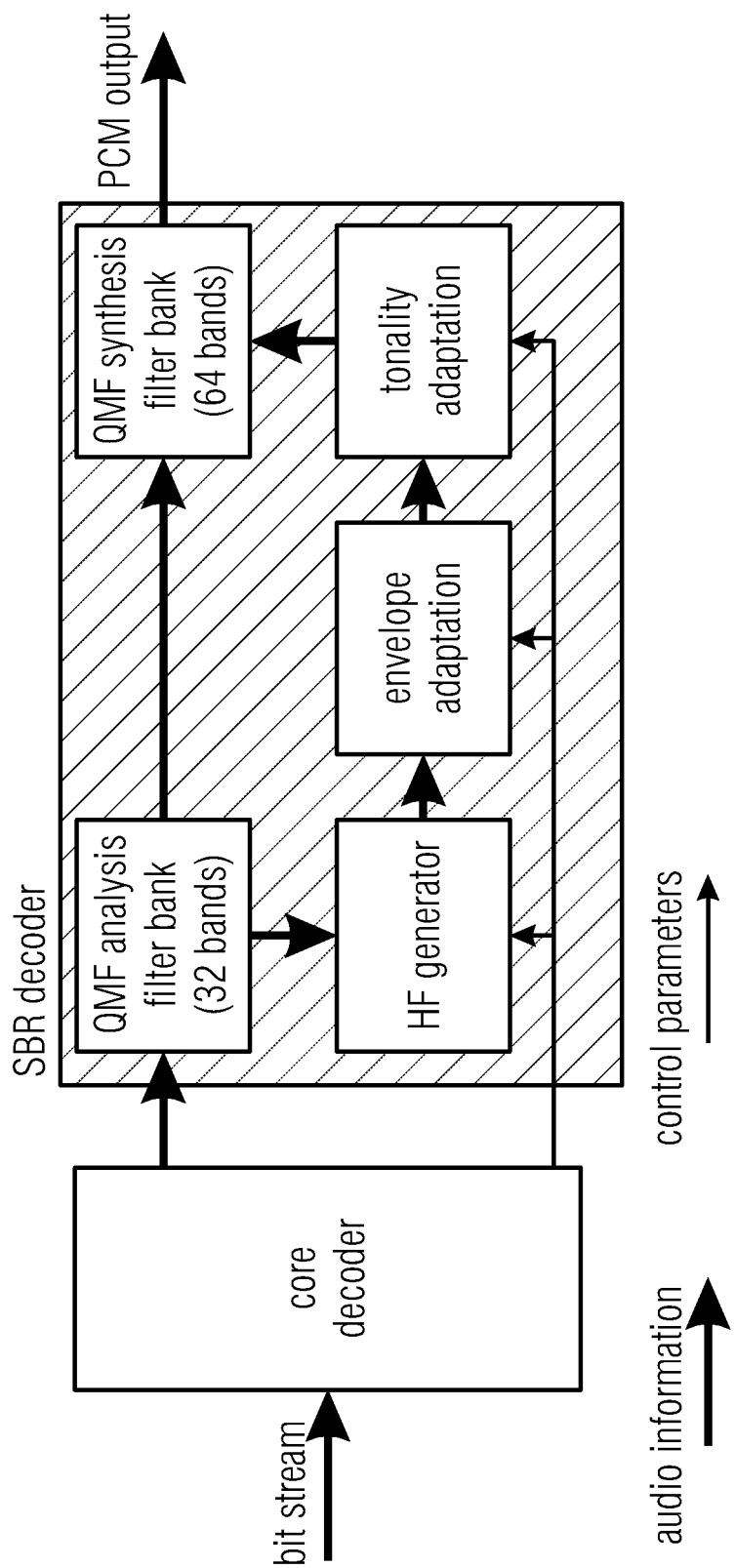
FIG. 29 shows a block circuit diagram of a decoder extended by SBR.
Figure 32:
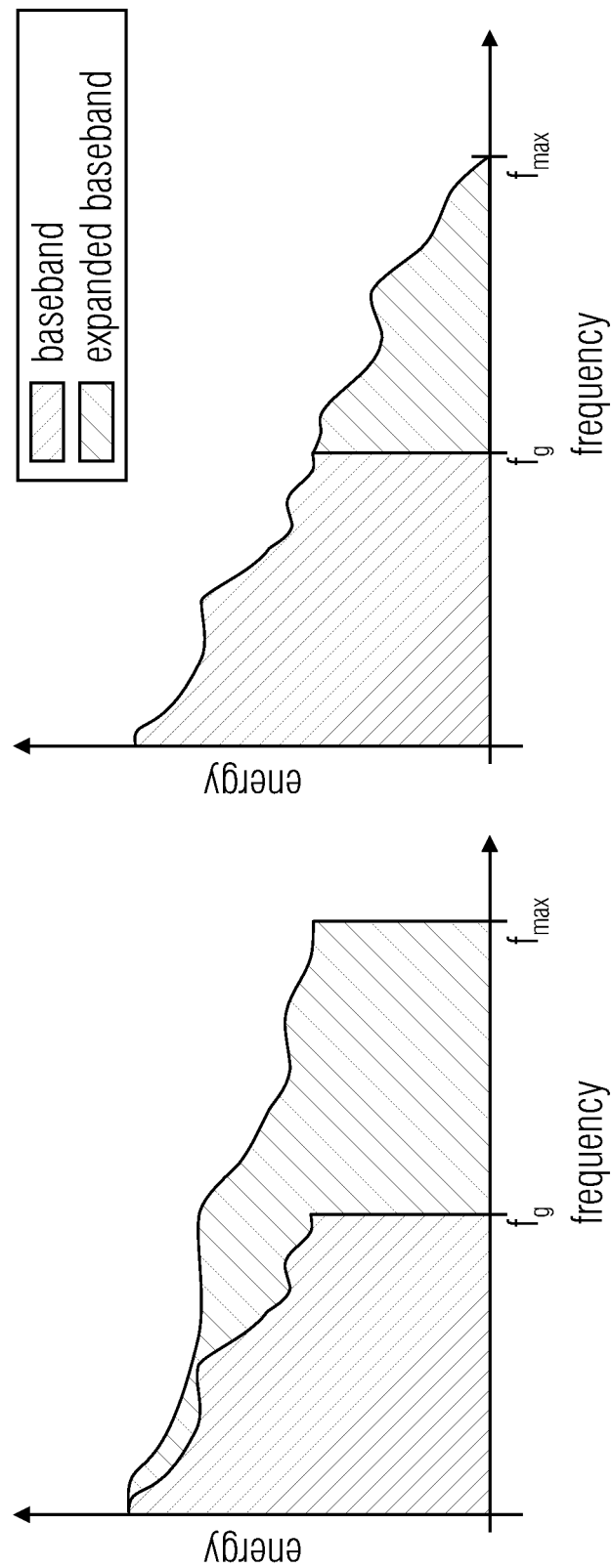
FIG. 32 is a schematic illustration of HBE-HF reconstruction.
Figure 33:
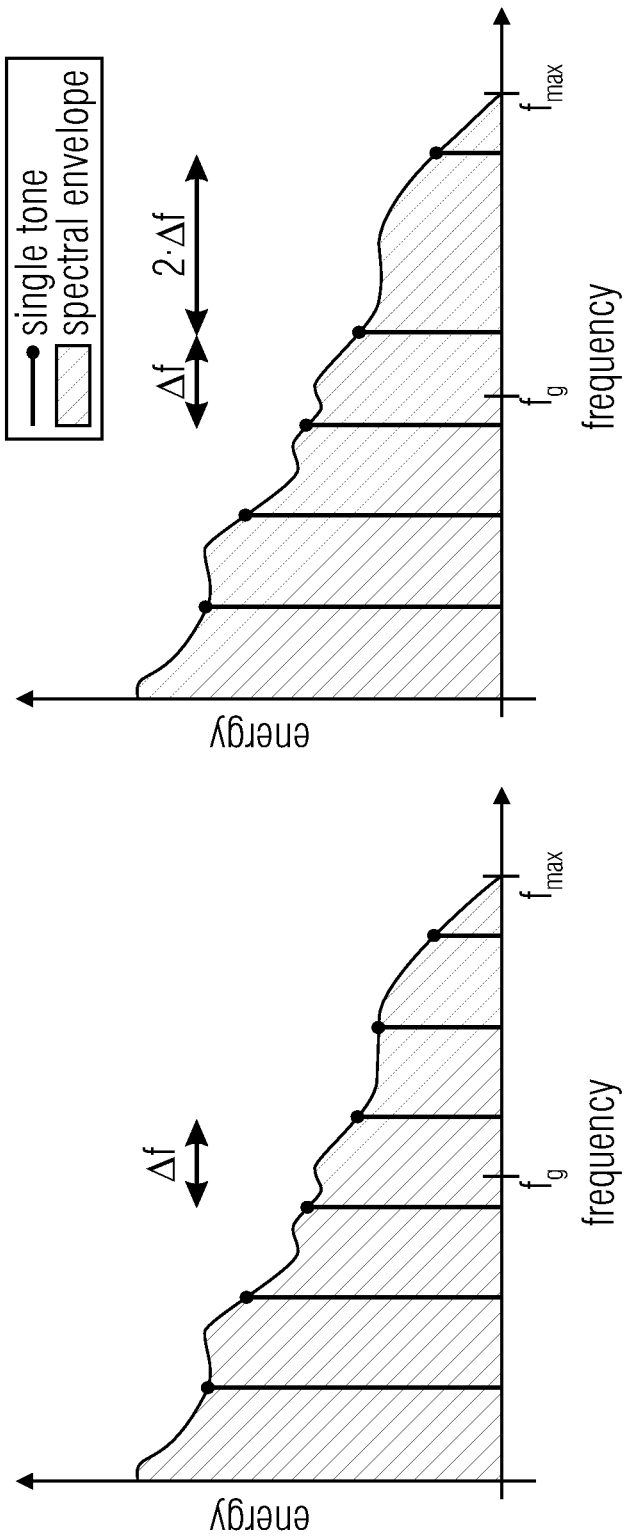
FIG. 33 shows a harmonic structure with HBE.
Figure 34:
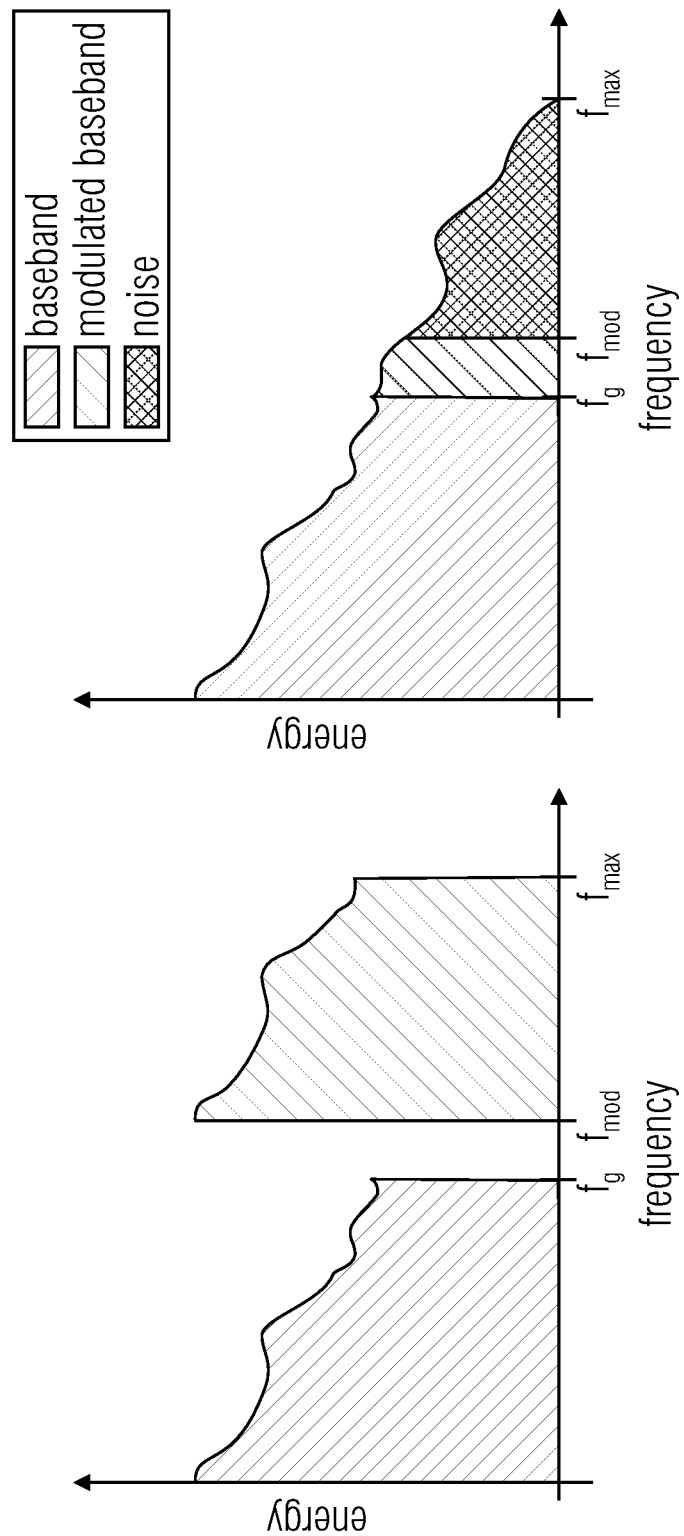
FIG. 34 is a schematic illustration of CM-BWE-HF reconstruction.
Figure 35:
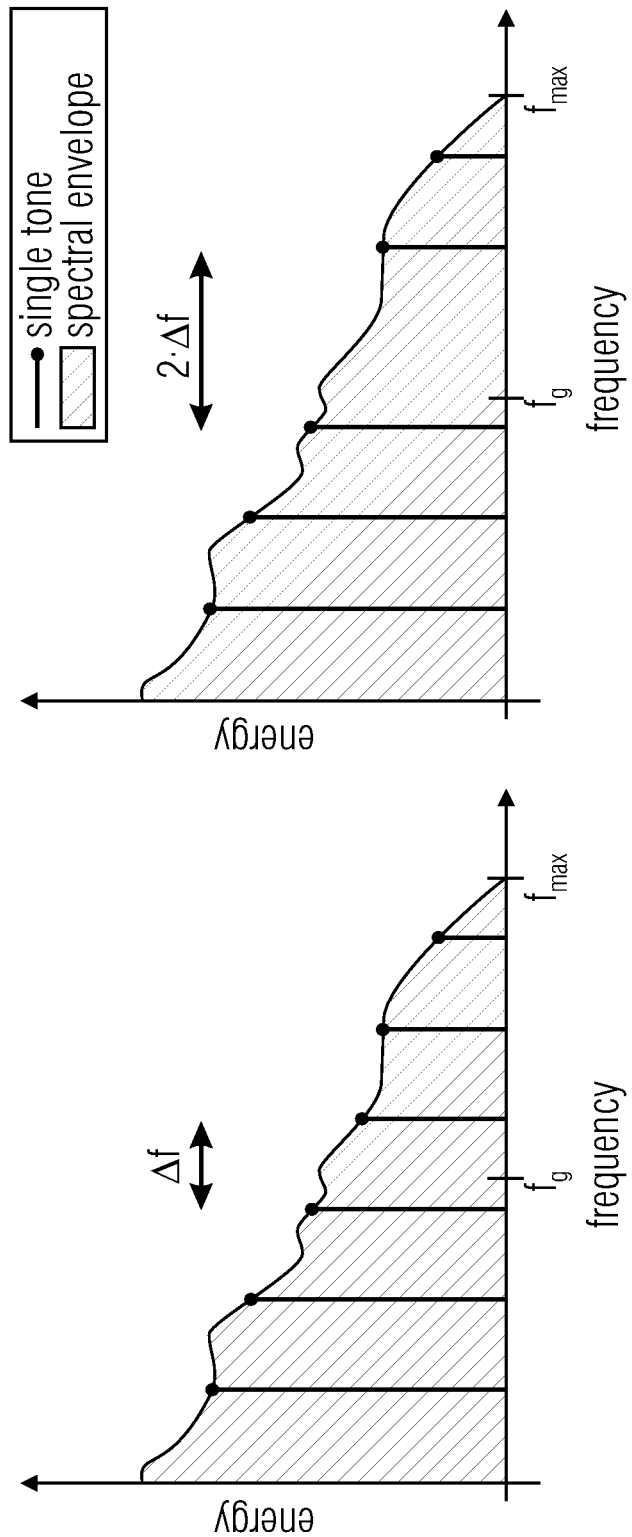
FIG. 35 shows a harmonic structure with CM-BWE.

The input sequence $x_n$ is transferred to the DCT-II spectral values $X_n^\pi$. Since the DCT-III represents the inverse transform to DCT-II, the two transforms can be calculated using this structure. This universal structure for calculating the DCT-III/DST-III and the respective inverse transforms DCT-II and DST-II forms the basis for DCT-IV in accordance with equation 2.14d. FIG. 20 shows the setup of the DCT-IV implemented. Thus, FIG. 20 shows a fast DCT-IV structure (Rao and Yip, 2001).

The structures shown may exemplarily be realized in the programming language C. The corresponding functions are dct_processor( ) for the universal DCT-III/DST-III (DST-II/DST-II), and fdcstiv1d( ) for the fast DCT-IV/DST-IV. No fast variation of this transform is implemented in Matlab since the performance of the algorithm is not important here.

The following section serves for describing Matlab functions and functions of the programming language C.

Matlab Functions:

decoder_hsbe( )

Description:

decoder_hsbe( ) is a decoder for harmonic spectral band extension (HSBE). A low-pass signal in the MDCT domain here is extended spectrally such that the harmonic structure of the signal is maintained. Inverse LPC filtering is performed for reconstructing the envelope. The signal is transferred to the time domain by means of an inverse MDCT.

Prototype:

[y varargout]=decoder_hsbe(X_core, T_idct, G, sideinfo, . . . aaf_dat, b_noisefill, b_useMDST);

Output:

y reconstructed time signal varargout(1) extended MDCT spectrum before envelope adaptation varargout(2) extended MDST spectrum before envelope adaptation varargout(3) complex spectrum before envelope adaptation Input:

X_core baseband of the signal in the MDCT domain

T_idct inverse DCT-IV transform matrix

G inverse folding matrix for the iMDCT in a diamond shape sideinfo side information aaf_dat database with anti-aliasing filter coefficients Optional:

b_noisefill Boolean, indicates whether noise is to be added
  standard: false b_useMDST Boolean, indicates whether pre-calculated MDST is to be used. If true, X_core needs to be complex
  standard: false AAFCreator.m Description:

Anti-aliasing filter (AAF) FIR filter creation tool "AAF-Creator": The AAF FIR filter creation tool calculates anti-aliasing filters necessitated for aliasing cancelation with subband shifting of the HSBE algorithm. The filters are FIR filters in a database. The database is stored as a .mat file and contains a one-dimensional struct. Every item in the database includes an indication of the angle for which the FIR filter is to be used and the filter coefficients as a vector.

Prototype:

Matlab script, no functional name.

Output:

.bmp bitmaps with the AAF impulse response and the result of aliasing cancelation .mat database with the AAF filters in MAT file format .wav AAF impulse response as RIFF audio file Input:

fs sampling frequency of the test signal

NMDCT transform length N sig_typ test signal type
f frequency of the test signal
t duration of the test signal
phi phase angle φ, several angles possible
num_opt number of optimization passes
num_alias highest order of the aliasing components to be suppressed
b_save_wav Boolean, indicates whether .wav files are to be stored
b_save_bmp Boolean, indicates whether .bmp files are to be stored
b_break Boolean, indicates whether a break is to be made with intermediate results
path_bmp path for the .bmp files
path_wav path for the .wav files
AAFoptimizer( )
Description:
AAFoptimizer( ) generates an anti-aliasing filter (AAF) as an FIR filter. The algorithm optimizes the aliasing components detected by a peak recognition numerically by means of successive approximation.
Prototype:
[fir x_antialias]=AAFoptimizer(x, X_cmpx, T_imdct, . . . T_imdst, varargin);
Output:
fir filter impulse response of the anti-aliasing filter in the time domain
x_antialias input signal x aliasing-freed by fir
Input:
X time signal provided with aliasing components
X_cmpx complex representation of x in the MDCT/MDST domain
T_imdct inverse MDCT matrix
T_imdst inverse MDST matrix
Option:
varargin(1) highest order of the aliasing components to be suppressed standard: 4
varargin(2) number of optimization passes; standard: 3
varargin(3) phase angle φ using which x has been modulated; standard: 0
varargin(4) Boolean, indicates whether a plot is to be established; standard: false
varargin(5) Boolean, indicates whether the plots established are to be stored; standard: false
varargin(6) path for the .bmp files; standard: zero
C Functions
HSBE processing( )
Description:
HSBE processing( ) is the main interface for the static library hsbe.lib established for bandwidth extension by means of HSBE. In the current version 1.0, a signal portion in the time domain is transformed using MDCT/MDST and extended spectrally so that the harmonic structure is maintained. The complex bandwidth-extended signal is transferred again to the time domain and output. An envelope reconstruction, as is done in the Matlab function decoder_hsbe( ), does not take place.
Prototype:
HSBE_RESULT HSBEprocessing(HSBE_HANDLE HSBEhandle, . . .
float *pSamplesIn, float *pSamplesOut, . . .
unsigned short nSamplesIn, float frequencyOffset);

| Output: | |
|---|---|
| HSBE_RESULT | error code |
| pSamplesOut | pointer to the vector of the bandwidth-extended time signal |
| Input: | |
| HSBEhandle | HSBE handle struct |
| pSamplesIn | pointer to the vector of the input signal |
| nSamplesIn | transform length N |
| frequencyOffset | lag frequency $f_{lag}$ as a normalized frequency |

HSBEinit( )
Description:
HSBEinit( ) is the function for initializing HSBE. Here, the working memory necessitated is reserved, the window function is calculated and the MDCT/MDST transform matrix Ḥ is calculated. In addition, all the parameters necessitated for HSBE processing( ) are introduced into the handle.
Prototype:
HSBE_RESULT HSBEinit(HSBE_HANDLE *HSBEhandle, . . .
unsigned short nSamplesIn, float f_core, float f_hsbe, . . .
unsigned char windowtype, char flags);

| Output: | |
|---|---|
| HSBE_RESULT | error code |
| HSBEhandle | pointer to the HSBE handle struct |
| Input: | |
| HSBEhandle | pointer to the HSBE handle struct |
| nSamplesIn | transform length N |
| f_core | cutoff frequency $f_g$ of the baseband as a normalized frequency |
| f_hsbe | maximum frequency to be reconstructed as a |
| windowtype | normalized type of the window function to be used |
| flags | frequency check flags |

HSBEfree( )
Description:
HSBE free( ) releases the resources demanded by HSBEinit( ).
Prototype:
HSBE_RESULT HSBEfree (HSBE_HANDLE*HSBEhandle);

| Output: | |
|---|---|
| HSBE_RESULT | error code |
| HSBEhandle | pointer to the HSBE handle struct |
| Input: | |
| HSBEhandle | pointer to the HSBE handle struct |

Although some aspects have been described in connection with a device, it is to be understood that these aspects also represent a description of the corresponding method, so that a block or element of a device is also to be understood to be a corresponding method step or a characteristic of a method step. In analogy, aspects having been described in connection with a method step or as a method step also represent a description of a corresponding block or detail or characteristic of a corresponding device. Some or all of the method steps may be performed by a hardware apparatus (or using a hardware apparatus), such as, for example, a microprocessor, a programmable computer or an electronic circuit. In some embodiments, some or several of the most important method steps may be executed by such an apparatus.

Depending on the specific implementation requirements, embodiments of the invention may be implemented in either hardware or software. The implementation may be performed using a digital storage medium, such as, for example, a floppy disc, a DVD, a Blu-ray disc, CD, ROM, PROM, EPROM, EEPROM or a FLASH memory, a hard disc drive or another magnetic or optical storage onto which electronically readable control signals are stored which are able to cooperate or cooperate with a programmable computer system such that the respective method will be executed. Thus, the digital storage medium may be computer-readable.

Some embodiments in accordance with the invention include a data carrier which comprises electronically readable control signals which are able to cooperate with a programmable computer system such that one of the methods described here will be performed.

Generally, embodiments of the present invention may be implemented as a computer program product comprising program code, the program code being effective so as to perform one of the methods when the computer program product runs on a computer.

The program code may exemplarily be stored on a machine-readable carrier.

Other embodiments include the computer program for performing one of the methods described herein, the computer program being stored on a machine-readable carrier. In other words, an embodiment of the inventive method is a computer program comprising program code for performing one of the methods described herein when the computer program runs on a computer.

Thus, another embodiment of the inventive method is a data carrier (or a digital storage medium or a computer-readable medium) onto which the computer program for performing one of the methods described herein has been recorded.

Thus, another embodiment of the inventive method is a data stream or a sequence of signals representing the computer program for performing one of the methods described herein. The data stream or the sequence of signals may exemplarily be configured to be transferred via a data communications link, like, for example, via the Internet.

Another embodiment includes processing means, like, for example, a computer or a programmable logic device configured or adapted to perform one of the methods described herein.

Another embodiment comprises a computer onto which the computer program for performing one of the methods described herein has been installed.

Another embodiment in accordance with the invention comprises a device or a system configured to transmit a computer program for performing at least one of the methods described herein to a receiver. The transmission may exemplarily take place electronically or optically. The receiver may exemplarily be a computer, a mobile device, a memory device or the like. The device or system may exemplarily comprise a file server for transmitting the computer program to a receiver.

In some embodiments, a programmable logic device (exemplarily a field-programmable gate array (FPGA)) may be used to perform some or all of the functionalities of the methods described herein. In some embodiments, a field-programmable gate array may cooperate with a microprocessor to perform one of the methods described herein. In general, in some embodiments, the methods are performed on the part of any hardware device. This may be universally employable hardware, like a computer processor (CPU), or hardware specific for the method, like, for example, an ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

MEANING OF THE ABBREVIATIONS

AAC advanced audio coding
AAF anti-aliasing filter
ac-3 Dolby digital adaptive transform coder 3
BWE bandwidth extension
CD compact disc
CM-BWE continuously modulated bandwidth extension
DCT discrete cosine transform
DFT discrete Fourier transform
DST discrete sine transform
DVD digital versatile disc
FFT fast Fourier transform
FIR finite impulse response
HBE harmonic bandwidth extension
HE-AAC MPEG-4 high-efficiency advanced audio coding
HF high frequency
HSBE harmonic spectral bandwidth extension
JPEG joint photographic experts group
KiB kibibyte $2^{10}$ bytes=1024 bytes
LOT lapped orthogonal transform
LPC linear predictive coding
LTI linear time-invariant
MDCT modified discrete cosine transform
MDST modified discrete sine transform
MiB mebibyte=$2^{20}$ bytes=1048576 bytes
mp3 MPEG-1 audio layer III
PC personal computer
PCM pulse code modulation
PR perfect reconstruction
QMF quadrature mirror filter
SBR spectral band replication
SNR signal-to-noise ratio
TDA time domain aliasing
TDAC time domain aliasing cancelation
USAC unified speech and audio coding
VoIP voice over Internet protocol

MEANING OF THE SYMBOLS USED e Euler's number
j imaginary unit
Im imaginary part of a function
ld base two logarithm
log base ten logarithm
* complex conjugate
Re real part of a function
o Landau symbol for estimating complexity
T transposed
$\lceil \cdot \rceil$ rounding operator
$\lfloor \cdot \rfloor$ rounding operator for rounding down
$\mathbb{R}$ quantity of real numbers
$\mathbb{N}$ quantity of non-negative integers $\mathbb{N}^+$ quantity of positive integers
$\mathbb{Z}$ quantity of integers
$\epsilon$ normalization factor, $\epsilon \in \mathbb{R}$
$\sigma$ factor of expansion, window index, $\sigma \in \mathbb{N}^+$
$\tau$ modulation index, $\tau \in \mathbb{N}$
$\phi$ phase angle, $\phi \in \mathbb{R}$
$\omega$ normalized frequency, $\omega \in \mathbb{R}$
b block index, $b \in \mathbb{N}$
B bandwidth, $B \in \mathbb{R}$
f frequency, $f \in \mathbb{R}$
k discrete frequency index, $k \in \mathbb{N}$
m discrete phase index, $m \in \mathbb{N}$
M phase number, $M \in \mathbb{N}$
n discrete time index, $n \in \mathbb{N}$
N transform length, $N \in \mathbb{N}$
t time, $t \in \mathbb{R}$
W complex rotating phasor
h[n] impulse response of an FIR filter
H[z] transfer function of h[n] in the z domain
$p_m[n]$ $m^{th}$ phase of a discrete signal
w[n] window function in the discrete time domain
x[n] real signal in the discrete time domain
x(t) real signal in the continuous time domain
X(f) signal in the continuous frequency domain
X[k] signal in the discrete frequency domain
ẖ impulse response h[n] in vector writing
H̱ H[z] in vector writing
x̱ signal x[n] in vector writing
Ḏ delay matrix
F̱ window matrix in diamond shape
F̱$_{a,s}$ folding matrix
H̱ polyphase transform matrix
P̱$_{a,s}$ polyphase matrix
Ṯ transform matrix
x̱ block matrix of the signal vector x
X̱ transformed signal

LITERATURE

[Ahmed u. a. 1974] Ahmed, N.; Natarajan, T.; Rao, K. R.: Discrete Cosine Transform. In: *Computers, IEEE Transactions on* C-23 (1974), Januar, Nr. 1

[Bosi und Goldberg 2003] Bosi, M.; Goldberg, R. E.: *Introduction to Digital Audio Coding and Standards.* 2nd edition. Boston; Dordrecht; London: Kluwer Academic Publishers, 2003

[Britanak u. a. 2007] Britanak, V.; Yip, P. C.; Rao, K. R.: *Discrete Cosine and Sine Transforms: General Properties, Fast Algorithms and Integer Approximations.* Amsterdam; u.a.: Elsevier, 2007

[Burrus und Parks 1985] Burrus, C. S.; Parks, T.: *DFT/FFT and Convolution Algorithms: Theory and Implementation.* New York: John Wiley & Sons Ltd., 1985

[Cheng 2004] Cheng, C.: Method for Estimating Magnitude and Phase in the MDCT Domain. In: *Audio Engineering Society Convention* 116, Mai 2004

[Dolson 1986] Dolson, M: The Phase Vocoder: A Tutorial. In: *Computer Music Journal* 10 (1986), Nr. 4

[Ekstrand 2002] Ekstrand, P.: Bandwidth Extension of Audio Signals by Spectral Band Replication. In: *Proceedings of 1st IEEE Benelux Workshop on MPCA*, Leuven, Belgium. Bd. 1, November 2002

[Fastl und Zwicker 2007] Fastl, H.; Zwicker, E.: *Psychoacoustics: Facts and Models.* 3. Auflage. Berlin; Heidelberg; New York: Springer, 2007

[Jordan-Engeln und Reutter 1978] Jordan-Engeln, G.; Reutter, F.: *Numerische Mathematik für Ingenieure.* 2nd revised edition. Mannheim: Bibliographisches Institut, 1978

[Kiencke und Jäkel 2005] Kiencke, U.; Jäkel, H.: *Signale und Systeme.* 3rd revised edition. München; Wien: Oldenburg Verlag, 2005

[Larsen und Aarts 2004] Larsen, E.; Aarts, R. M.: *Audio Bandwidth Extension: Application of Psychoacoustics, Signal Processing and Loudspeaker Design.* Chichester: John Wiley & Sons Ltd., 2004

[Lochmann 1990] Lochmann, D.: *Digitale Nachrichtentechnik: Digitale Modulation und Signalverarbeitung.* Bd. 1. Berlin: VBE Verlag Technik, 1990

[Malvar 1992] Malvar, H. S.: *Signal Processing with Lapped Transforms.* Boston; London: Artech House, 1992

[Malvar und Staelin 1989] Malvar, H. S.; Staelin, D. H.: The LOT: transform coding without blocking effects. In: *Acoustics, Speech and Signal Processing, IEEE Transactions on* 37 (1989), April, Nr. 4

[Nagel und Disch 2009] Nagel, F.; Disch, S.: A harmonic bandwidth extension method for audio codecs. In: *Acoustics, Speech and Signal Processing, 2009. ICASSP 2009. IEEE International Conference on*, April 2009

[Nagel u. a. 2010] Nagel, F.; Disch, S.; Wilde, S.: A continuous modulated single sideband bandwidth extension. In: *Acoustics Speech and Signal Processing (ICASSP), 2010 IEEE International Conference on*, März 2010

[Princen und Bradley 1986] Princen, J.; Bradley, A.: Analysis/Synthesis filter bank design based on time domain aliasing cancellation. In: *Acoustics, Speech and Signal Processing, IEEE Transactions on* 34 (1986), October, Nr. 5

[Princen u. a. 1987] Princen, J.; Johnson, A.; Bradley, A.: Subband/Transform coding using filter bank designs based on time domain aliasing cancellation. In: *Acoustics, Speech, and Signal Processing, IEEE International Conference on ICASSP '87.* Bd. 12, April 1987

[Rao und Yip 2001] Rao, K. R.; Yip, P. C.: *The Transform and Data Compression Handbook.* London; New York; Washington, D.C.: CRC Press, 2001

[Schuller und Smith 1996] Schuller, G. D. T.; Smith, M. J. T.: New framework for modulated perfect reconstruction filter banks. In: *Signal Processing, IEEE Transactions on* 44 (1996), August, Nr. 8

[Weinzierl 2008] Weinzierl, S.: *Handbuch der Audiotechnik.* Berlin; Heidelberg: Springer, 2008

[Wilde 2009] Wilde, Stephan: *Entwicklung von Zeitbereichsverfahren zur Bandbreitenerweiterung von Audiosignalen*, Friedrich-Alexander-Universität Erlangen-Nümberg, dissertation, 2009

[Yost 1994] Yost, W. A.: *Fundamentals of Hearing: An Introduction.* $3^{rd}$ edition. San Diego; New York; Boston; London; Sydney; Tokyo: Academic Press, 1994

[Zölzer 2005] Zölzer, U.: *Digitale Audiosignalverarbeitung.* 3rd revised and extended edition. Stuttgart; Leipzig; Wiesbaden: Teubner, 2005

The invention claimed is:

1. A device for producing a frequency-shifted audio signal based on an audio input signal, wherein the audio input signal, for a plurality of first subbands, may be represented by one or several first subband values, the device comprising:
an interface for receiving the audio input signal, and
a frequency-shifting unit for producing the frequency-shifted audio signal, for a plurality of second subbands, comprising one or several second subband values each,
wherein each of the first and second subband values comprises information on a respective phase angle, and
wherein the frequency-shifting unit is configured to produce one of the second subband values based on one of the first subband values such that the second phase angle of this second subband value may differ from the first phase angle of this first subband value by a phase angle difference, the phase angle difference being dependent on frequency information indicating by which frequency difference the audio input signal is to be shifted in order to acquire the frequency-shifted audio signal, and the phase angle difference being dependent on a frequency bandwidth of one of the first subbands.

2. The device in accordance with claim 1, wherein the frequency-shifting unit is configured to determine one of the first subbands based on the frequency information for each of the second subbands, the frequency-shifting unit being further configured to produce the one or several of the second subband values of the respective second subband based on one or several of the first subband values of the respective first subband determined, the frequency-shifting unit being configured to produce one of the second subband values for each of the respective second subbands based on one of the first subbands for each of the respective first subbands determined such that the information on the phase angle of the respective second subband value is dependent on the information on the phase angle of the respective first subband value and on a ratio of the frequency difference by which the audio input signal is to be shifted and the frequency bandwidth of the respective first subband.

3. The device in accordance with claim 1,
wherein each of the first subband values and each of the second subband values may be represented as complex numbers,
wherein the frequency-shifting unit is configured to determine a result value of a complex exponential function, and
wherein the frequency-shifting unit is configured to produce at least one of the second subband values based on one of the first subband values by multiplying a first complex number representing the one of the first subband values by the result value in order to acquire a second complex number representing the one of the second subband values.

4. The device in accordance with claim 3,
wherein the frequency-shifting unit is configured to determine the result value of the complex exponential function, the complex exponential function being as follows:

$$e^{-j \cdot b \cdot \varphi \cdot \frac{\pi}{180°}},$$

j being an imaginary unit, b being an integer, and φ being an angle in degrees, which is dependent on the frequency difference by which the first subband values of the subbands are to be shifted.

5. The device in accordance with claim 1,
wherein the frequency-shifting unit is configured to produce the one of the second subband values based on the one of the first subband values, and
wherein the first subband values are first MDCT coefficients of the audio input signal which are the coefficients of a modified discrete cosine transform of the audio input signal, or wherein the first subband values are first QMF coefficients of the audio input signal which are coefficients of a QMF transform of the audio input signal.

6. The device in accordance with claim 1,
wherein the device additionally comprises an MDCT/MDST transform unit,
wherein the MDCT/MDST transform unit is configured to acquire one or several first MDCT coefficients of the audio input signal which are coefficients of a modified discrete cosine transform of the audio input signal,
wherein the MDCT/MDST transform unit is configured to determine, based on one or several of the first MDCT coefficients of the audio input signal, one or several first MDST coefficients of the audio input signal which are coefficients of a modified discrete sine transform, and
wherein the frequency-shifting unit is configured to produce each of the second subband values based on one of the first subband values each, wherein each of the first subband values is based on one of the first MDCT coefficients and one of the first MDST coefficients having been determined based on this first MDCT coefficient.

7. The device in accordance with claim 6,
wherein the frequency-shifting unit is configured to produce each of the second subband values based on one of the first subband values each, wherein each of the first MDCT coefficients and each of the first MDST coefficients is of a real value, and wherein each of the first subband values represents a sum of one of the first MDCT coefficients and one of the first MDST coefficients multiplied by the imaginary unit j having been determined based on this first MDCT coefficient.

8. The device in accordance with claim 6,
wherein the MDCT/MDST transform unit is configured to determine the one or several first MDST coefficients of the audio input signal based on one or several of the first MDCT coefficients of the audio input signal,
wherein the first MDCT coefficients of the audio input signal may be represented as matrix coefficients of an MDCT coefficient matrix $\underline{X}$ which comprises one or several columns,
wherein the audio input signal is subdivided into blocks,
wherein each of the columns of the MDCT coefficient matrix $\underline{X}$ represents one of the blocks of the audio input signal,
wherein each of the columns of the MDCT coefficient matrix $\underline{X}$ forms an MDCT spectrum of the respective block of the audio input signal, and
wherein the MDCT/MDST transform unit determines the matrix coefficients of a transform matrix $\underline{H}$ such that, by a matrix multiplication of the transform matrix $\underline{H}$ by the MDCT coefficient matrix $\underline{X}$, an MDST coefficient matrix $\underline{X}_{MDST}$ is acquired the matrix coefficients of which represent the first MDST coefficients.

9. The device in accordance with claim 6,
wherein the MDCT/MDST transform unit is configured to determine the one or several first MDST coefficients of the audio input signal based on one or several of the first MDCT coefficients of the audio input signal,
wherein the first MDCT coefficients of the audio input signal may be represented as matrix coefficients of an MDCT coefficient matrix $\underline{X}$ which comprises one or several columns,
wherein the audio input signal is subdivided into blocks, wherein each of the columns of the MDCT coefficient matrix $\underline{X}$ represents one of the blocks of the audio input signal,
and wherein the MDCT/MDST transform unit is configured to apply the following formula:

$$\underline{X}_{MDST}(b-1) = \underline{H}_0 \cdot \underline{X}(b) + \underline{H}_1 \cdot \underline{X}(b-1) + \underline{H}_2 \cdot \underline{X}(b-2)$$

in order to determine the first MDST coefficients,
wherein $\underline{X}(b)$ is the $b^{th}$ column of the matrix $\underline{X}$,
wherein $\underline{X}(b-1)$ is the $b-1^{th}$ column of the matrix $\underline{X}$,
wherein $\underline{X}(b-2)$ is the $b-2^{th}$ column of the matrix $\underline{X}$,
wherein $\underline{H}_0$ is a first sub-matrix,
wherein $\underline{H}_1$ is a second sub-matrix,
wherein $\underline{H}_2$ is a third sub-matrix, and
wherein $\underline{X}_{MDST}(b-1)$ represents an MDST spectrum of block b−1 which comprises the first MDST coefficients.

10. The device in accordance with claim 9,
wherein the MDCT/MDST transform unit is configured to apply the following formula:

$$\underline{X}_{MDST}(b-1) = \underline{H}_0 \cdot \underline{X}(b) + \underline{H}_1 \cdot \underline{X}(b-1) + \underline{H}_2 \cdot \underline{X}(b-2)$$

in order to determine the first MDST coefficients,
wherein two or several matrix coefficients of the first sub-matrix $\underline{H}_0$ comprise a value of 0, wherein two or several matrix coefficients of the second sub-matrix $\underline{H}_1$ comprise a value of 0, and wherein two or more matrix coefficients of the third sub-matrix $\underline{H}_2$ comprise a value of 0.

11. The device in accordance with claim 9,
wherein the MDCT/MDST transform unit is configured to apply the following formula:

$$\underline{X}_{MDST}(b-1) = \underline{H}_0 \cdot \underline{X}(b) + \underline{H}_1 \cdot \underline{X}(b-1) + \underline{H}_2 \cdot \underline{X}(b-2)$$

in order to determine the first MDST coefficients,
wherein the second sub-matrix $\underline{H}_1$ is as follows:

$$\underline{H}_1 = \begin{bmatrix} 0,5 & -0,5 & 0 & & \cdots & & 0 \\ 0,5 & 0 & -0,5 & 0 & & & \\ 0 & 0,5 & 0 & -0,5 & 0 & & \vdots \\ & \ddots & \ddots & \ddots & \ddots & \ddots & \\ \vdots & & 0 & 0,5 & 0 & -0,5 & 0 \\ & & & 0 & 0,5 & 0 & -0,5 \\ 0 & & \cdots & & 0 & 0,5 & 0,5 \end{bmatrix},$$

wherein " . . . " means that the same values of previous matrix coefficients of the second sub-matrix $\underline{H}_1$ are continued in subsequent matrix coefficients of the second sub-matrix $\underline{H}_1$.

12. The device in accordance with claim 1, wherein the device additionally comprises a filter unit, the filter unit being configured to filter the second subband values by applying a filter which comprises a plurality of filter coefficients such that spurious components of the second subband values having formed when producing the second subband values based on the first subband values are reduced.

13. The device in accordance with claim 12,
wherein the frequency-shifting unit is configured to produce the one of the second subband values based on the one of the first subband values such that the second phase angle of this second subband value differs from the first phase angle of this first subband value by the phase angle difference,
wherein the filter unit is configured to filter the second subband values by applying the filter, and wherein one or several of the filter coefficients are dependent on the phase angle difference.

14. The device in accordance with claim 13,
wherein the device additionally comprises a storage or a database,
wherein one or several of the filter coefficients are dependent on the phase angle difference,
wherein the filter unit is configured to read out the filter coefficients from the storage or the database in dependence on the phase angle difference, and
wherein the filter unit is configured to filter the second subband values by applying the filter which comprises the filter coefficients read out from the storage or the database.

15. The device in accordance with claim 12,
wherein the filter unit is configured to filter each of the one or several second subband values of each of the second subbands in order to acquire one or several filtered subband values for each of the second subbands,
wherein the filter unit is configured to determine each of the filtered subband values by calculating a sum of a first addend or one or several further addends,
wherein the first addend is one of the second subband values of one of the second subbands,
wherein the one or several further addends is/are one or several weighted subband values, and
wherein the filter unit is configured to determine the one or several weighted subband values each by multiplication of one of the filter coefficients by one further subband value each of another of the further subbands.

16. The device in accordance with claim 12,
wherein the filter unit is configured to filter the second subband values by applying the filter which comprises the plurality of filter coefficients such that spurious components of the second subband values are reduced,
wherein the filter coefficients of the filter are of an ordered sequence, and wherein, in this sequence, every filter coefficient unequal to zero is followed by a filter coefficient equaling zero.

17. The device in accordance with claim 1, wherein the interface is configured to receive the frequency information indicating by which frequency difference the first subband values of the subbands of the audio input signal are to be shifted.

18. The device in accordance with claim 1,
wherein the device additionally comprises a synthesis transform unit, and
wherein the synthesis transform unit is configured to acquire the frequency-shifted audio signal by transforming the second subband values to a plurality of time domain samples.

19. The device in accordance with claim 1,
wherein the device is configured to produce a frequency-broadened audio signal, wherein the device is configured to produce the frequency-broadened audio signal by the device producing the second subband values of the frequency-shifted audio signal, the frequency-broadened audio signal comprising the first subband values of the audio input signal and the second subband values of the frequency-shifted audio signal.

20. The device in accordance with claim 19,
wherein the device additionally comprises a synthesis transform unit, and
wherein the synthesis transform unit is configured to acquire the frequency-broadened audio signal by transforming the first subband values and the second subband values to a plurality of time domain samples.

21. The device in accordance with claim 19, wherein the device additionally comprises an envelope adaptation unit configured to filter the frequency-broadened audio signal such that a spectral envelope is impressed onto the frequency-broadened signal.

22. The device in accordance with claim 21, wherein the envelope adaptation unit is configured to filter the frequency-broadened audio signal by means of inverse filtering using LPC coefficients in order to impress the spectrum envelope onto the frequency-broadened signal.

23. A method of producing a frequency shifted audio signal based on an audio input signal, wherein the audio input signal, for a plurality of first subbands, may be represented by one or several first subband values, the method comprising:
receiving the audio input signal, and
producing the frequency-shifted audio signal, for a plurality of second subbands, comprising one or several second subband values each,
wherein each of the first and second subband values comprises information on a respective phase angle, and
wherein one of the second subband values is produced based on one of the first subband values such that the second phase angle of this second subband value may differ from the first phase angle of this first subband value by a phase angle difference, the phase angle difference being dependent on frequency information indicating by which frequency difference the audio input signal is to be shifted in order to acquire the frequency-shifted audio signal, and the phase angle difference being dependent on a frequency bandwidth of one of the first subbands.

24. A non-transitory digital storage medium having stored thereon a computer program for performing the method in accordance with claim 23 when the computer program is executed on a computer or signal processor.

* * * * *